US012609078B2

(12) United States Patent
Shang et al.

(10) Patent No.: US 12,609,078 B2
(45) Date of Patent: *Apr. 21, 2026

(54) DISPLAY SUBSTRATE, PREPARATION METHOD THEREFOR, AND DISPLAY APPARATUS

(71) Applicants:Chengdu BOE Optoelectronics Technology Co., Ltd., Chengdu (CN); BOE Technology Group Co., Ltd., Beijing (CN)

(72) Inventors: Tinghua Shang, Beijing (CN); Yi Zhang, Beijing (CN); Tingliang Liu, Beijing (CN); Yang Zhou, Beijing (CN); Huijuan Yang, Beijing (CN)

(73) Assignees: Chengdu BOE Optoelectronics Technology Co., Ltd., Chengdu (CN); BOE Technology Group Co., Ltd., Beijing (CN)

( * ) Notice: Subject to any disclaimer, the term of this patent is extended or adjusted under 35 U.S.C. 154(b) by 0 days.

This patent is subject to a terminal disclaimer.

(21) Appl. No.: 18/829,319

(22) Filed: Sep. 10, 2024

(65) Prior Publication Data

US 2025/0006127 A1 Jan. 2, 2025

Related U.S. Application Data

(63) Continuation of application No. 17/780,533, filed as application No. PCT/CN2021/102423 on Jun. 25, 2021, now Pat. No. 12,175,929.

(51) Int. Cl.
G09G 3/3233 (2016.01)
G09G 3/3275 (2016.01)
(Continued)

(52) U.S. Cl.
CPC ......... *G09G 3/3233* (2013.01); *G09G 3/3275* (2013.01); *H10K 59/1213* (2023.02);
(Continued)

(58) Field of Classification Search
CPC ............... G09G 3/3233; G09G 3/3275; G09G 2320/0233; G09G 2300/0426;
(Continued)

(56) References Cited

U.S. PATENT DOCUMENTS

2016/0240603 A1 8/2016 Park et al.
2017/0365647 A1 12/2017 Choi et al.
(Continued)

FOREIGN PATENT DOCUMENTS

CN 103633146 A 3/2014
CN 105895658 A 8/2016
(Continued)

OTHER PUBLICATIONS

Office Action dated Mar. 18, 2025 for JP2023-524807 and English Translation.
(Continued)

*Primary Examiner* — Kenneth Bukowski
(74) *Attorney, Agent, or Firm* — Ling Wu; Stephen Yang; Ling and Yang Intellectual Property

(57) ABSTRACT

Proposed are a display substrate and a preparation method therefor, and a display apparatus. The display substrate includes a drive circuit layer disposed on a substrate and a light emitting structure layer disposed at a side of the drive circuit layer away from the substrate, the drive circuit layer includes a plurality of circuit units, the light emitting structure layer includes a plurality of light emitting devices; at least one circuit unit includes a first power supply line, an initial signal line including a first initial signal line extending in a first direction and a second initial signal line extending
(Continued)

in a second direction, and a pixel drive circuit; the first direction intersects the second direction, and an orthographic projection of the second initial signal line on the substrate overlaps at least partially with an orthographic projection of the first power supply line on the substrate.

19 Claims, 35 Drawing Sheets

(51) Int. Cl.
*H10K 59/121* (2023.01)
*H10K 59/122* (2023.01)
*H10K 59/131* (2023.01)

(52) U.S. Cl.
CPC ....... *H10K 59/122* (2023.02); *H10K 59/1315* (2023.02); *G09G 2320/0233* (2013.01)

(58) Field of Classification Search
CPC ... G09G 2300/0452; G09G 2300/0819; G09G 2300/0842; G09G 2300/0861; H10K 59/122; H10K 59/1213; H10K 59/1315; H10K 59/131
See application file for complete search history.

(56) References Cited

U.S. PATENT DOCUMENTS

| | | | | |
|---|---|---|---|---|
| 2020/0321427 | A1 | 10/2020 | Park et al. | |
| 2020/0380918 | A1* | 12/2020 | Cho | ..................... G09G 3/3258 |
| 2021/0167161 | A1 | 6/2021 | Yang et al. | |
| 2022/0181421 | A1* | 6/2022 | Choi | ..................... H10K 59/126 |
| 2022/0190078 | A1* | 6/2022 | You | ..................... H10D 86/421 |
| 2022/0328592 | A1* | 10/2022 | You | ..................... H10K 59/1213 |
| 2023/0038017 | A1 | 2/2023 | Wei et al. | |
| 2023/0217751 | A1* | 7/2023 | Kim | ................. H10K 59/80515 |
| | | | | 257/91 |
| 2023/0231095 | A1* | 7/2023 | Choi | ..................... H10H 20/857 |
| | | | | 257/79 |
| 2023/0240103 | A1* | 7/2023 | Yoon | ..................... H10K 59/353 |
| | | | | 257/107 |
| 2023/0247870 | A1* | 8/2023 | Choi | ................... G06F 3/04164 |
| | | | | 257/40 |

FOREIGN PATENT DOCUMENTS

| | | | |
|---|---|---|---|
| CN | 108933155 | A | 12/2018 |
| CN | 110970469 | A | 4/2020 |
| CN | 111508978 | A | 8/2020 |
| CN | 112310172 | A | 2/2021 |
| CN | 112885850 | A | 6/2021 |
| JP | 2017120375 | A | 7/2017 |
| JP | 2019152857 | A | 9/2019 |
| JP | 2020071456 | A | 5/2020 |
| WO | 2021102972 | A1 | 6/2021 |

OTHER PUBLICATIONS

Office Action dated May 20, 2025 for CN202180001632.8 and English Translation.

* cited by examiner

DISPLAY SUBSTRATE, PREPARATION METHOD THEREFOR, AND DISPLAY APPARATUS

CROSS-REFERENCE TO RELATED APPLICATION(S)

The present application is a continuation application of U.S. application Ser. No. 17/780,533 having a filing date of May 27, 2022, which is a U.S. National Phase Entry of International Application No. PCT/CN2021/102423 having an international filing date of Jun. 25, 2021, the above-identified applications are incorporated by reference herein in their entirety.

TECHNICAL FIELD

The present disclosure relates to, but is not limited to, the field of display technologies, and in particular to a display substrate, a preparation method therefor, and a display apparatus.

BACKGROUND

An Organic Light Emitting Diode (OLED) and a Quantum-dot Light Emitting Diode (QLED) are active light emitting display devices and have advantages of self-illumination, wide angle of view, high contrast, low power consumption, extremely high reaction speed, lightness and thinness, bendability, low cost, etc. With constant development of display technology, a flexible display that uses the OLED or the QLED as a light emitting device and performs signal control by a Thin Film Transistor (TFT) has become a mainstream product in the field of display at present.

SUMMARY

The following is a summary of subject matters described in detail herein. This summary is not intended to limit the scope of protection of claims.

In an aspect, the present disclosure provides a display substrate, including a drive circuit layer disposed on a substrate and a light emitting structure layer disposed at a side of the drive circuit layer away from the substrate, wherein the drive circuit layer includes a plurality of circuit units, the light emitting structure layer includes a plurality of light emitting devices; at least one circuit unit includes a first power supply line, an initial signal line including a first initial signal line extending in a first direction and a second initial signal line extending in a second direction, and a pixel drive circuit; the first direction intersects the second direction, and an orthographic projection of the second initial signal line on the substrate overlaps at least partially with an orthographic projection of the first power supply line on the substrate.

In an exemplary implementation, the second initial signal line in at least one circuit unit includes an extension portion and a connection portion connected with each other, the extension portion extends in the second direction, the connection portion extends in the first direction, and the connection portion is connected with the first initial signal line through a via.

In an exemplary implementation, an orthographic projection of the extension portion on the substrate overlaps at least partially with the orthographic projection of the first power supply line on the substrate, and an orthographic projection of the connection portion on the substrate overlaps at least partially with an orthographic projection of the first initial signal line on the substrate.

In an exemplary implementation, at least one circuit unit includes a second connection electrode connected with the connection portion through a via, and the second connection electrode is connected with the first initial signal line through a via.

In an exemplary implementation, the second connection electrode is connected with a first region of an active layer of a first transistor and a first region of an active layer of a seventh transistor in the pixel drive circuit through a via.

In an exemplary implementation, the drive circuit layer includes a plurality of unit rows including a plurality of circuit units arranged along the first direction and a plurality of unit columns including a plurality of circuit units arranged along the second direction; in at least one unit column, second initial signal lines in adjacent circuit units are connected with each other, or the second initial signal lines in the adjacent circuit units are disposed at intervals.

In an exemplary implementation, the plurality of circuit units include a first circuit unit connected with a red light emitting device emitting red light, a second circuit unit connected with a blue light emitting device emitting blue light, a third circuit unit connected with a first green light emitting device emitting green light, and a fourth circuit unit connected with a second green light emitting device emitting green light; the plurality of unit columns include a first unit column and a second unit column, the first circuit unit and the second circuit unit in the first unit column are alternately disposed along the second direction, and the third circuit unit and the fourth circuit unit in the second unit column are alternately disposed along the second direction; at least part of the second initial signal line is disposed in the first unit column.

In an exemplary implementation, the light emitting device includes an anode and a pixel definition layer; the anode includes a first anode of the red light emitting device, a second anode of the blue light emitting device, a third anode of the first green light emitting device and a fourth anode of the second green light emitting device; the pixel definition layer is disposed with a first pixel opening exposing the first anode, a second pixel opening exposing the second anode, a third pixel opening exposing the third anode and a fourth pixel opening exposing the fourth anode; a first centerline of an orthographic projection of the first pixel opening on the substrate overlaps at least partially with a second centerline of the orthographic projection of the second initial signal line on the substrate.

In an exemplary implementation, the drive circuit layer further includes a data signal line, a third centerline of an orthographic projection of the second pixel opening on the substrate overlaps at least partially with a fourth centerline of an orthographic projection of the data signal line on the substrate.

In an exemplary implementation, the light emitting device includes an anode and a pixel definition layer; the anode includes a first anode of the red light emitting device, a second anode of the blue light emitting device, a third anode of the first green light emitting device and a fourth anode of the second green light emitting device; the pixel definition layer is disposed with a first pixel opening exposing the first anode, a second pixel opening exposing the second anode, a third pixel opening exposing the third anode and a fourth pixel opening exposing the fourth anode; the drive circuit layer further includes a data signal line; a second centerline of an orthographic projection of the extension portion of the second initial signal line on the substrate and a fourth centerline of an orthographic projection of the data signal line on the substrate are located at both sides of a first centerline of an orthographic projection of the first pixel opening on the substrate.

In an exemplary implementation, the second centerline of the orthographic projection of the extension portion of the second initial signal line on the substrate and the fourth centerline of the orthographic projection of the data signal line on the substrate are disposed symmetrically with respect to the first centerline of the orthographic projection of the first pixel opening on the substrate.

In an exemplary implementation, the second centerline of the orthographic projection of the extension portion of the second initial signal line on the substrate and the fourth centerline of the orthographic projection of the data signal line on the substrate are located at both sides of a third centerline of an orthographic projection of the second pixel opening on the substrate.

In an exemplary implementation, the second centerline of the orthographic projection of the extension portion of the second initial signal line on the substrate and the fourth centerline of the orthographic projection of the data signal line on the substrate are disposed symmetrically with respect to the third centerline of the orthographic projection of the second pixel opening on the substrate.

In an exemplary implementation, the plurality of circuit units include a first circuit unit connected with a red light emitting device emitting red light, a second circuit unit connected with a blue light emitting device emitting blue light, a third circuit unit connected with a first green light emitting device emitting green light, and a fourth circuit unit connected with a second green light emitting device emitting green light; the plurality of unit columns include a first unit column and a second unit column, the first circuit unit and the second circuit unit in the first unit column are alternately disposed along the second direction, and the third circuit unit and the fourth circuit unit in the second unit column are alternately disposed along the second direction; at least part of the second initial signal line is disposed in the second unit column.

In an exemplary implementation, the light emitting device includes an anode and a pixel definition layer; the anode includes a first anode of the red light emitting device, a second anode of the blue light emitting device, a third anode of the first green light emitting device and a fourth anode of the second green light emitting device; the pixel definition layer is disposed with a first pixel opening exposing the first anode, a second pixel opening exposing the second anode, a third pixel opening exposing the third anode and a fourth pixel opening exposing the fourth anode; a fifth centerline of an orthographic projection of the third pixel opening on the substrate overlaps at least partially with a seventh centerline of an orthographic projection of the connection portion of the second initial signal line on the substrate.

In an exemplary implementation, a sixth centerline of an orthographic projection of the fourth pixel opening on the substrate overlaps at least partially with the seventh centerline of the orthographic projection of the connection portion of the second initial signal line on the substrate.

In an exemplary implementation, the plurality of circuit units include a first circuit unit connected with a red light emitting device emitting red light, a second circuit unit connected with a blue light emitting device emitting blue light, a third circuit unit connected with a first green light emitting device emitting green light, and a fourth circuit unit connected with a second green light emitting device emitting green light; the plurality of unit columns include a first unit column and a second unit column, the first circuit unit and the second circuit unit in the first unit column are alternately disposed along the second direction, and the third circuit unit and the fourth circuit unit in the second unit column are alternately disposed along the second direction; and the second initial signal line is disposed in the first unit column and the second unit column.

In an exemplary implementation, in a plane perpendicular to the display substrate, the drive circuit layer includes a semiconductor layer, a first conductive layer, a second conductive layer, a third conductive layer, and a fourth conductive layer which are sequentially disposed on the substrate; the semiconductor layer includes an active layers of a plurality of transistors in the pixel drive circuit, the first conductive layer includes a scan signal line and gate electrodes of the plurality of transistors, the second conductive layer includes the first initial signal line, the third conductive layer includes a first power supply line, and the fourth conductive layer includes the data signal line and the second initial signal line.

In an exemplary implementation, the third conductive layer further includes a second connection electrode connected with the first initial signal line through a via, and the second initial signal line connected with the second connection electrode through a via.

In an exemplary implementation, the second conductive layer further includes a shield electrode connected with the first power supply line through a via.

In an exemplary implementation, an orthographic projection of at least a partial region of the shield electrode on the substrate is located between the orthographic projection of the data signal line on the substrate and an orthographic projection of a second electrode of the first transistor in the pixel drive circuit on the substrate.

In another aspect, the present disclosure further provides a display apparatus, including the aforementioned display substrate.

In another aspect, the present disclosure further provides a preparation method for a display substrate, wherein the display substrate includes a drive circuit layer disposed on a substrate and a light emitting structure layer disposed at a side of the drive circuit layer away from the substrate, the drive circuit layer includes a plurality of circuit units, the light emitting structure layer includes a plurality of light emitting devices; at least one circuit unit includes a first power supply line, an initial signal line including a first initial signal line extending in a first direction and a second initial signal line extending in a second direction, and a pixel drive circuit; the first direction interacts the second direction, and the preparation method includes: forming the first initial signal line extending in the first direction on the substrate; and forming the second initial signal line extending in the second direction, wherein an orthographic projection of the second initial signal line on the substrate overlaps at least partially with an orthographic projection of the first power supply line on the substrate.

Other aspects will become apparent upon reading and understanding accompanying drawings and the detailed description.

BRIEF DESCRIPTION OF THE DRAWINGS

Accompany drawings are used to provide understanding for technical solutions of the present disclosure, form a part of the specification, and explain the technical solutions of the present disclosure together with embodiments of the present disclosure, and do not form a limitation on the technical solutions of the present disclosure.

FIG. 8b is a schematic plan view of a first conductive layer in FIG. 8a;

FIG. 9b is a schematic plan view of a second conductive layer in FIG. 9a;

FIG. 10b is a schematic plan view of a plurality of vias in FIG. 10a;

FIG. 11b is a schematic plan view of a third conductive layer in FIG. 11a;

FIG. 12b is a schematic plan view of a plurality of vias in FIG. 12a;

FIG. 13b is a schematic plan view of a fourth conductive layer in FIG. 13a;

FIG. 14b is a schematic plan view of a plurality of vias in FIG. 14a;

FIG. 15b is a schematic plan view of an anode of FIG. 15a;

FIG. 16b is a schematic plan view of a pixel definition layer in FIG. 16a;

FIG. 17b is a schematic plan view of a fourth conductive layer in FIG. 17a;

FIG. 18b is a schematic plan view of a fourth conductive layer in FIG. 18a;

FIG. 19b is a schematic plan view of a fourth conductive layer in FIG. 19a;

FIG. 20b is a schematic plan view of a fourth conductive layer in FIG. 20a;

FIG. 21b is a schematic plan view of an anode of FIG. 21a;

FIG. 22b is a schematic plan view of a pixel definition layer in FIG. 22a.

DETAILED DESCRIPTION

Figure 1:
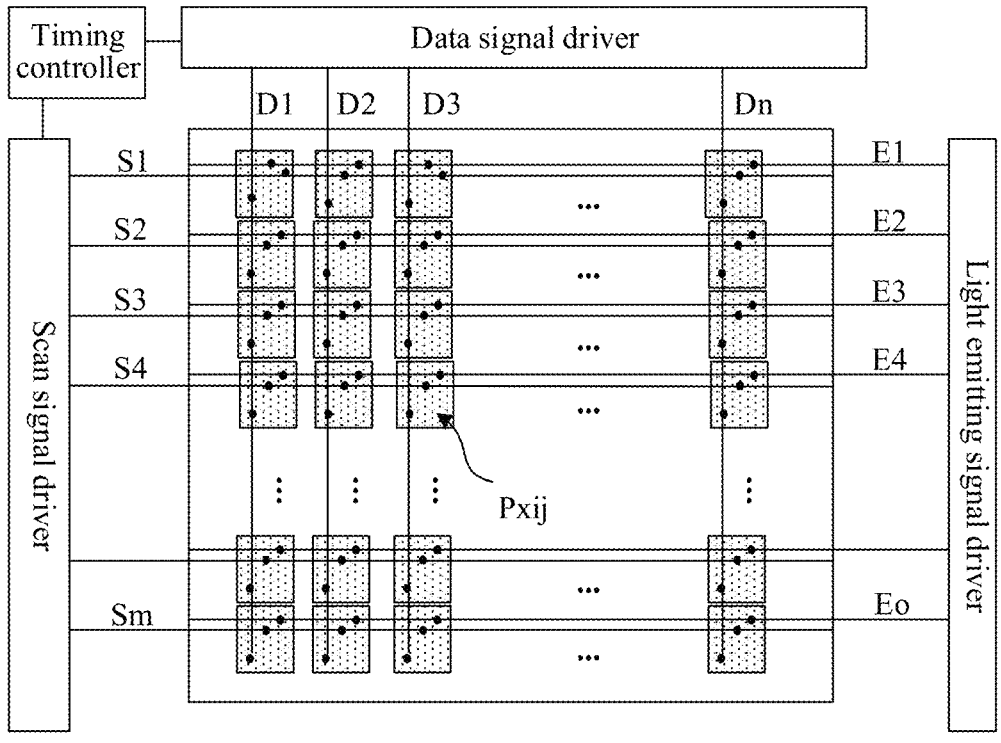
FIG. 1 is a schematic diagram of a structure of a display apparatus.

To make objectives, technical solutions, and advantages of the present disclosure clearer, the embodiments of the present disclosure will be described in detail with reference to the accompanying drawings. It is to be noted that implementations may be implemented in a plurality of different forms. Those of ordinary skills in the art can easily understand such a fact that manners and contents may be transformed into various forms without departing from the purpose and scope of the present disclosure. Therefore, the present disclosure should not be interpreted as being limited to the contents recorded in the following implementations only. The embodiments in the present disclosure and features in the embodiments can be arbitrarily combined with each other if there are no conflicts.

A scale of the accompanying drawings in the present disclosure can be used as a reference in an actual process, but is not limited thereto. For example, a width-length ratio of a channel, a thickness and spacing of each film layer, and a width and spacing of each signal line can be adjusted according to actual needs. A quantity of pixels in a display substrate and a quantity of sub-pixels in each pixel are not limited to the quantity shown in the accompanying drawings. The accompanying drawings described in the present disclosure are schematic diagrams of structures only, and one implementation of the present disclosure is not limited to the shapes, numerical values or the like shown in the accompanying drawings.

Ordinal numerals such as "first", "second", and "third" in the specification are set to avoid confusion of constituent elements, but are not intended to limit in terms of quantity.

In the specification, for convenience, wordings indicating orientation or positional relationships, such as "center", "upper", "lower", "front", "back", "vertical", "horizontal", "top", "bottom", "inside", and "outside", are used for illustrating positional relationships between constituent elements with reference to the accompanying drawings, and are merely for facilitating the description of the specification and simplifying the description, rather than indicating or implying that a referred apparatus or element must have a particular orientation and be constructed and operated in the particular orientation. Therefore, they cannot be understood as limitations on the present disclosure. The position relationships between the constituent elements change appropriately according to the direction in which the various constituent elements are described. Therefore, the position relationships are not limited to the words and phrases used in the specification, and appropriate substitutions may be made according to situations.

In the specification, unless otherwise specified and defined explicitly, terms "mount", "mutually connect", and "connect" should be understood in a broad sense. For example, the connection may be a fixed connection, a detachable connection or an integrated connection, or may be a mechanical connection or an electrical connection, or may be a direct connection, an indirect connection through intermediate components, or communication inside two components. Those of ordinary skills in the art may understand specific meanings of these terms in the present disclosure according to specific situations.

In the specification, a transistor refers to a component which at least includes three terminals, i.e., a gate electrode, a drain electrode and a source electrode. The transistor has a channel region between the drain electrode (drain electrode terminal, drain region, or drain electrode) and the source electrode (source electrode terminal, source region, or source electrode), and a current can flow through the drain electrode, the channel region and the source electrode. It is to be noted that, in the specification, the channel region refers to a region that the current mainly flows through.

In the specification, a first electrode may be the drain electrode, and a second electrode may be the source electrode. Or, the first electrode may be the source electrode, and the second electrode may be the drain electrode. In the case that transistors with opposite polarities are used or that a current direction is changed during circuit operation, functions of "the source electrode" and "the drain electrode" may sometimes be exchanged. Therefore, the "source electrode" and the "drain electrode", as well as the "source terminal" and the "drain terminal" are interchangeable in the specification.

In the specification, "electrical connection" includes a case that constituent elements are connected with together through an element with a certain electrical action. The "element with a certain electric action" is not particularly limited as long as it allows sending and receiving of electric signals between the connected constituent elements. Examples of the "element with a certain electric action" include not only an electrode and wiring, but also a switch element such as a transistor, a resistor, an inductor, a capacitor, other elements with various functions, etc.

In the specification, "parallel" refers to a state in which an angle formed by two straight lines is above −10° and below 10°, and thus also includes a state in which the angle is above −5° and below 5°. In addition, "perpendicular" refers to a state in which an angle formed by two straight lines is 80° or more and 100° or less, and thus also includes a state in which the angle is 85° or more and 95° or less.

In the specification, a "film" and a "layer" are interchangeable. For example, a "conductive layer" may be replaced with a "conductive film" sometimes. Similarly, an "insulating film" may be replaced with an "insulating layer" sometimes.

Triangle, rectangle, trapezoid, pentagon or hexagon in this specification are not strictly defined, but can be approximate triangle, rectangle, trapezoid, pentagon or hexagon, etc. There can be some small deformation caused by tolerance, and there can be guide angle, arc edge and deformation, etc.

In the present disclosure, "about" refers to that a boundary is defined not so strictly and numerical values within process and measurement error ranges are allowed.

FIG. 1 is a schematic diagram of a structure of a display apparatus. As shown in FIG. 1, the display apparatus may include a timing controller, a data driver, a scan driver, a light emitting driver and a pixel array. The timing controller is connected with the data driver, the scan driver and the light emitting driver respectively, the data driver is connected with a plurality of data signal lines (D1 to Dn) respectively, the scan driver is connected with a plurality of scan signal lines (S1 to Sm) respectively, and the light emitting driver is connected with a plurality of light emitting signal lines (E1 to Eo) respectively. The pixel array may include a plurality of sub-pixels Pxij, i and j may be natural numbers, at least one sub-pixel Pxij may include a circuit unit and a light emitting device connected with the circuit unit, and the circuit unit may include at least one scan signal line, at least one data signal line, at least one light emitting signal line and a pixel drive circuit. In an exemplary implementation, the timing controller may provide a grayscale value and a control signal, which are suitable for the specification of the data driver, to the data driver; provide a clock signal, a scan initial signal, etc., which are suitable for the specification of the scan driver, to the scan driver; and provide a clock signal, a transmit stop signal, etc., which are suitable for the specification of the light emitting driver, to the light emitting driver. The data driver may generate a data voltage to be provided to the data signal lines D1, D2, D3, . . . , and Dn using the grayscale value and the control signal that are received from the timing controller. For example, the data driver may sample the grayscale value using the clock signal and apply a data voltage corresponding to the grayscale value to the data signal lines D1 to Dn by taking a pixel row as a unit, n may be a natural number. The scan driver may receive the clock signal, the scan initial signal, etc., from the timing controller to generate a scan signal to be provided to the scan signal lines S1, S2, S3, . . . , and Sm. For example, the scan driver may provide sequentially a scan signal with a turn-on level pulse to the scan signal lines S1 to Sm. For example, the scan driver may be constructed in a form of a shift register and may generate a scan signal in a manner of transmitting sequentially the scan initial signal provided in a form of a turn-on level pulse to a next-stage circuit under the control of the clock signal, m may be a natural number. The light emitting driver may generate a transmit signal to be provided to the light emitting signal lines E1, E2, E3, . . . , and Eo by receiving the clock signal, the transmit stop signal, etc., from the timing controller. For example, the light emitting driver may provide sequentially a transmit signal with a turn-off level pulse to the light emitting signal lines E1 to Eo. For example, the light emitting driver may be constructed in a form of a shift register and may generate a transmit signal in a manner of transmitting sequentially a transmit stop signal provided in a form of a turn-off level pulse to a next-stage circuit under the control of the clock signal, o may be a natural number.

Figure 2A:
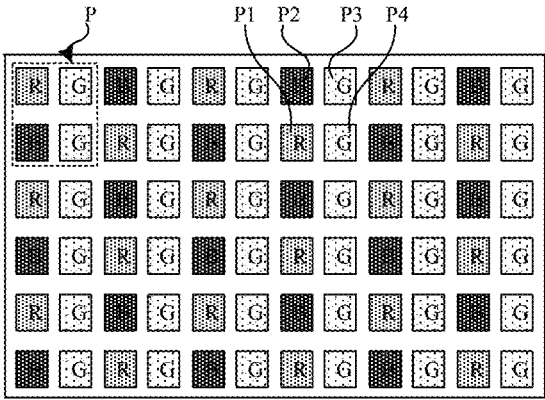
FIG. 2a and FIG. 2b are schematic diagrams of a planar structure of a display substrate.
Figure 2B:
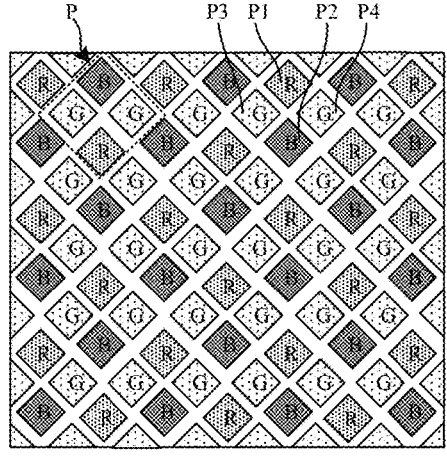

FIG. 2a and FIG. 2b are schematic diagrams of a planar structure of a display substrate. In an exemplary implementation, the display substrate may include a plurality of pixel units P arranged in a matrix manner, at least one pixel unit P may include a first sub-pixel P1 emitting light of a first color, a second sub-pixel P2 emitting light of a second color, and a third sub-pixel P3 and a fourth sub-pixels P4 emitting light of a third color respectively. Each of the four sub-pixels may include a circuit unit and a light emitting device, The circuit unit may include a scan signal line, a data signal line and a light emitting signal line and a pixel drive circuit, The pixel drive circuit is connected with the scan signal line, the data signal line, and the light emitting signal line, respectively. The pixel drive circuit is configured to receive a data voltage transmitted by the data signal line under the control of the scan signal line and the light emitting signal line, and output a corresponding current to the light emitting device. The light emitting device in each sub-pixel is connected with the pixel drive circuit of the sub-pixel where the light emitting device is located, and is configured to emit light with a corresponding brightness in response to a current output by the pixel drive circuit of the sub-pixel where the light emitting device is located.

In an exemplary implementation, the first sub-pixel P1 may be a red sub-pixel (R) emitting red light, the second sub-pixel P2 may be a blue sub-pixel (B) emitting blue light, and the third sub-pixel P3 and the fourth sub-pixel P4 may be green sub-pixels (G) emitting green light. In some exemplary implementations, a shape of the sub-pixel may be a rectangle, a rhombus, a pentagon, or a hexagon. In an exemplary implementation, four sub-pixels may be arranged in a manner of square to form a GGRB pixel arrangement, as shown in FIG. 2a. In another exemplary implementation, the four sub-pixels may be arranged in a manner of diamond to form an RGBG pixel arrangement, as shown in FIG. 2b. In other exemplary implementations, the four sub-pixels may be arranged in a manner of horizontal juxtaposition or vertical juxtaposition or the like. In an exemplary implementation, the pixel unit may include three sub-pixels, the three sub-pixels may be arranged in manner of horizontal juxtaposition, vertical juxtaposition or triangle, which is not limited in the present disclosure.

In an exemplary implementation, a plurality of sub-pixels sequentially disposed in a horizontal direction are referred to as pixel rows, and a plurality of sub-pixels sequentially disposed in a vertical direction are referred to as pixel columns, and a plurality of pixel rows and a plurality of pixel columns form a pixel array arranged in an array.

Figure 3:
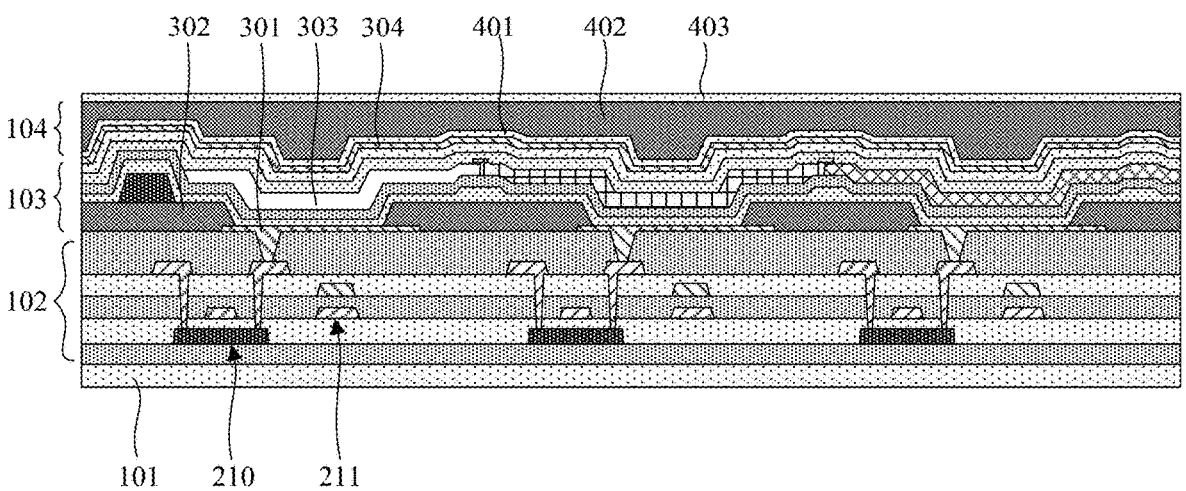
FIG. 3 is a schematic diagram of a sectional structure of a display substrate.

FIG. 3 is a schematic diagram of a sectional structure of a display substrate, and illustrates a structure of three sub-pixels of the display substrate. As shown in FIG. 3, on a plane perpendicular to the display substrate, the display substrate may include a drive circuit layer 102 disposed on a substrate 101, a light emitting structure layer 103 disposed at a side of the drive circuit layer 102 away from the substrate, and an encapsulation layer 104 disposed at a side of the light emitting structure layer 103 away from the substrate. In some possible implementations, the display substrate may include other film layers, such as post spacers, which is not limited in the present disclosure.

In an exemplary implementation, the substrate 101 may be a flexible substrate, or a rigid substrate. The drive circuit layer 102 of each sub-pixel may include a plurality of signal lines and a pixel drive circuit, the pixel drive circuit may include a plurality of transistors and a storage capacitor. In FIG. 3, only one drive transistor 210 and one storage capacitor 211 are taken as an example for illustration. The light emitting structure layer 103 of each sub-pixel may include a plurality of film layers forming a light emitting device, the plurality of film layers include an anode 301, a pixel definition layer 302, an organic light emitting layer 303, and a cathode 304. The anode 301 is connected with a drain electrode of the drive transistor 210 through a via. The organic light emitting layer 303 is connected with the anode 301. The cathode 304 is connected with the organic light emitting layer 303. The organic light emitting layer 303 is driven by the anode 301 and the cathode 304 to emit light of a corresponding color. The encapsulation layer 104 may include a first encapsulation layer 401, a second encapsulation layer 402, and a third encapsulation layer 403 that are stacked, the first encapsulation layer 401 and the third encapsulation layer 403 may be made of an inorganic material, the second encapsulation layer 402 may be made of an organic material, and the second encapsulation layer 402 is disposed between the first encapsulation layer 401 and the third encapsulation layer 403 so as to prevent external water vapor from entering the light emitting structure layer 103.

In an exemplary implementation, the organic light emitting layer 303 may include a hole injection layer (HIL), a hole transport layer (HTL), an electron block layer (EBL), a light emitting layer (EML), a hole block layer (HBL), an electron transport layer (ETL) and an electron injection layer (EIL) that are stacked. In an exemplary implementation, the hole injection layers and the electron injection layers of all the sub-pixels may be connected with each other as a common layer, the hole transport layers and the electron transport layers of all the sub-pixels may be connected together as a common layer, the hole block layers of all the sub-pixels may be connected together as a common layer, and the light emitting layers and the electron block layers of adjacent sub-pixels may slightly overlap with each other, or may be isolated from each other.

Figure 4:
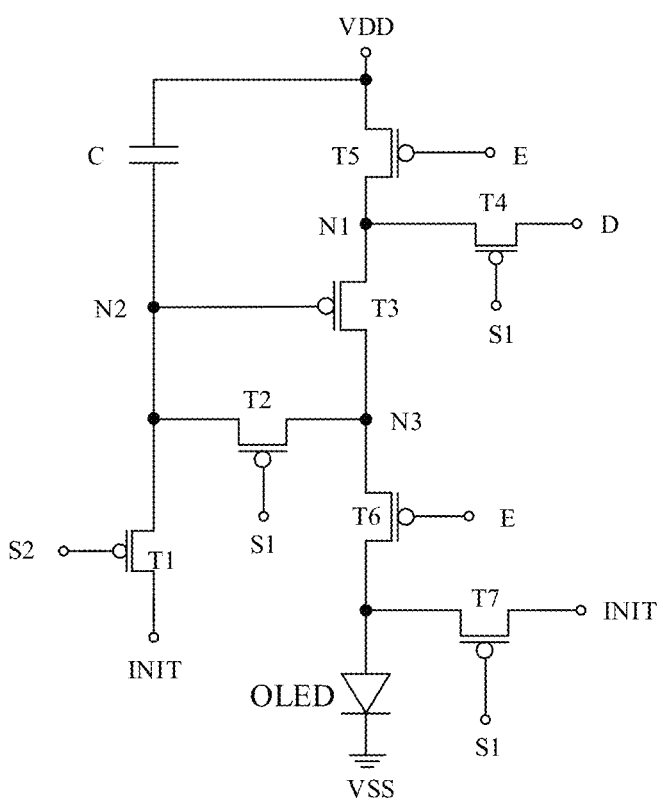
FIG. 4 is a schematic diagram of an equivalent circuit of a pixel drive circuit.

In an exemplary implementation, the pixel drive circuit may be of a 3T1C, 4T1C, 5T1C, 5T2C, 6T1C, 7T1C or 8T1C structure. FIG. 4 is a schematic diagram of an equivalent circuit of a pixel drive circuit. As shown in FIG. 4, the pixel drive circuit may include seven transistors (a first transistor T1 to a seventh transistor T7), one storage capacitor C. The pixel drive circuit is connected with seven signal lines (a data signal line D, a first scan signal line S1, a second scan signal line S2, a light emitting signal line E, an initial signal line INIT, a first power supply line VDD, and a second power supply line VSS) respectively.

In an exemplary implementation, the pixel drive circuit may include a first node N1, a second node N2 and a third node N3. The first node N1 is connected with a first electrode of the third transistor T3, a second electrode of the fourth transistor T4 and a second electrode of the fifth transistor T5, respectively, The second node N2 is connected with a second electrode of the first transistor, a first electrode of the second transistor T2, a control electrode of the third transistor T3 and a second terminal of the storage capacitor C, respectively, and the third node N3 is connected with a second electrode of the second transistor T2, a second electrode of the third transistor T3 and a first electrode of the sixth transistor T6, respectively.

In an exemplary implementation, the first terminal of the storage capacitor C is connected with the first power supply line VDD, and a second terminal of the storage capacitor C is connected with the second node N2, namely the second terminal of the storage capacitor C is connected with the control electrode of the third transistor T3.

A control electrode of the first transistor T1 is connected with the second scan signal line S2, a first electrode of the first transistor T1 is connected with the initial signal line INIT, and the second electrode of the first transistor is connected with the second node N2. When a scan signal with a turn-on level is applied to the second scan signal line S2, the first transistor T1 transmits an initialization voltage to the control electrode of the third transistor T3 so as to initialize a charge amount of the control electrode of the third transistor T3.

A control electrode of the second transistor T2 is connected with the first scan signal line S1, the first electrode of the second transistor T2 is connected with the second node N2, and the second electrode of the second transistor T2 is connected with the third node N3. When a scan signal with a turn-on level is applied to the first scan signal line S1, the second transistor T2 enables the control electrode of the third transistor T3 to be connected with the second electrode of the third transistor T3.

The control electrode of the third transistor T3 is connected with the second node N2, namely the control electrode of the third transistor T3 is connected with the second terminal of the storage capacitor C, the first electrode of the third transistor T3 is connected with the first node N1, and the second electrode of the third transistor T3 is connected with the third node N3. The third transistor T3 may be referred to as a drive transistor, and the third transistor T3 determines an amount of a drive current flowing between the first power supply line VDD and the second power supply line VSS according to a potential difference between the control electrode and the first electrode of the third transistor T3.

A control electrode of the fourth transistor T4 is connected with the first scan signal line S1, a first electrode of the fourth transistor T4 is connected with the data signal line D, and the second electrode of the fourth transistor T4 is connected with the first node N1. The fourth transistor T4 may be referred to as a switch transistor, a scan transistor, etc., and when a scan signal with a turn-on level is applied to the first scan signal line S1, the fourth transistor T4 enables a data voltage of the data signal line D to be input to the pixel drive circuit.

A control electrode of the fifth transistor T5 is connected with the light emitting signal line E, a first electrode of the fifth transistor T5 is connected with the first power supply line VDD, and the second electrode of the fifth transistor T5 is connected with the first node N1. A control electrode of the sixth transistor T6 is connected with the light emitting signal line E, the first electrode of the sixth transistor T6 is connected with the third node N3, and a second electrode of the sixth transistor T6 is connected with a first electrode of the light emitting device. The fifth transistor T5 and the sixth transistor T6 may be referred to as light emitting transistors. When a light emitting signal with a turn-on level is applied to the light emitting signal line E, the fifth transistor T5 and the sixth transistor T6 form a drive current path between the first power supply line VDD and the second power supply line VSS to enable the light emitting device to emit light.

A control electrode of the seventh transistor T7 is connected with the first scan signal line S1, a first electrode of the seventh transistor T7 is connected with the initial signal line INIT, and a second electrode of the seventh transistor T7 is connected with the first electrode of the light emitting device. When a scan signal with a turn-on level is applied to the first scan signal line S1, the seventh transistor T7 transmits an initialization voltage to the first electrode of the light emitting device so as to initialize a charge amount accumulated in the first electrode of the light emitting device or release the charge amount accumulated in the first electrode of the light emitting device.

In an exemplary implementation, the light emitting device may be an OLED including a first electrode (anode), an organic light emitting layer, and a second electrode (cathode) which are stacked, or may be a QLED including a first electrode (anode), a quantum dot light emitting layer, and a second electrode (cathode) which are stacked.

In an exemplary implementation, a second electrode of the light emitting device is connected with the second power supply line VSS, a signal of the second power supply line VSS is a low-level signal, and a signal of the first power supply line VDD is a high-level signal continuously provided. The first scan signal line S1 is a scan signal line in a pixel drive circuit of a present display row, and the second scan signal line S2 is a scan signal line in a pixel drive circuit of a previous display row. That is, for an n-th display row, the first scan signal line S1 is S(n), and the second scan signal line S2 is S(n−1). The second scan signal line S2 of the present display row and the first scan signal line S1 in the pixel drive circuit of the previous display row are the same signal line, which may reduce signal lines of a display panel, and achieve the display panel with a narrow frame.

In an exemplary implementation, the first transistor T1 to the seventh transistor T7 may be P-type transistors or N-type transistors. Use of the same type of transistors in the pixel drive circuit may simplify a process flow, reduce process difficulties of the display panel, and improve a yield of a product. In some possible implementations, the first transistor T1 to the seventh transistor T7 may include P-type transistors and N-type transistors.

In an exemplary implementation, the first transistor T1 to the seventh transistor T7 may be low temperature poly-silicon thin film transistors, or may be oxide thin film transistors, or may be both of low temperature poly-silicon thin film transistors and oxide thin film transistors. An active layer of the low temperature poly-silicon thin film transistor may be made of Low Temperature Poly-Silicon (LTPS), and an active layer of the oxide thin film transistor may be made of an oxide semiconductor. The low temperature poly-silicon thin film transistor has advantages such as high mobility and fast charging. The oxide thin film transistor has advantages such as low drain current. The low temperature poly-silicon thin film transistor and the oxide thin film transistor are integrated on one display substrate to form a Low Temperature Polycrystalline Oxide (LTPO) display substrate, so that advantages of the low temperature poly-silicon thin film transistor and the oxide thin film transistor may be utilized, low-frequency drive may be achieved, power consumption may be reduced, and display quality may be improved.

Figure 5:
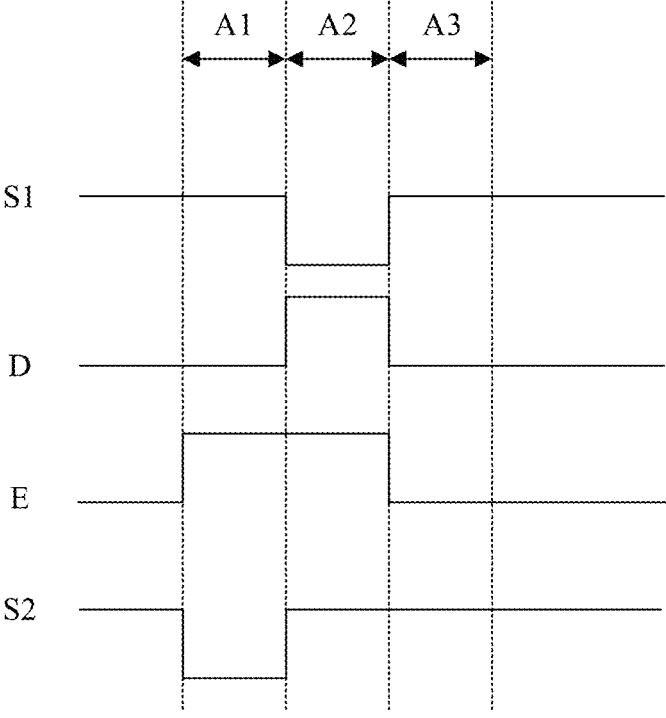
FIG. 5 is a working timing diagram of a pixel drive circuit.

FIG. 5 is working timing diagram of a pixel drive circuit. An exemplary embodiment of the present disclosure will be described below through a working process of the pixel drive circuit shown in FIG. 4. The pixel drive circuit in FIG. 4 includes seven transistors (a first transistor T1 to a seventh transistor T7), one storage capacitor C, and seven signal lines (a data signal line D, a first scan signal line S1, a second scan signal line S2, a light emitting signal line E, an initial signal line INIT, a first power supply line VDD, and a second power supply line VSS), all of the seven transistors are P-type transistors.

In some exemplary implementations, taking OLED as an example, the working process of the pixel drive circuit may include the followings.

In a first phase A1, referred to as a reset phase, a signal of the second scan signal line S2 is a low-level signal, and signals of the first scan signal line S1 and the light emitting signal line E are high-level signals. The signal of the second scan signal line S2 is the low-level signal, so that the first transistor T1 is turned on, and a signal of the initial signal line INIT is provided to the second node N2 to initialize the storage capacitor C to clear an original data voltage in the storage capacitor. The signals of the first scan signal line S1 and the light emitting signal line E are high-level signals, so that the second transistor T2, the fourth transistor T4, the fifth transistor T5, the sixth transistor T6, and the seventh transistor T7 are turned off. An OLED does not emit light in this phase.

In a second phase A2, referred to as a data writing phase or a threshold compensation phase, a signal of the first scan signal line S1 is a low-level signal, the signals of the second scan signal line S2 and the light emitting signal line E are high-level signals, and the data signal line D outputs a data voltage. In this phase, the second terminal of the storage capacitor C is at a low level, so that the third transistor T3 is turned on. The signal of the first scan signal line S1 is the low-level signal, so that the second transistor T2, the fourth transistor T4, and the seventh transistor T7 are turned on. The second transistor T2 and the fourth transistor T4 are turned on, so that the data voltage output by the data signal line D is provided to the second node N2 through the first node N1, the turned-on third transistor T3, the third node N3, and the turned-on second transistor T2, and the storage capacitor C is charged with a difference between the data voltage output by the data signal line D and a threshold voltage of the third transistor T3. A voltage at the second terminal (the second node N2) of the storage capacitor C is Vd−|Vth|, wherein Vd is the data voltage output by the data signal line D, and Vth is the threshold voltage of the third transistor T3. The seventh transistor T7 is turned on, so that an initialization voltage of the initial signal line INIT is provided to a first electrode of the OLED to initialize (reset) the first electrode of the OLED and clear a pre-stored voltage therein, thereby completing initialization to ensure that the OLED does not emit light. The signal of the second scan signal line S2 is the high-level signal, so that the first transistor T1 is turned off. The signal of the light emitting signal line E is a high-level signal, so that the fifth transistor T5 and the sixth transistor T6 are turned off.

In a third phase A3, referred to as a light emitting phase, a signal of the light emitting signal line E is a low-level signal, and signals of the first scan signal line S1 and the second scan signal line S2 are high-level signals. The signal of the light emitting signal line E is the low-level signal, so that the fifth transistor T5 and the sixth transistor T6 are turned on, and a power supply voltage output by the first power supply line VDD provides a drive voltage to the first electrode of the OLED through the fifth transistor T5, the third transistor T3, and the sixth transistor T6 which are all turned on to drive the OLED to emit light.

In a driving process of the pixel drive circuit, a drive current flowing through the third transistor T3 (drive transistor) is determined by a voltage difference between a gate electrode and a first electrode of the third transistor T3. A voltage of the second node N2 is Vdata−|Vth|, so that the drive current of the third transistor T3 is as follows.

$$I=K*(Vgs-Vth)^2=K*[(Vdd-Vd+|Vth|)-Vth]^2=K*[(Vdd-Vd]^2$$

I is the drive current flowing through the third transistor T3, i.e., a drive current for driving the OLED, K is a constant, Vgs is the voltage difference between the gate electrode and first electrode of the third transistor T3, Vth is the threshold voltage of the third transistor T3, Vd is the data voltage output by the data signal line D, and Vdd is the power supply voltage output by the first power supply line VDD.

Figure 6A:
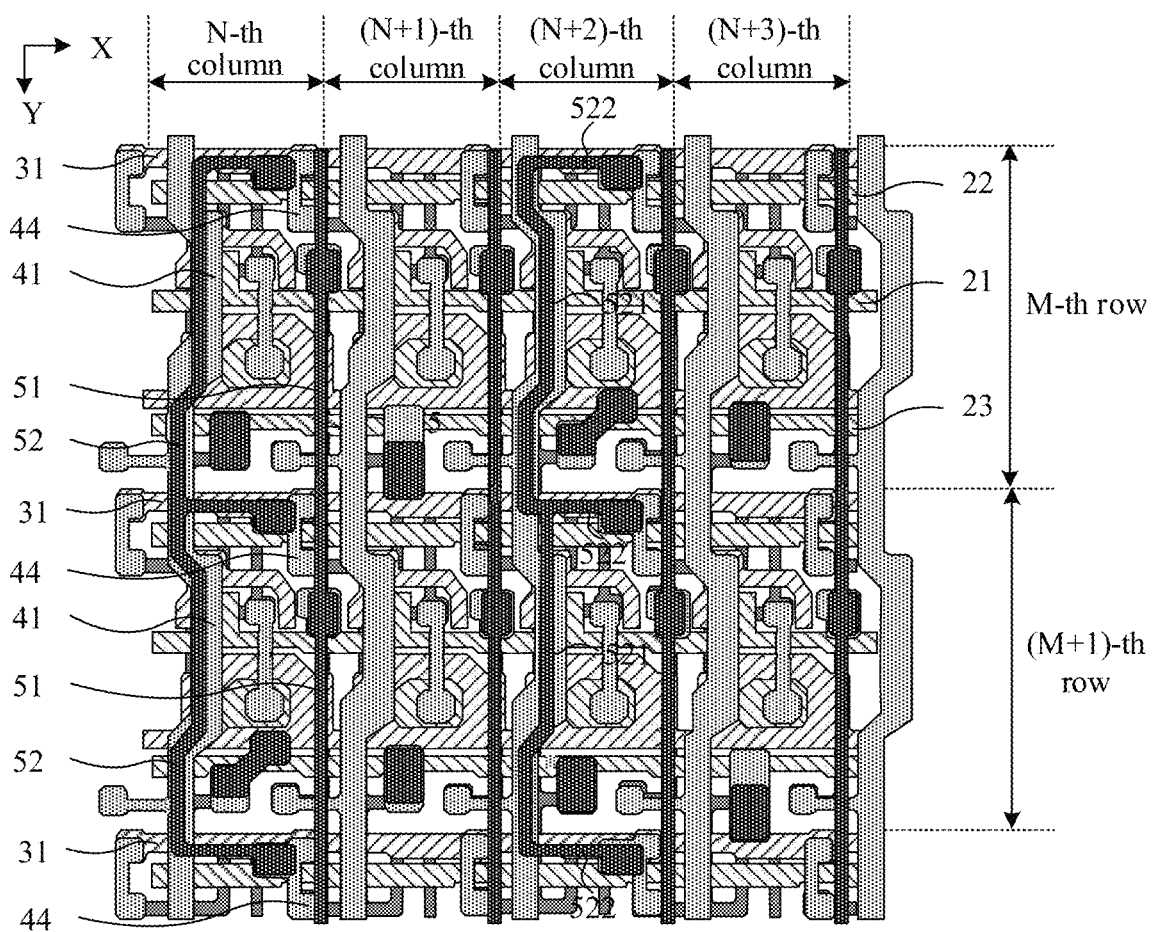
FIG. 6a is a schematic diagram of a structure of a display substrate according to an exemplary embodiment of the present disclosure.

FIG. 6a is a schematic diagram of a structure of a drive circuit layer according to an exemplary embodiment of the present disclosure, and illustrates a planar structure of eight circuit units (2 unit rows and 4 unit columns). As shown in FIG. 6a, in a plane parallel to the display substrate, the drive circuit layer may include a plurality of circuit units, a plurality of circuit units sequentially arranged along a first direction X is referred to as a unit row, and a plurality of circuit units sequentially arranged along a second direction Y is referred to as a unit column. The plurality of unit rows and the plurality of unit columns form an array of circuit units arranged in an array, the first direction X intersects the second direction Y.

In an exemplary implementation, at least one circuit unit may include a first power supply line, an initial signal line, and a pixel drive circuit connected with the first power supply line and the initial signal line, and the pixel drive circuit may include a plurality of transistors and a storage capacitor. In an exemplary implementation, the first power supply line may be configured as a signal line that receives a power supply signal and the initial signal line may be configured to initialize (reset) the storage capacitor.

In an exemplary implementation, the initial signal line of at least one circuit unit may include a first initial signal line 31 whose a body portion extends in the first direction X and a second initial signal line 52 whose a body portion extends in the second direction Y, and the first initial signal line 31 and the second initial signal line 52 are connected through a via. In the present disclosure, A extending in a B direction means that A may include a main portion, which is a line, a line segment or a strip-shaped body, and a secondary portion connected with the main portion, the main portion extending in the B direction, and a length of the main portion extending in the B direction is greater than a length of the secondary portion extending in other directions.

In an exemplary implementation, in at least one circuit unit, the second initial signal line 52 may include an extension portion 521 and a connection portion 522, which are connected with each other, a body portion of the extension portion 521 extends in the second direction Y, and a body portion of the connection portion 522 extends in the first direction X. In an exemplary implementation, an end of a side of the connection portion 522 away from the extension portion 521 may be connected with the first initial signal line 31 through a via.

In an exemplary implementation, an orthographic projection of at least part of the connection portion 522 on the substrate is within a range of an orthographic projection of the first initial signal line 31 on the substrate.

In an exemplary implementation, the orthographic projection of at least part of the connection portion 521 on the substrate is located within a range of an orthographic projection of the first power supply line 41 on the substrate.

Figure 6B:
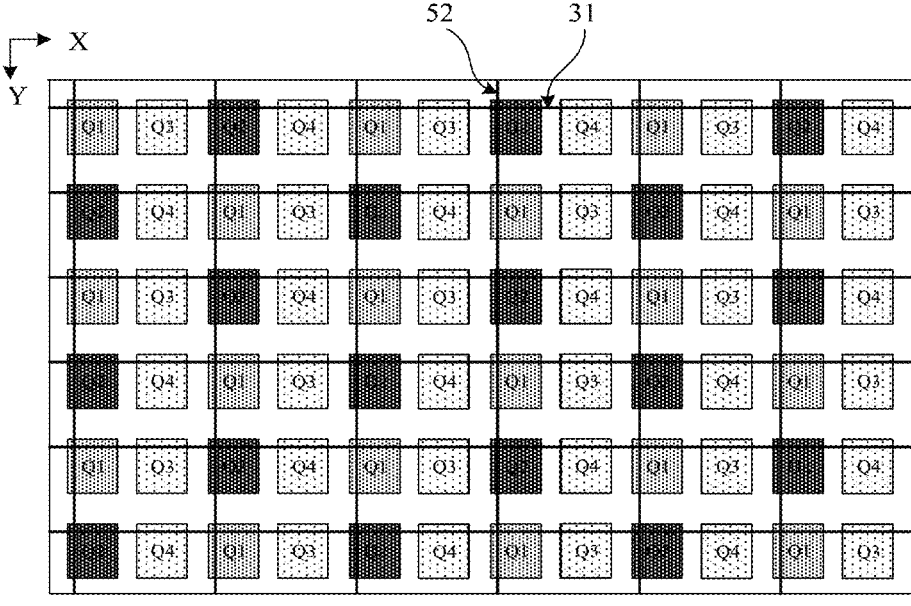
FIG. 6b is a schematic diagram of an initial signal line in a display substrate according to an exemplary embodiment of the present disclosure.

FIG. 6b is a schematic diagram of an initial signal line in a drive circuit layer according to an exemplary embodiment of the present disclosure. As shown in FIG. 6b, the drive circuit layer may include a plurality of unit rows and a plurality of unit columns, the first initial signal line 31 may be disposed in each unit row, and the second initial signal line 52 may be disposed in spaced unit columns, that is, at least one unit column is spaced between two second initial signal lines 52 adjacent in the first direction X. In an exemplary implementation, a direction of the unit row may be the first direction X and a direction of the unit column may be the second direction Y.

In an exemplary implementation, the plurality of sub-pixels in the display substrate may include a red sub-pixel R emitting red light, a blue sub-pixel B emitting blue light, a first green sub-pixel G1 emitting green light, and a second green sub-pixel G2 emitting green light. The red sub-pixel R may include a red light emitting device emitting red light and a first circuit unit Q1 connected with the red light emitting device, the blue sub-pixel B may include a blue light emitting device emitting blue light and a second circuit unit Q2 connected with the blue light emitting device, the first green sub-pixel G1 may include a first green light emitting device emitting green light and a third circuit unit Q3 connected with the first green light emitting device, and the second green sub-pixel G2 may include a second green light emitting device emitting green light and a fourth circuit unit Q4 connected with the second green light emitting device. The first circuit unit Q1, the second circuit unit Q2, the third circuit unit Q3 and the fourth circuit unit Q4 form one circuit unit group, and four circuit units in at least one circuit unit group may be arranged in a manner of square, that is, four circuit units are arranged in two unit rows and two unit columns. A sub-pixel in the present disclosure refers to a region divided by a light emitting device, and a circuit unit in the present disclosure refers to a region divided by a pixel drive circuit. In an exemplary implementation, a position of the sub-pixel may correspond to a position of the circuit unit or the position of the sub-pixel may not correspond to the position of the circuit unit.

In an exemplary implementation, the plurality of unit columns may include a first unit column that refers to a column formed by a plurality of first circuit units Q1 and second circuit units Q2, and a second unit column that refers to a column formed by a plurality of third circuit units Q3 and fourth circuit units Q4. The first circuit unit Q1 and the second circuit unit Q2 in the first unit column are alternately arranged along the second direction Y, and the third circuit unit Q3 and the fourth circuit unit Q4 in the second unit column are alternately arranged along the second direction Y.

In an exemplary implementation, the second initial signal line 52 may be disposed in the first unit column. For example, if an N-th unit column and an (N+2)-th unit column are the first unit column, and an (N+1)-th unit column and an (N+3)-th unit column may be the second unit column, the second initial signal line 52 may be disposed in the N-th unit column, the (N+2)-th unit column, an (N+4)-th unit column, . . . , and the second initial signal line 52 is repeated every other second unit column.

In another exemplary implementation, the second initial signal line 52 may be disposed in the second unit column. For example, if the N-th unit column and the (N+2)-th unit column are the first unit column, and the (N+1)-th unit column and the (N+3)-th unit column may be the second unit column, the second initial signal line 52 may be disposed in the (N+1)-th unit column, the (N+3)-th unit column, an (N+5)-th unit column, . . . , and the second initial signal line 52 is repeated every other first unit column.

In yet another exemplary implementation, the second initial signal line 52 may be disposed in the first and second unit columns.

In an exemplary implementation, the N-th and (N+2)-th unit columns may be the first unit column, and the (N+1)-th and (N+3)-th unit columns may be the second unit column. In the N-th unit column, circuit units in a M-th row are the first circuit units and circuit units in a (M+1)-th row are the second circuit units, so that the first circuit units and the second circuit units in the N-th unit column are alternately disposed along the second direction Y. In the (N+2)-th unit column, circuit units in the M-th row are the second circuit units and circuit units in the (M+1)-th row are the first circuit units, so that the second circuit units and the first circuit units in the (N+2)-th unit column are alternately disposed along the second direction Y.

In an exemplary implementation, since both a circuit unit in the M-th row and the N-th column and a circuit unit in the (M+1)-th row and the (N+2)-th column are the first circuit units, a shape of a second initial signal line in the circuit unit in the M-th row and the N-th column may be the same as a shape of a second initial signal line in the circuit unit in the (M+1)-th row and the (N+2)-th column. Since both a circuit unit in the (M+1)-th row and the N-th column and a circuit unit in the M-th row and the (N+2)-th column are the second circuit units, a shape of a second initial signal line in the circuit unit in the (M+1)-th row and the N-th column may be the same as a shape of a second initial signal line in the circuit unit in the M-th row and the (N+2)-th column.

In an exemplary implementation, In the circuit unit in the M-th row and the N-th column and the circuit unit in the (M+1)-th row and the (N+2)-th column, the extension portion 521 may include a first initial portion, a second initial portion and a third initial portion connected sequentially, the first initial portion and the third initial portion may be parallel to the second direction Y, the second initial portion may have a first included angle with the second direction Y, and the first included angle may be greater than 0°, less than 90°. In an exemplary implementation, ends of the first and/or third initial portions may be connected with the connection portion 522.

In an exemplary implementation, in the circuit unit in the M-th row and the (N+2)-th column and the circuit unit in the (M+1)-th row and the N-th column, the extension portion 521 may include a fourth initial portion, a fifth initial portion, a sixth initial portion, a seventh initial portion, and an eighth initial portion connected sequentially, The fourth initial portion, the sixth initial portion, and the eighth initial portion may be parallel to the second direction Y, the fifth initial portion may have a first included angle with the second direction Y, and the seventh initial portion may have a second included angle with the second direction Y, the first included angle may be greater than 0°, less than 90°. The second included angle may be greater than 0°, less than 90°. In an exemplary implementation, an extension direction of the fifth initial portion and an extension direction of the seventh initial portion may be mirrored symmetrical with respect to the first direction X.

In some possible exemplary implementations, the second initial signal lines 52 may be disposed in spaced first unit column or second unit column, i.e. three unit columns spaced between two second initial signal lines 52 adjacent to each other in the first direction X. For example, the second initial signal line 52 may be disposed in the N-th unit column, the (N+4)-th unit column, an (N+8)-th unit column, . . . , and the second initial signal line 52 is repeated every one first unit column and two second unit columns. Alternatively, the second initial signal line 52 may be disposed in the (N+1)-th unit column, the (N+5)-th unit column, a (N+9)-th unit column, . . . , and the second initial signal line 52 may be repeated every two first unit columns and one second unit column. In an exemplary implementation, a quantity of unit columns spaced between adjacent second initial signal lines 52 is not particularly required and may be set as required, and the present disclosure is not limited herein.

In an exemplary implementation, in a plane perpendicular to the display substrate, the drive circuit layer may include a semiconductor layer, a first conductive layer, a second conductive layer, a third conductive layer, and a fourth conductive layer that are sequentially disposed on the substrate. The semiconductor layer may include an active layer of a plurality of transistors, the first conductive layer may include a scan signal line and gate electrodes of the plurality of transistors, the second conductive layer may include the first initial signal line 31, the third conductive layer may include the first power supply line and first and second electrodes of the plurality of transistors, and the fourth conductive layer may include the data signal line and the second initial signal line 52.

In some exemplary implementations, the third conductive layer further includes a second connection electrode 44. The second connection electrode 44 located in the third conductive layer may be connected with the first initial signal line 31 located in the second conductive layer through a via, and the second initial signal line 52 located in the fourth conductive layer may be connected with the second connection electrode 44 located in the third conductive layer through a via. In the present disclosure, the second connection electrode may be referred to as an initial connection electrode.

In an exemplary implementation, the second connection electrode 44 may be connected with a first region of an active layer of a first transistor and a first region of an active layer of a seventh transistor in the pixel drive circuit through a via.

In an exemplary implementation, the second conductive layer may further include a shield electrode connected with the first power supply line through a via. An orthographic projection of at least a partial region of the shield electrode on the substrate is located between an orthographic projection of the data signal line on the substrate and an orthographic projection of a second electrode of the first transistor in the pixel drive circuit on the substrate.

In an exemplary implementation, the drive circuit layer may further include a first scan signal line 21, a second scan signal line 22, a light emitting control line 23, and a storage capacitor, the storage capacitor may include a first electrode plate and a second electrode plate, the plurality of transistors may include a first transistor to a seventh transistor, and a third transistor is a drive transistor.

In an exemplary implementation, the first conductive layer may include a first scan signal line 21, a second scan signal line 22, a light emitting control line 23, a first electrode plate of storing capacitance, and gate electrodes of a plurality of transistors. The second conductive layer may include a first initial signal line 31, a second electrode plate of storing capacitance, a shield electrode, and an electrode plate connection line. The third conductive layer may include a first power supply line 41, a data connection electrode, a first connection electrode, a second connection electrode 44, a third connection electrode, and a fourth connection electrode. The fourth conductive layer may include a data signal line 51, a second initial signal line 52, and an anode connection electrode.

In an exemplary implementation, the drive circuit layer may include a first insulating layer, a second insulating layer, a third insulating layer, a fourth insulating layer and a fifth insulating layer. The first insulating layer is disposed between the substrate and the semiconductor layer, the second insulating layer is disposed between the semiconductor layer and the first conductive layer, the third insulating layer is disposed between the first conductive layer and the second conductive layer, the fourth insulating layer is disposed between the second conductive layer and the third conductive layer, and the fifth insulating layer is disposed between the third conductive layer and the fourth conductive layer.

Exemplary description is made below through a process of preparing a display substrate. A "patterning process" mentioned in the present disclosure includes coating with a photoresist, mask exposure, development, etching, photoresist stripping, and other treatments for a metal material, an inorganic material, or a transparent conductive material, and includes coating with an organic material, mask exposure, development, and other treatments for an organic material. Deposition may be any one or more of sputtering, evaporation, and chemical vapor deposition. Coating may be any one or more of spray coating, spin coating, and ink-jet printing. Etching may be any one or more of dry etching and wet etching, which is not limited in present disclosure. A "thin film" refers to a layer of thin film made of a material on a substrate through a process such as depositing, coating, or the like. If the "thin film" does not need a patterning process in an entire preparation process, the "thin film" may also be referred to as a "layer". If the "thin film" needs the patterning process in the entire preparation process, it is referred to as a "thin film" before the patterning process, and referred to as a "layer" after the patterning process. The "layer" which has experienced the patterning process includes at least one "pattern". "A and B being disposed on the same layer" in the present disclosure means that A and B are formed simultaneously through a single patterning process, and a "thickness" of a film layer is the dimension of the film layer in a direction perpendicular to the display substrate. In an exemplary embodiment of the present disclosure, "an orthographic projection of B is within a range of an orthographic projection of A" refers to a boundary of the orthographic projection of B falling within a boundary range of the orthographic projection of A, or the boundary of the orthographic projection of A overlaps with the boundary of the orthographic projection of B.

Figure 7:
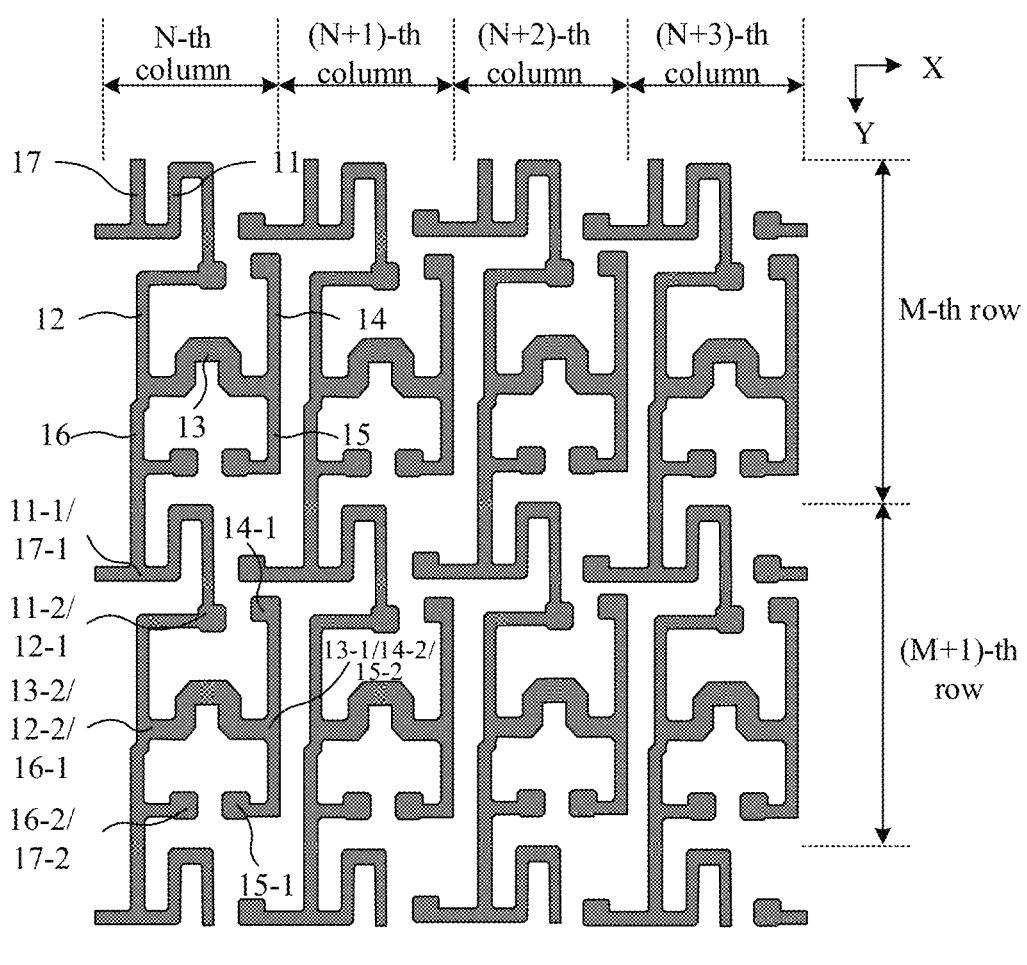
FIG. 7 is a schematic diagram after forming a pattern of a semiconductor layer of a display substrate according to the present disclosure.

In an exemplary implementation, taking eight circuit units (2 unit rows and 4 unit columns) as an example, the preparation process of the drive circuit layer may include the following operations:

(1) A pattern of a semiconductor layer is formed. In an exemplary embodiment, forming of the pattern of the semiconductor layer may include: depositing sequentially a first insulating thin film and a semiconductor thin film on a substrate, and patterning the semiconductor thin film through a patterning process to form a first insulating layer covering the substrate and a semiconductor layer disposed on the first insulating layer, as shown in FIG. 7.

In an exemplary embodiment, the semiconductor layer of each circuit unit may include a first active layer 11 of a first transistor T1 to a seventh active layer 17 of a seventh transistor T7. The first active layer 11 to the seventh active layer 17 are connected with each other in an integrated structure, and in each unit column, a sixth active layer 16 of a circuit unit in a M-th row and a seventh active layer 17 of a circuit unit in a (M+1)-th row are connected with each other, that is, the semiconductor layers of adjacent circuit units in each unit column are connected with each other in an integrated structure.

In an exemplary embodiment, in the circuit unit in the M-th row, a first active layer 11, a second active layer 12, a fourth active layer 14 and a seventh active layer 17 are located at a side of a third active layer 13 of the circuit unit away from the circuit unit in the (M+1)-th row, and the first active layer 11 and the seventh active layer 17 are located at a side of the second active layer 12 and a fourth active layer 14 away from the third active layer 13. In the circuit unit in the M-th row, a fifth active layer 15 and a sixth active layer 16 are located at a side of the third active layer 13 close to the circuit unit in the (M+1)-th row.

In an exemplary embodiment, the first active layer 11 may be in an "n" shape, the second active layer 12 may be in a "7" shape, the third active layer 13 may be in a shape of a Chinese character " 儿 ", the fourth active layer 14 may be in a "1" shape, and the fifth active layer 15, the sixth active layer 16 and the seventh active layer 17 may be in an "L" shape.

In an exemplary embodiment, an active layer of each transistor may include a first region, a second region, and a channel region located between the first region and the second region. In an exemplary embodiment, a first region 11-1 of the first active layer 11 also serves as a first region 17-1 of the seventh active layer 17; a second region 11-2 of the first active layer 11 also serves as a first region 12-1 of the second active layer 12; a first region 13-1 of the third active layer 13 also serves as a second region 14-2 of the fourth active layer 14 and a second region 15-2 of the fifth active layer 15; a second region 13-2 of the third active layer 13 also serves as a second region 12-2 of the second active layer 12 and a first region 16-1 of the sixth active layer 16; a second region 16-2 of the sixth active layer 16 also serves as a second region 17-2 of the seventh active layer 17. In an exemplary embodiment, a first region 14-1 of the fourth active layer 14 and a first region 15-1 of the fifth active layer 15 are disposed separately.

Figure 8A:
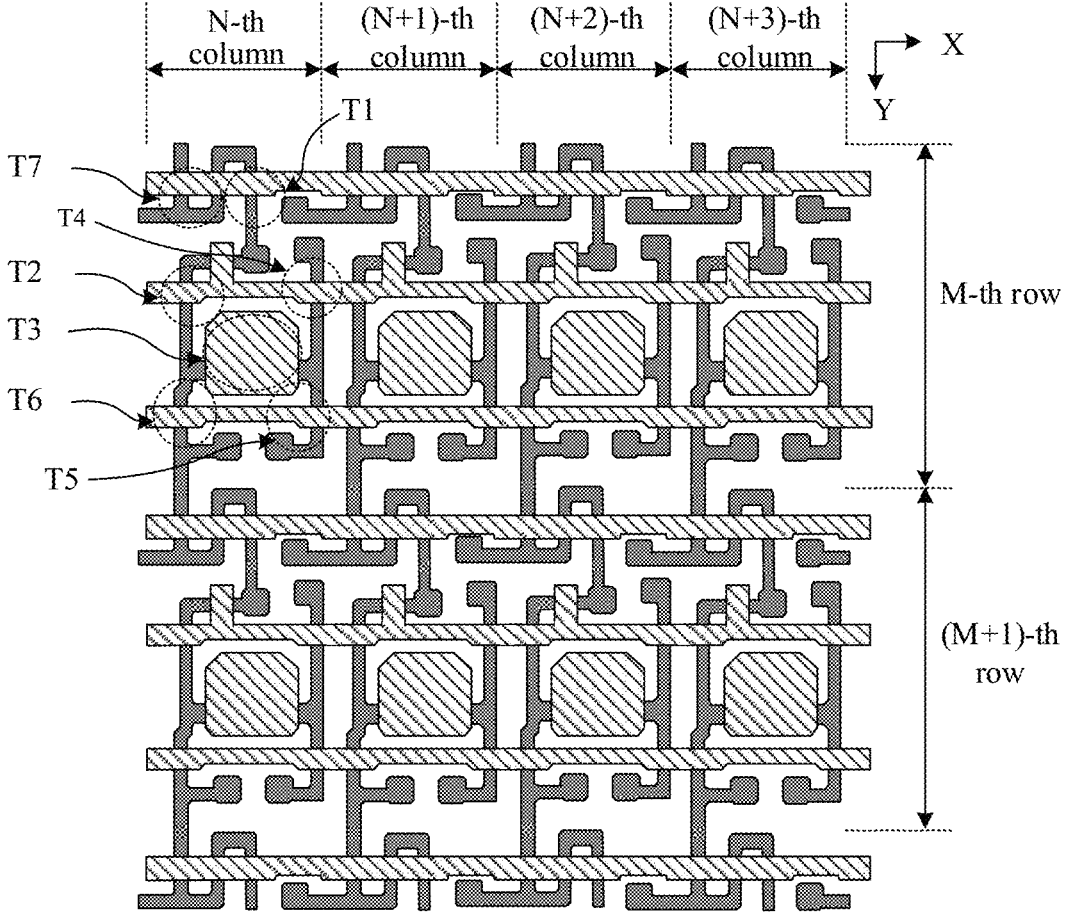
FIG. 8a is a schematic diagram after forming a pattern of a first conductive layer of a display substrate according to the present disclosure.
Figure 8B:
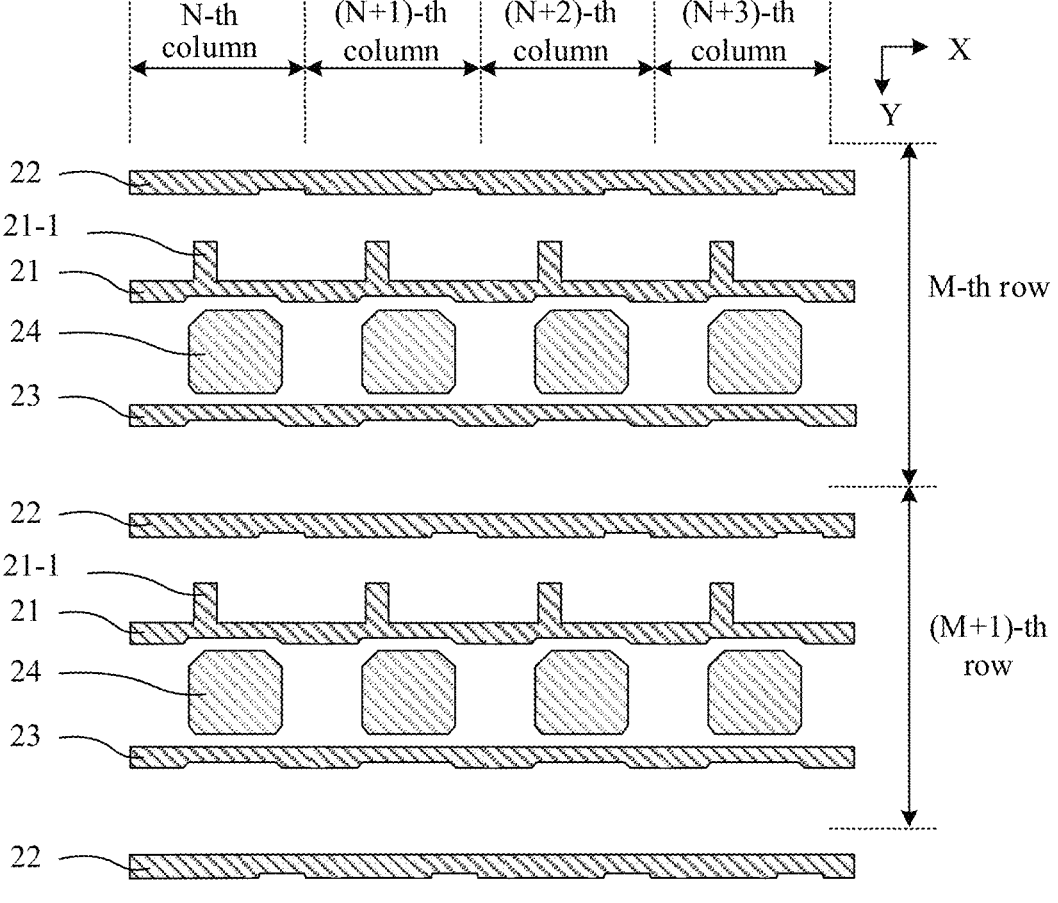

(2) A pattern of a first conductive layer is formed. In an exemplary embodiment, the forming of the pattern of the first conductive layer may include: depositing sequentially a second insulating thin film and a first conductive thin film on the substrate formed with the aforementioned pattern, and patterning the first conductive thin film through a patterning process to form a second insulating layer covering the pattern of the semiconductor layer, and the pattern of the first conductive layer disposed on the second insulating layer. The pattern of the first conductive layer at least includes a first scan signal line 21, a second scan signal line 22, a light emitting control line 23, and a first electrode plate 24, as shown in FIG. 8*a* and FIG. 8*b*, and FIG. 8*b* is a schematic plan view of a first conductive layer in FIG. 8*a*. In an exemplary embodiment, the first conductive layer may be referred to as a first gate metal (GATE 1) layer.

As shown in conjunction with FIG. 7 to FIG. 8*b*, the first scan signal line 21, the second scan signal line 22, and the light emitting control line 23 have body portions extended along a first direction X. In the circuit unit in the M-th row, the first scan signal line 21 and the second scan signal line 22 are located at a side of the first electrode plate 24 of this circuit unit away from the circuit unit in the (M+1)-th row, the second scan signal line 22 is located at a side of the first scan signal line 21 of this circuit unit away from the first electrode plate 24, and the light emitting control line 23 may be located at a side of the first electrode plate 24 of this circuit unit close to the circuit unit in the (M+1)-th row.

In an exemplary embodiment, the first electrode plate 24 may have rectangle shape, corners of which may be set as chamfer. An orthographic projection of the first electrode plate 24 on the substrate and an orthographic projection of the third active layer of the third transistor T3 on the substrate have an overlapping region. In an exemplary embodiment, the first electrode plate 24 may serve as one electrode plate of a storage capacitor and a gate electrode of the third transistor T3 simultaneously.

In an exemplary embodiment, a region where the first scan signal line 21 overlaps with the second active layer 12 serves as a gate electrode of the second transistor T2, the first scan signal line 21 is disposed with a gate block 21-1 protruding to a side of the second scan signal line 22, and an orthographic projection of the gate block 21-1 on the substrate and an orthographic projection of the second active layer 12 on the substrate have an overlapping region to form the second transistor T2 with a double gate structure. A region where the first scan signal line 21 overlaps with the fourth active layer 14 serves as a gate electrode of the fourth transistor T4. A region where the second scan signal line 22 overlaps with the first active layer of the first transistor T1 serves as a gate electrode of the first transistor T1 with a double-gate structure. A region where the second scan signal line 22 overlaps with the seventh active layer of the seventh transistor T7 serves as a gate electrode of the seventh transistor T7. A region where the light emitting control line 23 overlaps with the fifth active layer of the fifth transistor T5 serves as a gate electrode of the fifth transistor T5. A region where the light emitting control line 23 overlaps with the sixth active layer of the sixth transistor T6 serves as a gate electrode of the sixth transistor T6.

In an exemplary embodiment, after the pattern of the first conductive layer is formed, a conductorization treatment may be performed on the semiconductor layer by using the first conductive layer as a shield. A region of the semiconductor layer shielded by the first conductive layer forms channel regions of the first transistor T1 to the seventh transistor T7, and a region of the semiconductor layer not shielded by the first conductive layer is conductorized, that is, first regions and second regions of the first active layer to the seventh active layer are all conductorized.

Figure 9A:
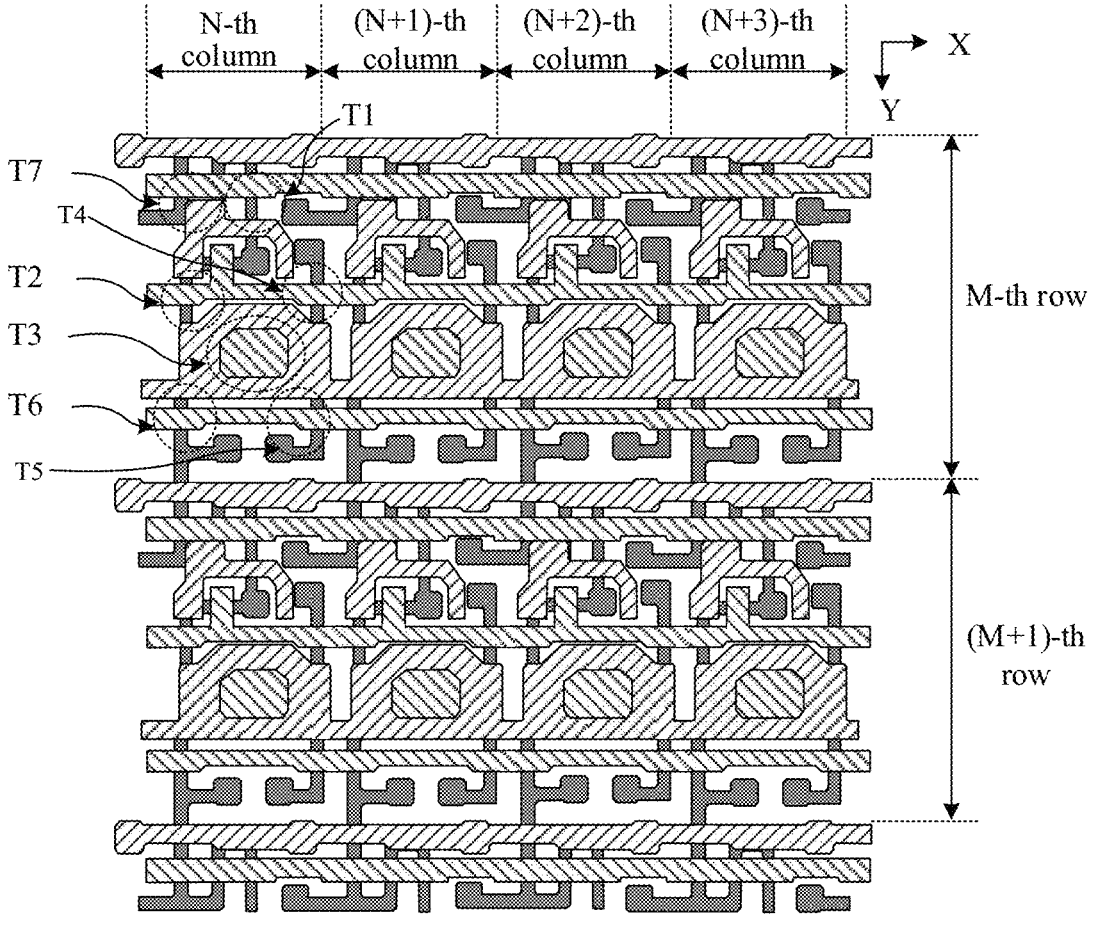
FIG. 9a is a schematic diagram after forming a pattern of a second conductive layer of a display substrate according to the present disclosure.
Figure 9B:
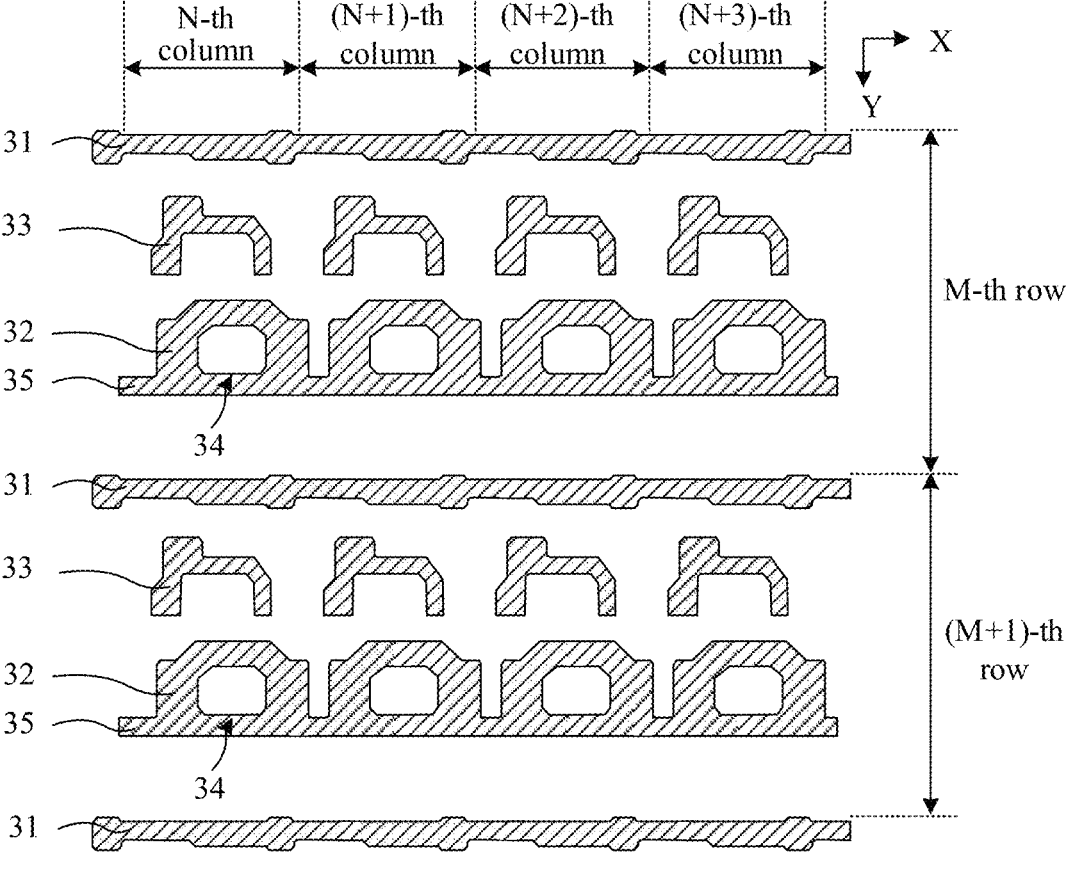

(3) A pattern of a second conductive layer is formed. In an exemplary embodiment, the forming of the pattern of the second conductive layer may include: depositing sequentially a third insulating thin film and a second conductive thin film on the substrate formed with the aforementioned patterns, and patterning the second conductive thin film through a patterning process to form a third insulating layer covering the first conductive layer and the pattern of the second conductive layer disposed on the third insulating layer. The pattern of the second conductive layer at least includes: a first initial signal line 31, a second electrode plate 32, a shield electrode 33, and an electrode plate connection line 35, as shown in FIG. 9*a* and FIG. 9*b*, and FIG. 9*b* is a schematic plan view of a second conductive layer in FIG. 9*a*. In an exemplary embodiment, the second conductive layer may be referred to as a second gate metal (GATE 2) layer.

As shown in conjunction with FIG. 7 to FIG. 9*b*, the first initial signal line 31 may have a body portion extended in the first direction X, the first initial signal line 31 in the circuit unit in the M-th row is located at a side of the second scan signal line 22 of this circuit unit away from the circuit unit in the (M+1)-th row. The second electrode plate 32 serves as another electrode plate of the storage capacitor, is located between the first scan signal line 21 and the light emitting control line 23 of this circuit unit. The shield electrode 33 is located between the second scan signal line 22 and the first scan signal line 21 (excluding the body portion of the gate block 21-1) of this circuit unit. The shield electrode 33 is configured to shield an influence of a data voltage jump on a key node, prevent the data voltage jump from affecting a potential of the key node of the pixel drive circuit, and improve the display effect.

In an exemplary embodiment, an outline of the second electrode plate 32 may be a rectangle shape, corners of which may be set as chamfer. An orthographic projection of the second electrode plate 32 on the substrate and the orthographic projection of the first electrode plate 24 on the substrate have an overlapping region. The first electrode plate 24 and the second electrode plate 32 form the storage capacitor of the pixel drive circuit. The second electrode plate 32 is disposed with an opening 34, and the opening 34 may be located in the middle of the second electrode plate 32. The opening 34 may be rectangular, and the second electrode plate 32 forms an annular structure. The opening 34 exposes the third insulating layer covering the first electrode plate 24, and the orthographic projection of the first electrode plate 24 on the substrate contains an orthographic projection of the opening 34 on the substrate. In an exemplary embodiment, the opening 34 is configured to accommodate a first via formed subsequently, which is located in the opening 34 and exposes the first electrode plate 24, so that a second electrode of a first transistor T1 formed subsequently is connected with the first electrode plate 24.

In an exemplary embodiment, an electrode plate connection line 35 is disposed between second electrode plates 32 of adjacent circuit units in the first direction X or an opposite direction of the first direction X, a first terminal of the electrode plate connection line 35 is connected with the second electrode plate 32 of this circuit unit, and a second terminal of the electrode plate connection line 35 extends along the first direction X or the opposite direction of the first direction X and is connected with a second electrode plate 32 of an adjacent circuit unit, that is, the electrode plate connection line 35 is configured to enable second electrode plates of adjacent circuit units in a unit row to be connected with each other. In an exemplary embodiment, second electrode plates of a plurality of circuit units in a unit row are connected with each other in an integrated structure by the electrode plate connection line 35. The second electrode plates in the integrated structure may be multiplexed as power supply signal lines, which ensures that a plurality of second electrode plates in a unit row have a same potential, is beneficial to improve uniformity of the panel, avoiding a poor display of the display substrate and ensures a display effect of the display substrate.

Figure 10A:
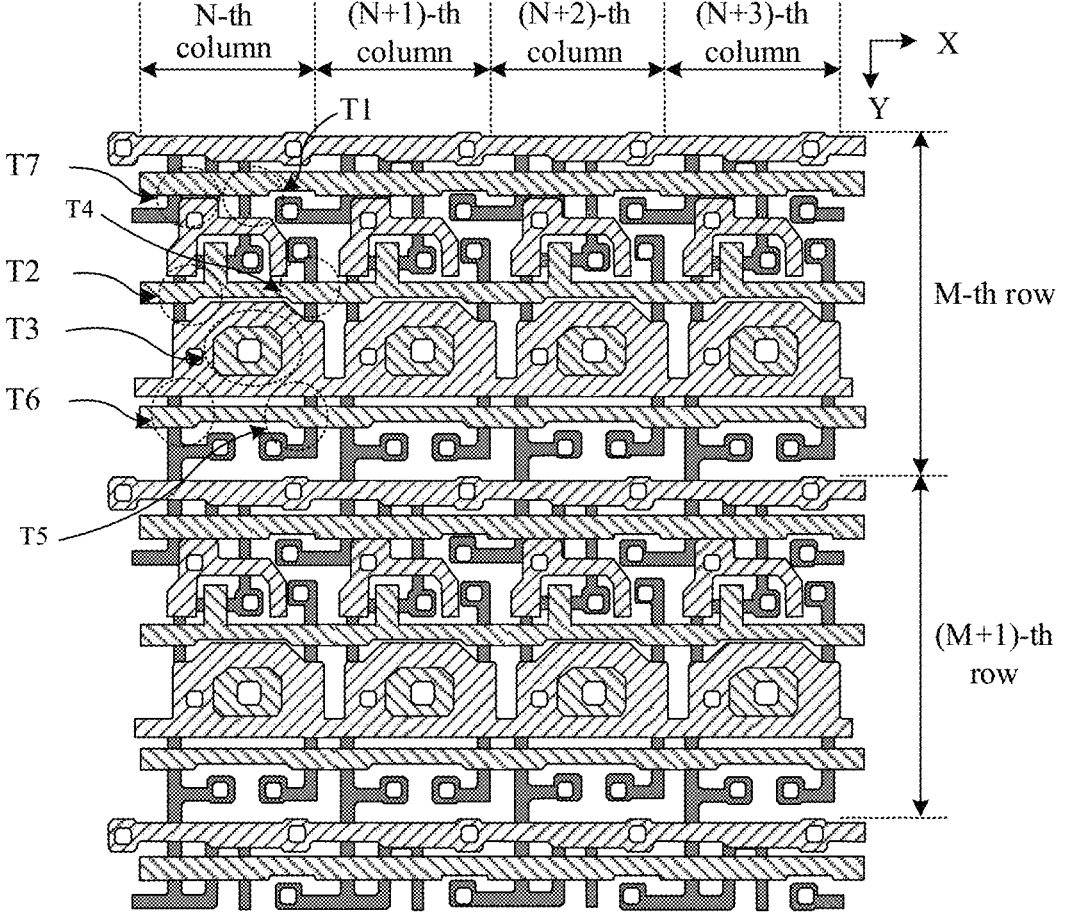
FIG. 10a is a schematic diagram after forming a pattern of a fourth insulating layer of a display substrate according to the present disclosure.
Figure 10B:
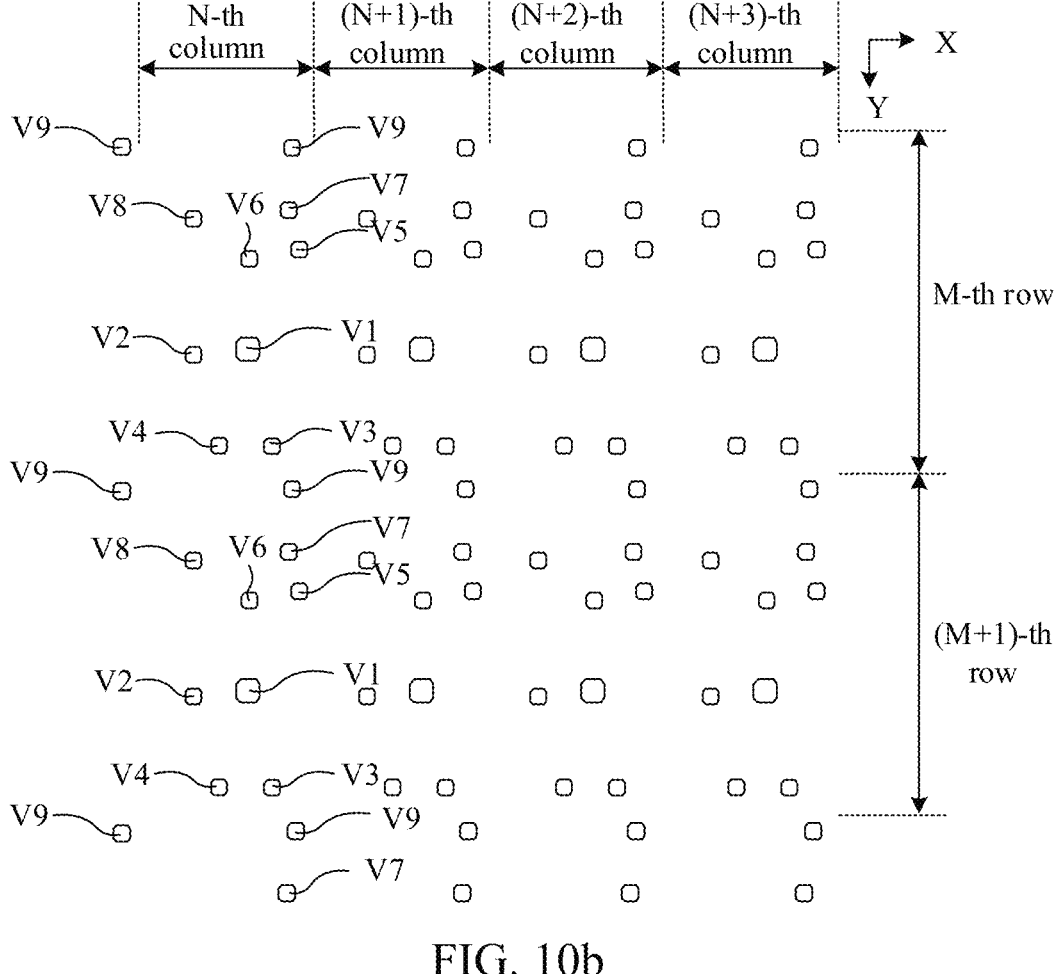

(4) A pattern of a fourth insulating layer is formed. In an exemplary embodiment, the forming of the pattern of the fourth insulating layer may include: depositing a fourth insulating thin film on the substrate formed with the aforementioned patterns, and patterning the fourth insulating thin film through a patterning process to form a fourth insulating layer covering the second conductive layer. Each circuit unit is disposed with a plurality of vias, the plurality of vias at least include: a first via V1, a second via V2, a third via V3, a fourth via V4, a fifth via V5, a sixth via V6, a seventh via V7, an eighth via V8, and a ninth via V9, as shown in FIG. 10a and FIG. 10b, and FIG. 10b is a schematic plan view of a plurality of vias in FIG. 10a.

As shown in conjunction with FIG. 7 to FIG. 10b, the first via V1 is located in the opening 34 of the second electrode plate 32, and an orthographic projection of the first via V1 on the substrate is located within a range of an orthographic projection of the opening 34 on the substrate. The fourth insulating layer and the third insulating layer in the first via V1 are etched off to expose a surface of the first electrode plate 24. The first via V1 is configured such that a second electrode of the first transistor T1 formed subsequently is connected with the first electrode plate 24 through this via.

In an exemplary embodiment, the second via V2 is located within a range of the orthographic projection of the second electrode plate 32 on the substrate, and an orthographic projection of the second via V2 on the substrate is located within a range of the orthographic projection of the second electrode plate 32 on the substrate. The fourth insulating layer in the second via V2 is etched off to expose a surface of the second electrode plate 32. The second via V2 is configured such that a first power supply line formed subsequently is connected with the second electrode plate 32 through this via. In an exemplary embodiment, the second via V2 as a power supply via may be plural, and the plurality of second vias V2 may be sequentially arranged along the second direction Y, thereby increasing the connection reliability between the first power supply line and the second electrode plate 32.

In an exemplary embodiment, an orthographic projection of the third via V3 on the substrate is located within a range of an orthographic projection of the fifth active layer on the substrate, and the fourth insulating layer, the third insulating layer and the second insulating layer in the third via V3 are etched off to expose a surface of a first region of the fifth active layer. The third via V3 is configured such that the first power supply line formed subsequently is connected with the fifth active layer through this via.

In an exemplary embodiment, an orthographic projection of the fourth via V4 on the substrate is located within a range of an orthographic projection of the sixth active layer on the substrate, and the fourth insulating layer, the third insulating layer, and the second insulating layer in the fourth via V4 are etched off to expose a surface of a second region of the sixth active layer (which is also a second region of the seventh active layer). The fourth via V4 is configured such that a second electrode of a sixth transistor T6 formed subsequently is connected with the sixth active layer through this via, and a second electrode of a seventh transistor T7 formed subsequently is connected with the seventh active layer through this via.

In an exemplary embodiment, an orthographic projection of the fifth via V5 on the substrate is located within a range of an orthographic projection of the fourth active layer on the substrate, and the fourth insulating layer, the third insulation layer, and second insulating layers in the fifth via V5 are etched off to expose a surface of a first region of the fourth active layer. The fifth via V5 is configured such that a data signal line formed subsequently is connected with the fourth active layer through this via, the fifth via V5 is referred to as a data write hole.

In an exemplary embodiment, an orthographic projection of the sixth via V6 on the substrate is located within a range of an orthographic projection of the second active layer on the substrate, and the fourth insulating layer, the third insulating layer, and the second insulating layer in the sixth via V6 are etched off to expose a surface of a first region of the second active layer (which is also a second region of the first active layer). The sixth via V6 is configured such that the second electrode of the first transistor T1 formed subsequently is connected with the first active layer through this via and a first electrode of the second transistor T2 formed subsequently is connected with the second active layer through this via.

In an exemplary embodiment, an orthographic projection of the seventh via V7 on the substrate is located within a range of an orthographic projection of the seventh active layer on the substrate, and the fourth insulating layer, the third insulating layer, and the second insulating layer in the seventh via V7 are etched off to expose a surface of a first region of the seventh active layer (which is also a first region of the first active layer). The seventh via V7 is configured such that a first electrode of the seventh transistor T7 formed subsequently is connected with the seventh active layer through this via and the first electrode of the first transistor T1 formed subsequently is connected with the first active layer through this via.

In an exemplary embodiment, an orthographic projection of the eighth via V8 on the substrate is located within a range of an orthographic projection of the shield electrode 33 on the substrate, and the fourth insulating layer in the eighth via V8 is etched off to expose a surface of the shield electrode 33. The eighth via V8 is configured such that the first power supply line formed subsequently is connected with the shield electrode 33 through this via.

In an exemplary embodiment, an orthographic projection of the ninth via V9 on the substrate is located within a range of an orthographic projection of the first initial signal line 31 on the substrate, and the fourth insulating layer in the second via V9 is etched off to expose a surface of the first initial signal line 31. The ninth via V9 is configured such that the first electrode of the seventh transistor T7 (which is also the first electrode of the first transistor T1) formed subsequently is connected with the first initial signal line 31 through this via.

Figure 11A:
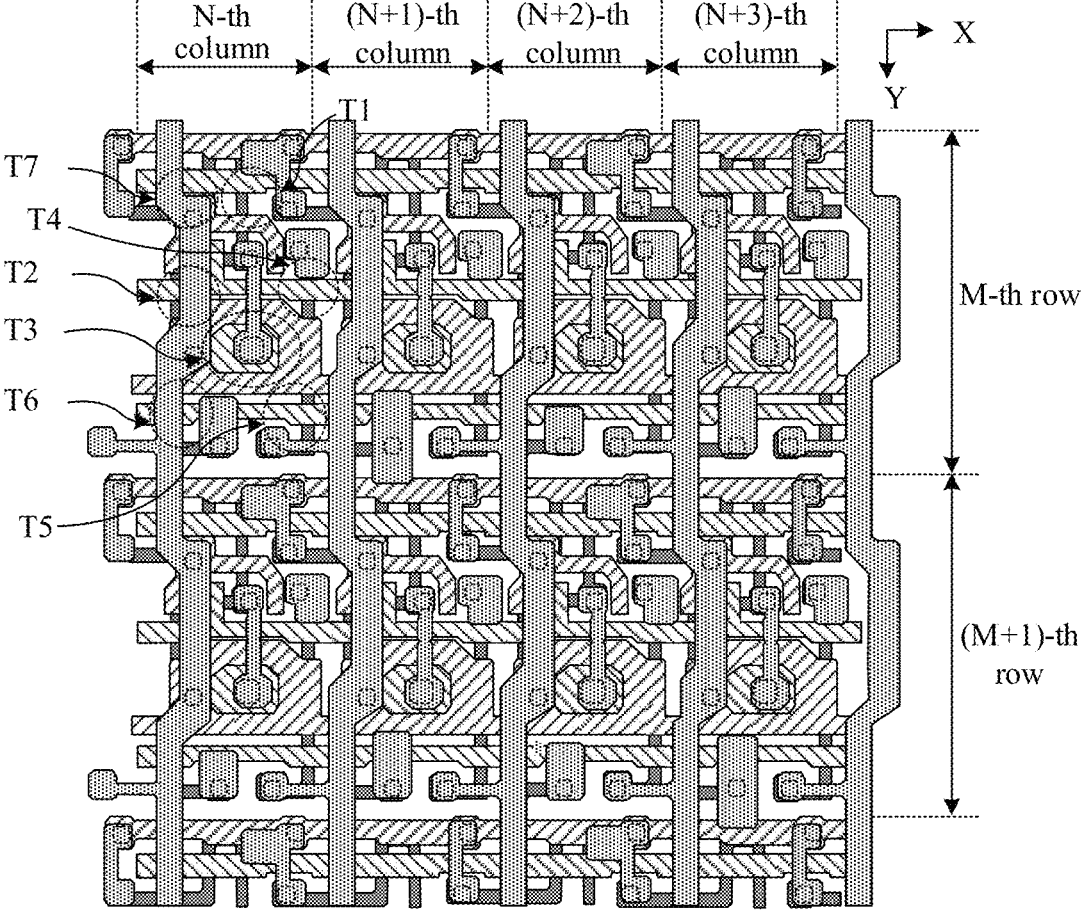
FIG. 11a is a schematic diagram after forming a pattern of a third conductive layer of a display substrate according to the present disclosure.
Figure 11B:
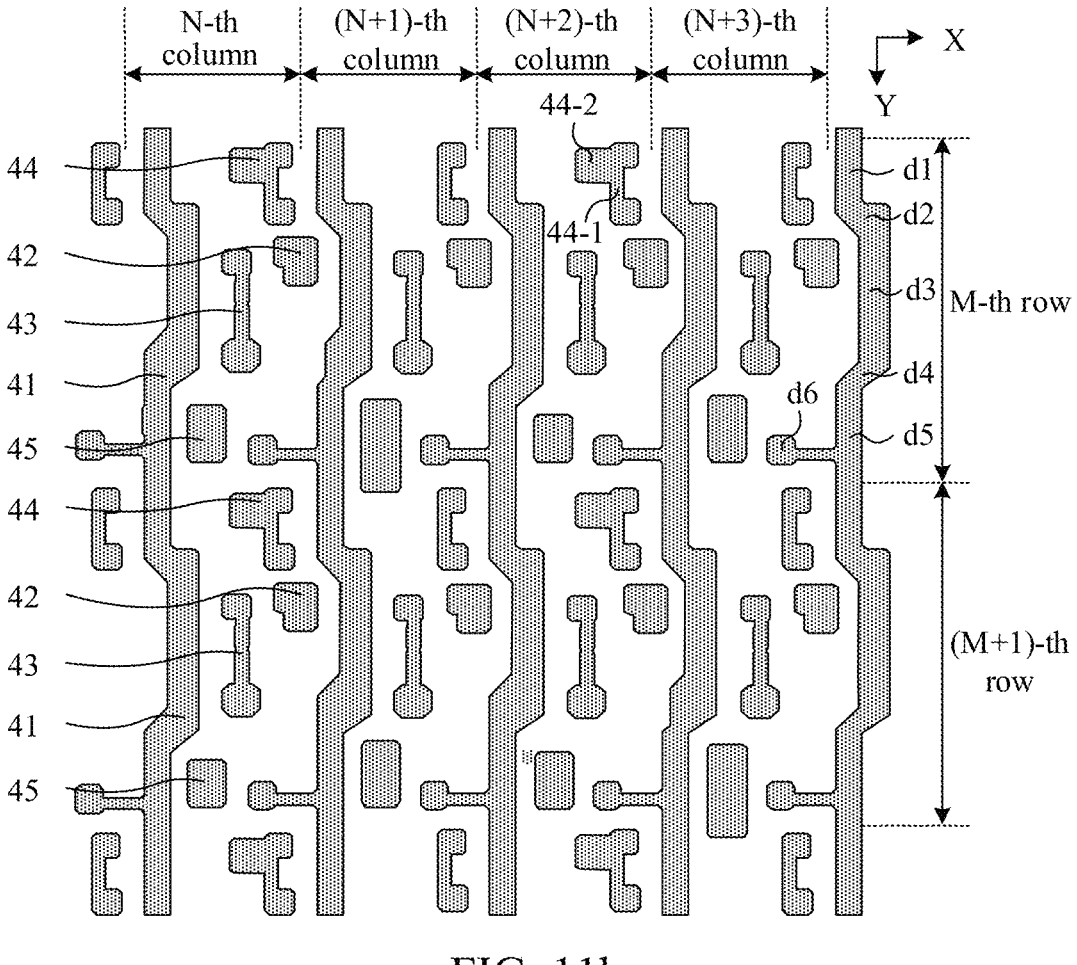

(5) A pattern of a third conductive layer is formed. In an exemplary embodiment, forming of the third conductive layer may include: depositing a third conductive thin film on the substrate formed with the aforementioned patterns, and patterning the third conductive thin film through a patterning process to form the third conductive layer disposed on the fourth insulating layer. The third conductive layer at least includes: a first power supply line 41, a data connection electrode 42, a first connection electrode 43, a second connection electrode 44, and a third connection electrode 45, as shown in FIG. 11a and FIG. 11b, and FIG. 11b is a schematic plan view of a third conductive layer in FIG. 11a. In an exemplary embodiment, the third conductive layer may be referred to as a first source-drain metal (SD1) layer.

As shown in conjunction with FIG. 7 to FIG. 11b, the first power supply line 41 has a body portion extended in the second direction Y. On the one hand, the first power supply line 41 is connected with the second electrode plate 32 through the second via V2, and on the other hand, the first power supply line 41 is connected with the fifth active layer through the third via V3, and on yet the other hand, is connected with the shield electrode 33 through the eighth via V8, so that the shield electrode 33 and the second electrode plate 32 have the same potential as the first power supply line 41. Because the shield electrode 33 is connected with the first power supply line 41, and an orthographic projection of at least partial region of the shield electrode 33 (for example a protrusion on a right side of the shield electrode 33) on the substrate is located between an orthographic projection of the first connection electrode 43 (as the second electrode of the first transistor T1 and the first electrode of the second transistor T2, i.e. the second node N2) on the substrate and an orthographic projection of a data signal line formed subsequently on the substrate, which may effectively shield the influence of data voltage jump on the key node of the pixel drive circuit, avoid the influence of data voltage jump on the potential of the key node of the pixel drive circuit, and improve the display effect.

In an exemplary embodiment, an orthographic projection of at least partial region of the shield electrode 33 on the substrate may at least partially overlaps with an orthographic projection of the data signal line formed subsequently on the substrate. In an exemplary embodiment, shield electrodes 33 in adjacent circuit units in the first direction X may be connected with each other to reduce resistance.

In an exemplary embodiment, the data connection electrode 42 is connected with a first region of the fourth active layer through the fifth via V5 and is configured to be connected with the data signal line formed subsequently.

In an exemplary embodiment, the first connection electrode 43 extends in the second direction Y. The first connection electrode has a first terminal connected with the second region of the first active layer (which is also the first region of the second active layer) through the sixth via V6, and a second terminal connected with the first electrode plate 24 through the first via V1, so that the first electrode plate 24, the second electrode of the first transistor T1 and the first electrode of the second transistor T2 have the same potential. In an exemplary embodiment, the first connection electrode 43 may be used as the second electrode of the first transistor T1 and the first electrode of the second transistor T2.

In an exemplary embodiment, the second connection electrode 44 has a first terminal connected with the first initial signal line 31 through the ninth via V9, and a second terminal connected with the first region of the seventh active layer (which is also the first region of the first active layer) through the seventh via V7, so that the first electrode of the seventh transistor T7 and the first electrode of the first transistor T1 have the same potential as the first initial signal line 31. In an exemplary embodiment, the second connection electrode 44 may serve as the first electrode of the seventh transistor T7 and the first electrode of the first transistor T1, and the second connection electrode 44 is configured to be connected with a second initial signal line formed subsequently. In the present disclosure, the second connection electrode is set to be connected with the seventh active layer, the first initial signal line and the second initial signal line at the same time, which may reduce a quantity of vias and a quantity of transfer electrodes and save the wiring space.

In an exemplary embodiment, a third connection electrode 45 is connected with the second region of the sixth active layer (which is also the second region of the seventh active layer) through the fourth via V4, so that the second electrode of the sixth transistor T6 and the second electrode of the seventh transistor T7 have the same potential. In an exemplary embodiment, the third connection electrode 45 may be used as the second electrode of the sixth transistor T6 and the second electrode of the seventh transistor T7. In an exemplary embodiment, the third connection electrode 45 is configured to be connected with an anode connection electrode formed subsequently.

In an exemplary embodiment, the first power supply line 41 of at least one circuit unit may be a polyline of non-equal width. Along the second direction Y, the first power supply line 41 of each circuit unit may include a first power supply portion d1, a second power supply portion d2, a third power supply portion d3, a fourth power supply portion d4, and a fifth power supply portion d5 which are connected sequentially. The first power supply portion d1, the third power supply portion d3, and the fifth power supply portion d5 may be parallel to the second direction Y, the second power supply portion d2 may be bent toward the first direction X, and the fourth power supply portion d4 may be bent toward an opposite direction of the first direction X. An included angle between the second power supply portion d2 and the first power supply portion d1 may be greater than 0° and less than 90°. An included angle between the fourth power supply portion d4 and the third power supply portion d3 may be greater than 0° and less than 90°. The fifth power supply portion d5 is disposed with a connection portion d6 extending toward the opposite direction of the first direction X, and the connection portion d6 is configured to be connected with the fifth active layer by the third via. The first power supply line 41 is set as bended line, which not only may facilitate a layout of the pixel structures, but also may reduce parasitic capacitance between the first power supply line and the data signal line.

In an exemplary embodiment, the first power supply line of each circuit unit may have the same or different shape. In an exemplary embodiment, a first power supply line in a circuit unit in a M-th row and an N-th column may have the same shape as a first power supply line in a circuit unit in a (M+1)-th row and an (N+2)-th column, a first power supply line in a circuit unit in the (M+1)-th row and the N-th column may have the same shape as a first power supply line in the circuit unit in the M-th row and the (N+2)-th column, a first power supply line in a circuit unit in the M-th row and an (N+1)-th column may have the same shape as a first power supply line in a circuit unit in the (M+1)-th row and an (N+3) column, and a first power supply line in a circuit unit in the (M+1)-th row and the (N+1) column may have the same shape as a first power supply line in a circuit unit in the M-th row and the (N+3)-th column.

In an exemplary embodiment, the second connection electrode in each circuit unit in the N-th column may have the same shape as the second connection electrode in each circuit unit in the (N+2)-th column, and the second connection electrode in each circuit unit in the (N+1)-th column may have the same shape as the second connection electrode in each circuit unit in the (N+3)-th column. Second connection electrodes in circuit units in the (N+1)-th column and the (N+3)-th column may have shapes extending along the second direction Y, and the second connection electrodes are configured to be connected with the first initial signal line and the first region of the seventh active layer through the ninth via and the seventh via, respectively. Second connection electrodes 44 in circuit units in the N-th column and the (N+2)-th column may include a first portion 44-1 and a second portion 44-2 connected with each other. The first portion 44-1 has a strip shape extending in the second direction Y, the second portion 44-2 may have a rectangular shape. The second portion 44-2 is disposed at a side of the first portion 44-1 in the opposite direction of the first direction X. The first portion 44-1 is configured to be connected with the first initial signal line and the first region of the seventh active layer through the ninth via and the seventh via, respectively, and the second portion 44-2 is configured to be connected with the second initial signal line formed subsequently through the via formed subsequently, thereby achieving the connection between the first initial signal line and the second initial signal line.

In an exemplary embodiment, the third connection electrode in each circuit unit may have the same or different shape. In an exemplary embodiment, a third connection electrode in the circuit unit in the M-th row and the N-th column may have the same shape as a third connection electrode in the circuit unit in the (M+1)-th row and the (N+2)-th column, a third connection electrode in the circuit unit in the (M+1)-th row and the N-th column may have the same shape as a third connection electrode in the circuit unit in the M-th row and the (N+2)-th column, a third connection electrode in the circuit unit in the M-th row and the (N+1)-th column may be the same as the shape of the third connection electrode in the circuit unit in (M+1)-th row and the (N+3)-th column, and a third connection electrode in the circuit unit in the (M+1)-th row and (N+1)-th column may have the same shape as a third connection electrode in the circuit unit in the M-th row and the (N+3)-th column.

In an exemplary embodiment, the data connection electrode and the first connection electrode of each circuit unit may have the same or different shape.

Figure 12A:
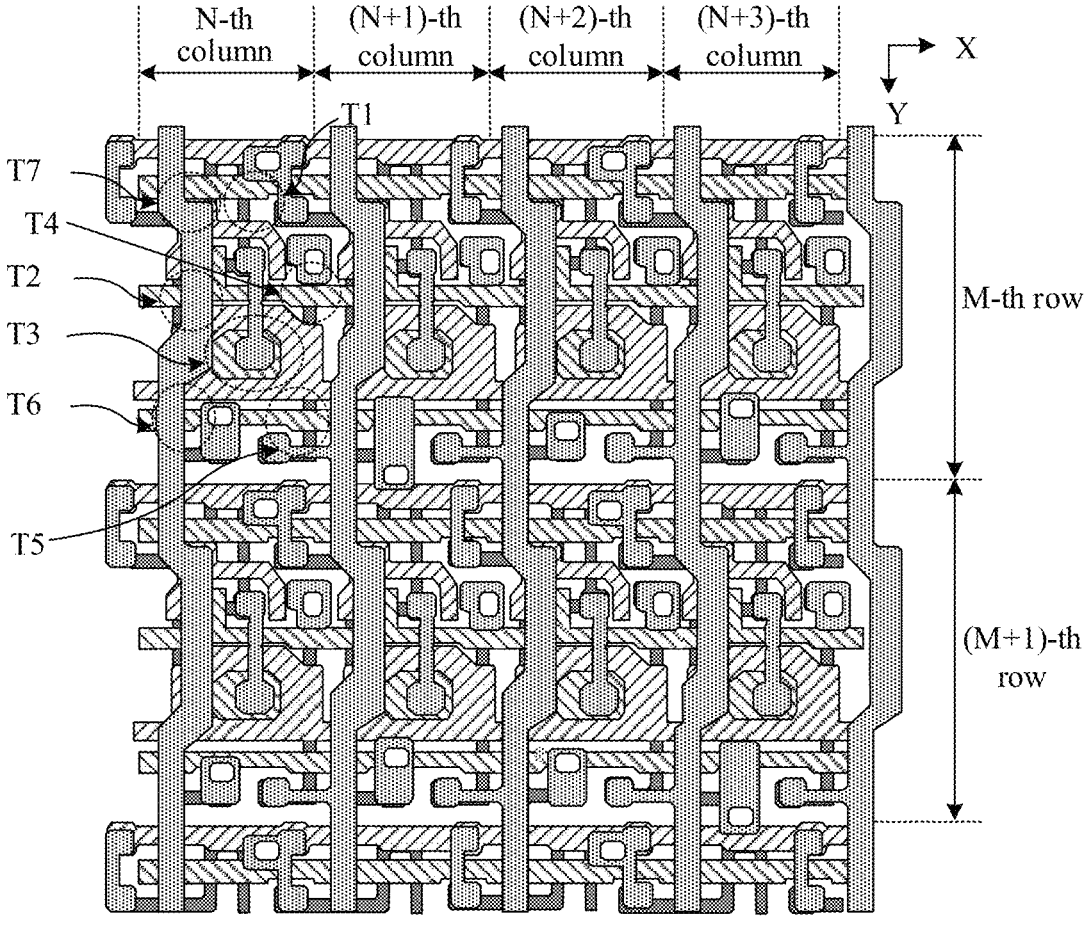
FIG. 12a is a schematic diagram after forming a pattern of a first planarization layer of a display substrate according to the present disclosure.
Figure 12B:
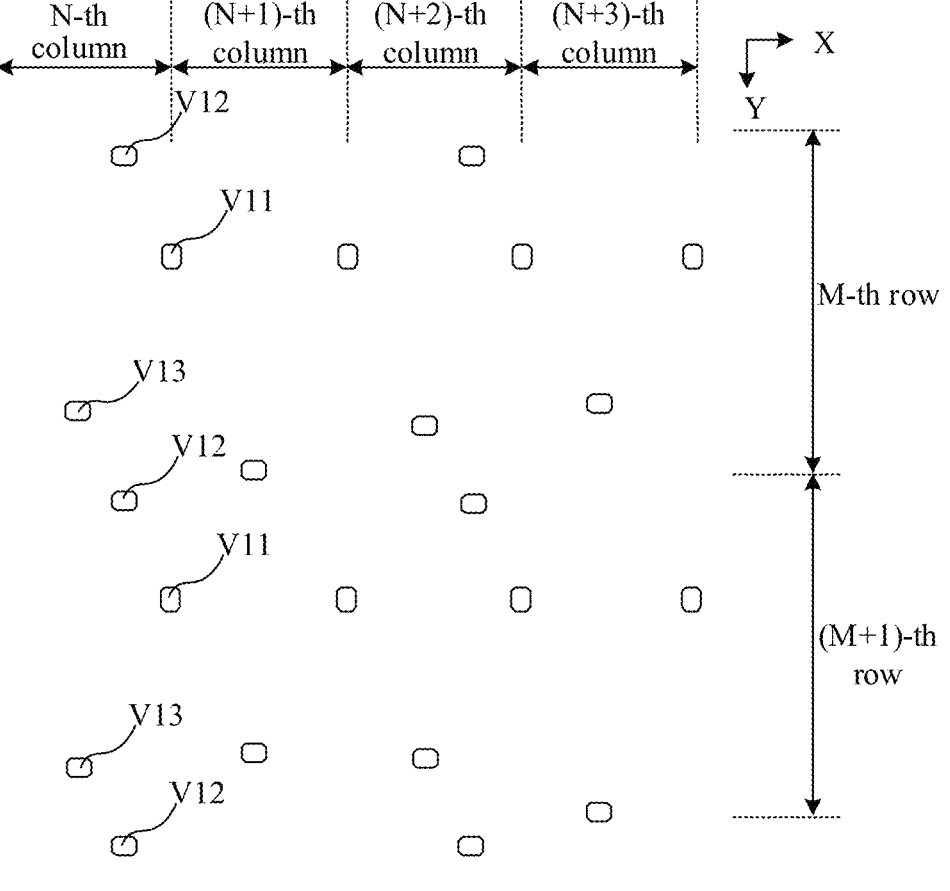

(6) A pattern of a first planarization layer is formed. In an exemplary embodiment, forming of the pattern of the first planarization layer may include: coating a first planarization thin film on the substrate formed with the aforementioned patterns, and patterning the first planarization thin film through a patterning process to form the first planarization layer covering the third conductive layer. The first planarization layer is disposed with an eleventh via V11, a twelfth via V12 and a thirteenth via V13, as shown in FIG. 12a and FIG. 12b, and FIG. 12b is a schematic plan view of a plurality of vias in FIG. 12a.

As shown in conjunction with FIG. 7 to FIG. 12b, an orthographic projection of the eleventh via V11 on the substrate is located within a range of an orthographic projection of the data connection electrode 42 on the substrate, the first planarization layer in the eleventh via V11 is removed to expose a surface of the data connection electrode 42, and the eleventh via V11 is configured such that the data signal line formed subsequently is connected with the data connection electrode 42 through this via.

In an exemplary embodiment, the eleventh via V11 may be a strip shape, in the eleventh via V11, an extension length of the eleventh via V11 in the second direction Y is greater than an extension length of the eleventh via V11 in the first direction X. In the present disclosure, the eleventh via V11 is set as the strip shape extending along the second direction Y, which may reduce a width of the eleventh via V11 in the first direction X, and may reduce an inclination degree of an anode formed subsequently.

An orthographic projection of the twelfth via V12 on the substrate is within a range of an orthographic projection of the second connection electrode 44 on the substrate, the first planarization layer in the twelfth via V12 is removed to expose the surface of the second connection electrode 44, and the twelfth via V12 is configured such that the second initial signal line formed subsequently is connected with the second connection electrode 44 through this via.

An orthographic projection of the thirteenth via V13 on the substrate is located within a range of an orthographic projection of the third connection electrode 45 on the substrate, the first planarization layer in the thirteenth via V13 is removed to expose the surface of the third connection electrode 45, and the thirteenth via V13 is configured such that the anode connection electrode formed subsequently is connected with the third connection electrode 45 through this via.

In an exemplary embodiment, all circuit units are disposed with the eleventh via V11 and the thirteenth via V13, the twelfth via V12 is disposed in each circuit unit in the N-th column and the (N+2)-th column, and no twelfth via V12 is disposed in each circuit unit in the (N+1)-th column and the (N+3)-th column.

In an exemplary embodiment, the eleventh via V11 and the thirteenth via V13 in each circuit unit may have the same or different shape.

Figure 13A:
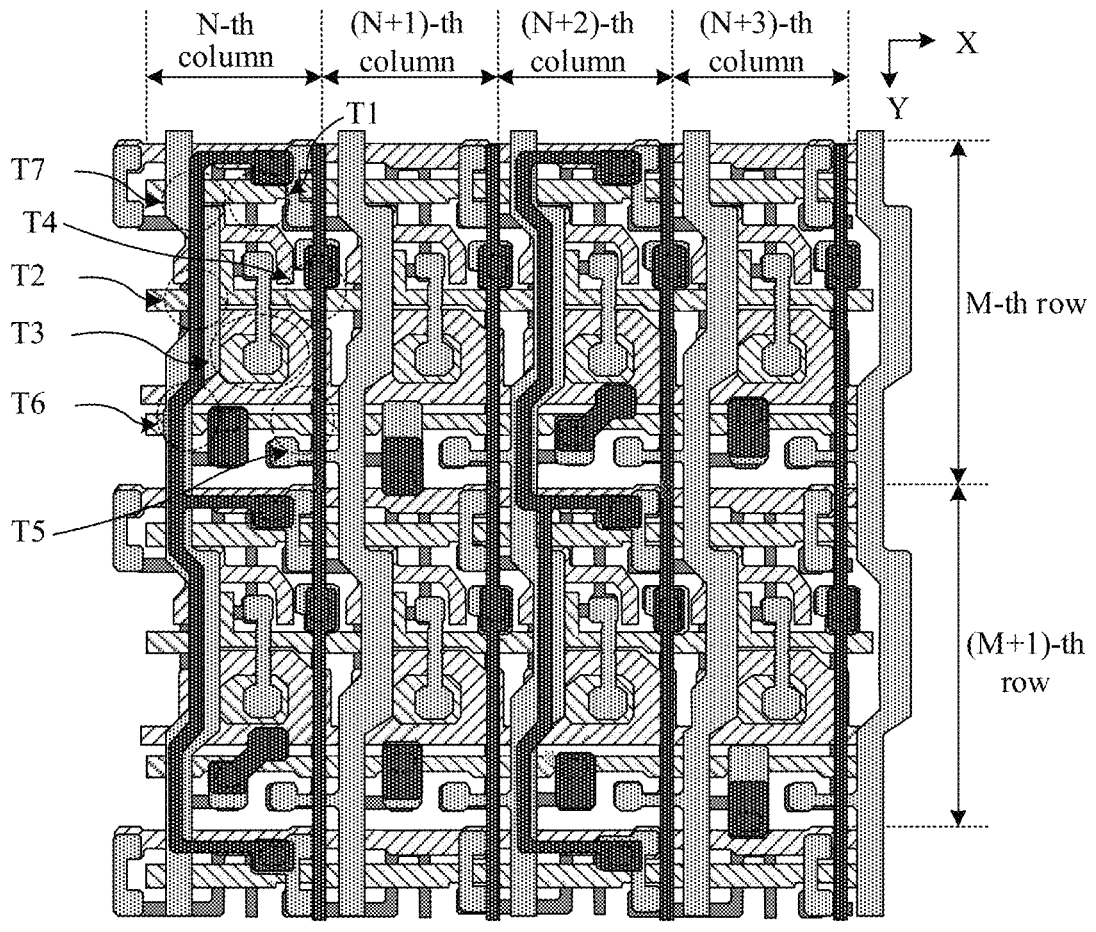
FIG. 13a is a schematic diagram after forming a pattern of a fourth conductive layer of a display substrate according to the present disclosure.
Figure 13B:
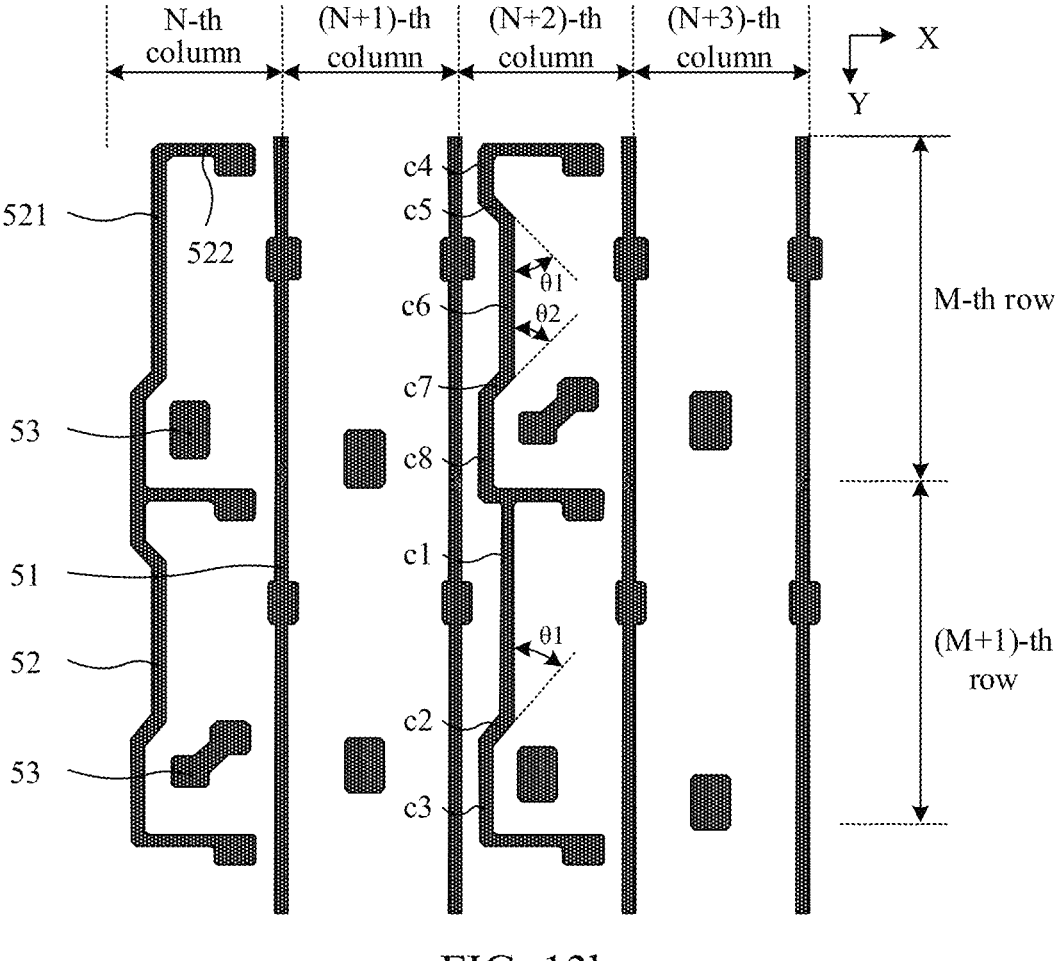

(7) A pattern of a fourth conductive layer is formed. In an exemplary embodiment, forming of the fourth conductive layer may include: depositing a fourth conductive thin film on the substrate formed with the aforementioned patterns, and patterning the fourth conductive thin film through a patterning process to form the fourth conductive layer disposed on the first planarization layer. The fourth conductive layer at least includes: a data signal line 51, a second initial signal line 52 and an anode connection electrode 53, as shown in FIG. 13*a* and FIG. 13*b*, and FIG. 13*b* is a schematic plan view of a fourth conductive layer in FIG. 13*a*.

As shown in conjunction with FIG. 7 to FIG. 13*b*, the data signal line 51 is disposed in each unit column. The data signal line 51 may extend in the second direction Y, and the data signal line 51 is connected with the data connection electrode 42 through the eleventh via V11. Because the data connection electrode 42 is connected with the first region of the fourth active layer through the fifth via V5, thus, it is achieved that the data signal line 51 is connected with the first region of the fourth active layer through the data connection electrode 42, so that a data signal is written into the fourth transistor T4.

In an exemplary embodiment, the second initial signal line 52 is disposed in the N-th unit column and the (N+2)-th unit column in which the second initial signal lines 52 of circuit units are connected with each other. The second initial signal line 52 has a body portion extended along the second direction Y, and the second initial signal line 52 is connected with the second connection electrode 44 through the twelfth via V12. Because the second connection electrode 44 is connected with the first initial signal line 31 through the ninth via V9, thus it is achieved that the second initial signal line 52 is connected with the first initial signal line 31 through the second connection electrode 44, so that the first initial signal line 31 and the second initial signal line 52 have the same potential. In the present disclosure, the first initial signal line 31 having the body portion extended in the first direction X and the second initial signal line 52 having the body portion extended in the second direction Y are disposed, so that the initial signal lines forms a grid structure, which not only effectively reduces the resistance of the initial signal lines and a voltage drop of an initial voltage, but also effectively improves the uniformity of the initial voltage in the display substrate, effectively improves the display uniformity, and improves the display quality.

In an exemplary embodiment, the anode connection electrode 53 is disposed in at least part of the circuit unit. The anode connection electrode 53 is connected with the third connection electrode 45 through a thirteenth via V13. Because the third connection electrode 45 is connected with the second region of the sixth active layer (which is also the second region of the seventh active layer) through the fourth via V4, thus it is achieved that the anode connection electrode 53 is connected with the second region of the sixth active layer (which is also the second region of the seventh active layer) through the third connection electrode 45.

In an exemplary embodiment, the second initial signal line 52 in one circuit unit may include an extension portion 521 and a connection portion 522. The extension portion 521 may be a bent line having a body portion extended along the second direction Y and the connection portion 522 may be a straight line having a body portion extended along the first direction X. In an exemplary embodiment, an end of a side of the connection portion 522 away from the extension portion 521 may be connected with the second connection electrode 44 through the twelfth via V12.

In an exemplary embodiment, an orthographic projection of at least part of the extension portion 521 on the substrate is within the range of the orthographic projection of the first power supply line 41 on the substrate, which not only may make the first power supply line 41 effectively shield the influence of the second initial signal line 52 on the key node in the pixel drive circuit and prevent the initial signal from affecting the potential of the key node in the pixel drive circuit, but also may fully utilize a layout space to avoid influence of disposition of the second initial signal line on light transmittance and improve the display effect.

In an exemplary embodiment, an orthographic projection of at least part of the connection portion 522 on the substrate is within the range of the orthographic projection of the first initial signal line 31 on the substrate, which may fully utilize the layout space to avoid influence of disposition of the second initial signal line on light transmittance and improve the display effect.

In an exemplary embodiment, the second initial signal line 52 in the circuit unit in the M-th row and the N-th column may have the same shape as the second initial signal line 52 in the circuit unit in the (M+1)-th row and the (N+2)-th column, and the second initial signal line 52 in the circuit unit in the (M+1)-th row and the N-th column may have the same shape as the second initial signal line 52 in the circuit unit in the M-th row and the (N+2)-th column.

In an exemplary embodiment, in the circuit unit in the M-th row and the N-th column and the circuit unit in the (M+1)-th row and the (N+2)-th column, the extension portion 521 may include a first initial portion c1, a second initial portion c2, and a third initial portion c3 which are connected sequentially along the second direction Y, the first initial portion c1 and the third initial portion c3 may be parallel to the second direction Y, the second initial portion c2 may be deflected toward the opposite direction of the first direction X, the second initial portion c2 has a first included angle $\theta 1$ with the second direction Y, and the first included angle $\theta 1$ may be greater than 0°, less than 90°.

In an exemplary embodiment, in the circuit unit in the M-th row and the (N+2)-th column and the circuit unit in the (M+1)-th row and the N-th column, the extension portion 521 may include a fourth initial portion c4, a fifth initial portion c5, a sixth initial portion c6, a seventh initial portion c7, and an eighth initial portion c8 connected sequentially along the second direction Y. The fourth initial portion c4, the sixth initial portion c6, and the eighth initial portion c8 may be parallel to the second direction Y, the fifth initial portion c5 may have a first included angle $\theta 1$ with the second direction Y, the seventh initial portion c7 may have a second included angle $\theta 2$ with the second direction Y, and the first included angle $\theta 1$ may be greater than 0°, less than 90°. The second included angle $\theta 2$ may be greater than 0°, less than 90°.

In an exemplary embodiment, an extension direction of the fifth initial portion c5 and an extension direction of the seventh initial portion c7 may be mirrored symmetrically with respect to the first direction X.

In an exemplary embodiment, at least part of the circuit units is disposed with the data signal line 51 and the anode connection electrode 53, each circuit unit in the N-th column and the (N+2)-th column is disposed with the second initial signal line 52, and each circuit unit in the (N+1)-th and the (N+3)-th column is not disposed with the second initial signal line 52.

In an exemplary embodiment, an anode connection electrode in the circuit unit in the M-th row and the N-th column may have the same shape as an anode connection electrode in the circuit unit in the (M+1)-th row and the (N+2)-th column, and the anode connection electrode may be a rectangular shape. An anode connection electrode in the circuit unit in the (M+1)-th row and the N-th column may have the same shape as an anode connection electrode in the circuit unit in the M-th row and the (N+2)-th column, and the anode connection electrode may have a dumbbell shape. An anode connection electrode in the circuit unit in the M-th row and the (N+1)-th column may have the same shape as an anode connection electrode in the circuit unit in the (M+1)-th row and the (N+3) column, and the anode connection electrode may be a rectangular shape. An anode connection electrode in the circuit unit in the (M+1)-th row and the (N+1)-th column may have the same shape as an anode connection electrode in the circuit unit in the M-th row and the (N+3)-th column, and the anode connection electrode may have rectangular shape.

Figure 14A:
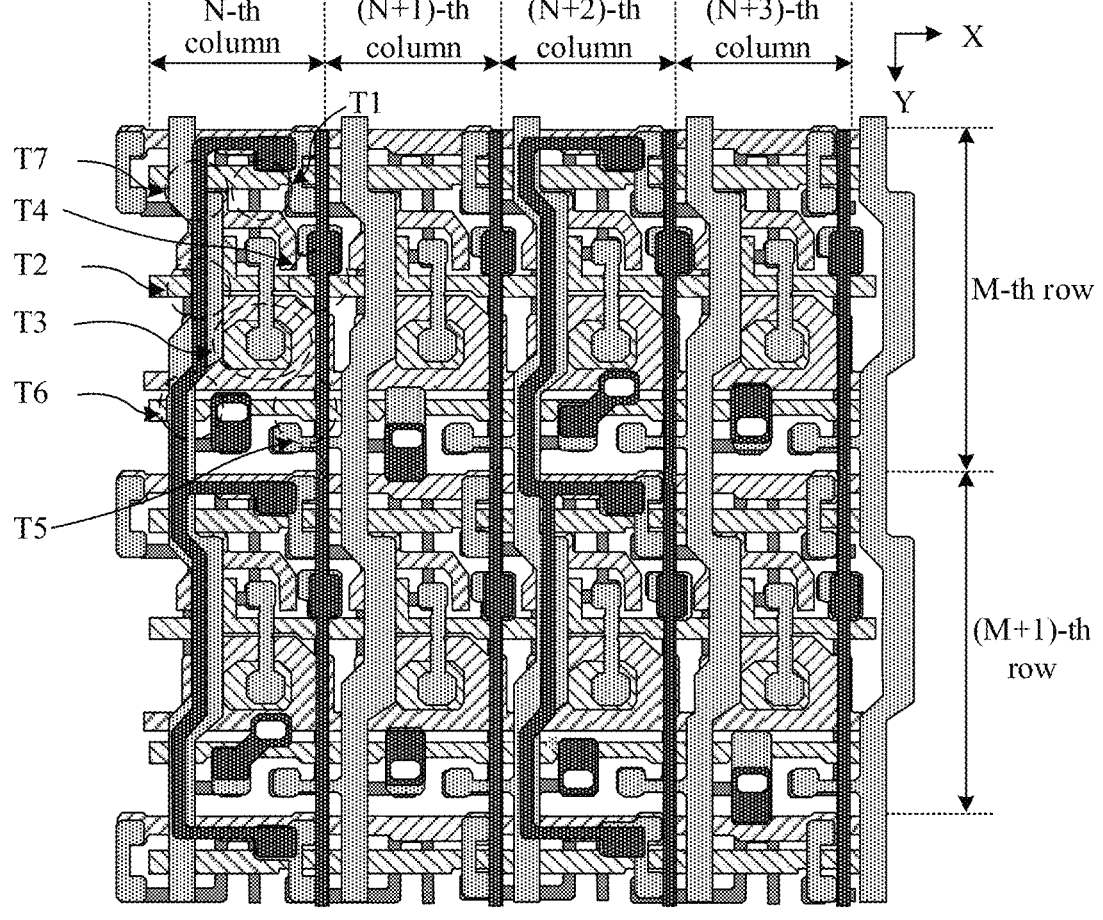
FIG. 14a is a schematic diagram after forming a pattern of a second planarization layer of a display substrate according to the present disclosure.
Figure 14B:
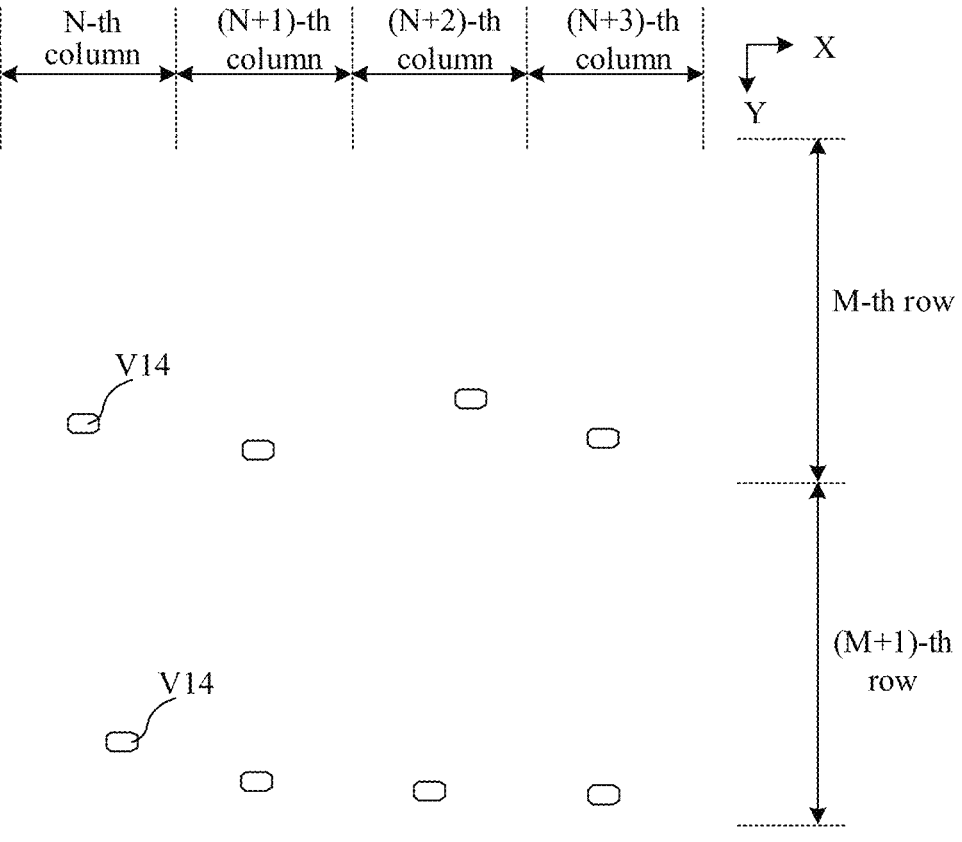

(8) A pattern of a second planarization layer is formed. In an exemplary embodiment, forming of the pattern of the second planarization layer may include: coating a second planarization thin film on the substrate formed with the aforementioned patterns, and patterning the second planarization thin film through a patterning process to form the second planarization layer covering the fourth conductive layer. The second planarization layer is disposed with a fourteenth via V14, as shown in FIG. 14a and FIG. 14b, and FIG. 14b is a schematic plan view of a plurality of vias in FIG. 14a.

As shown in conjunction with FIG. 7 to FIG. 14b, an orthographic projection of the fourteenth via V14 on the substrate is within a range of an orthographic projection of the anode connection electrode 53 on the substrate. The second planarization layer in the fourteenth via V14 is removed to expose a surface of the anode connection electrode 53. The fourteenth via V14 is configured such that an anode formed subsequently is connected with the anode connection electrode 53 through this via.

So far, the drive circuit layer is prepared on the substrate. In a plane parallel to the display substrate, the drive circuit layer may include a plurality of circuit units, each of which may include a pixel drive circuit, and a first scan signal line, a second scan signal line, a light emitting control line, a data signal line, a first power supply line, a first initial signal line, and a second initial signal line, which are all connected with the pixel drive circuit. In a plane perpendicular to the display substrate, the drive circuit layer may include a first insulating layer, a semiconductor layer, a second insulating layer, a first conductive layer, a third insulating layer, a second conductive layer, a fourth insulating layer, a third conductive layer, a first planarization layer, a fourth conductive layer and the second planarization layer which are stacked sequentially on the substrate.

In an exemplary embodiment, after the driver circuit layer is prepared, a light emitting structure layer is prepared on the driver circuit layer, and a preparation process of the light emitting structure layer may include the following operations.

Figure 15A:
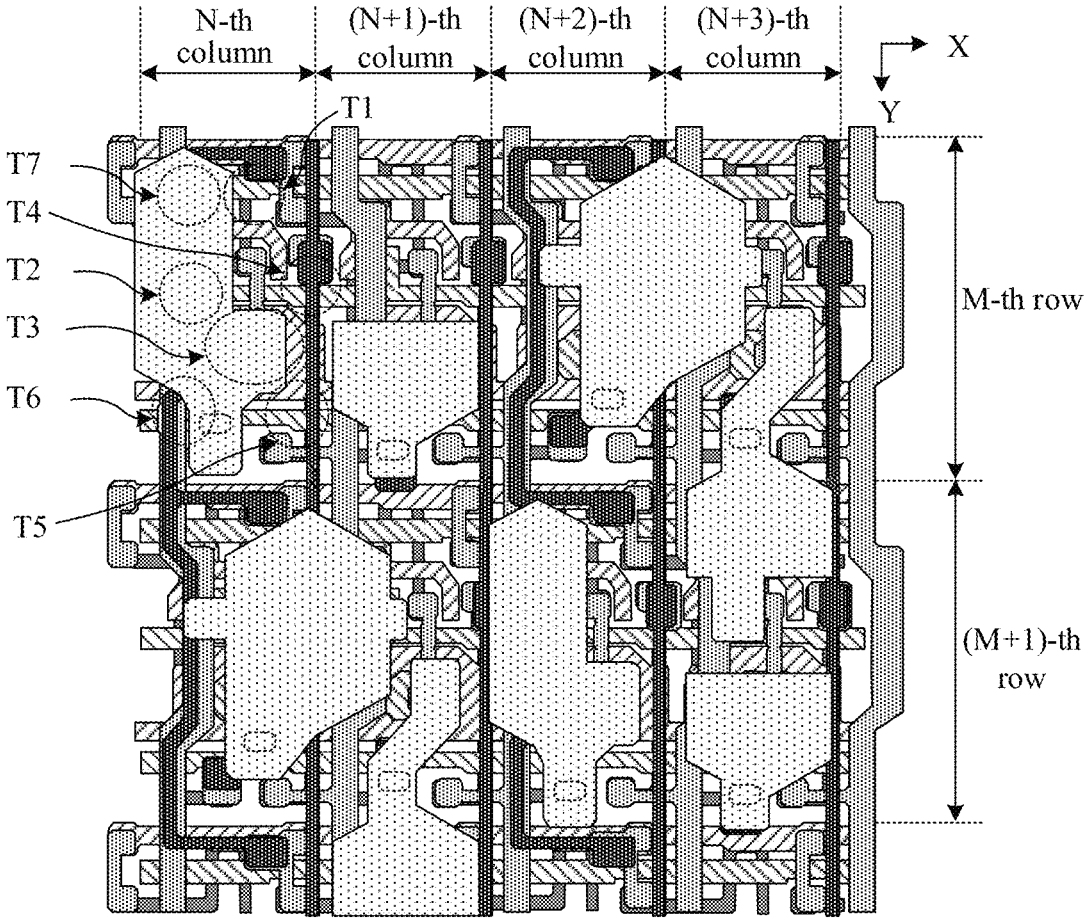
FIG. 15a is a schematic diagram after forming a pattern of an anode of a display substrate according to the present disclosure.
Figure 15B:
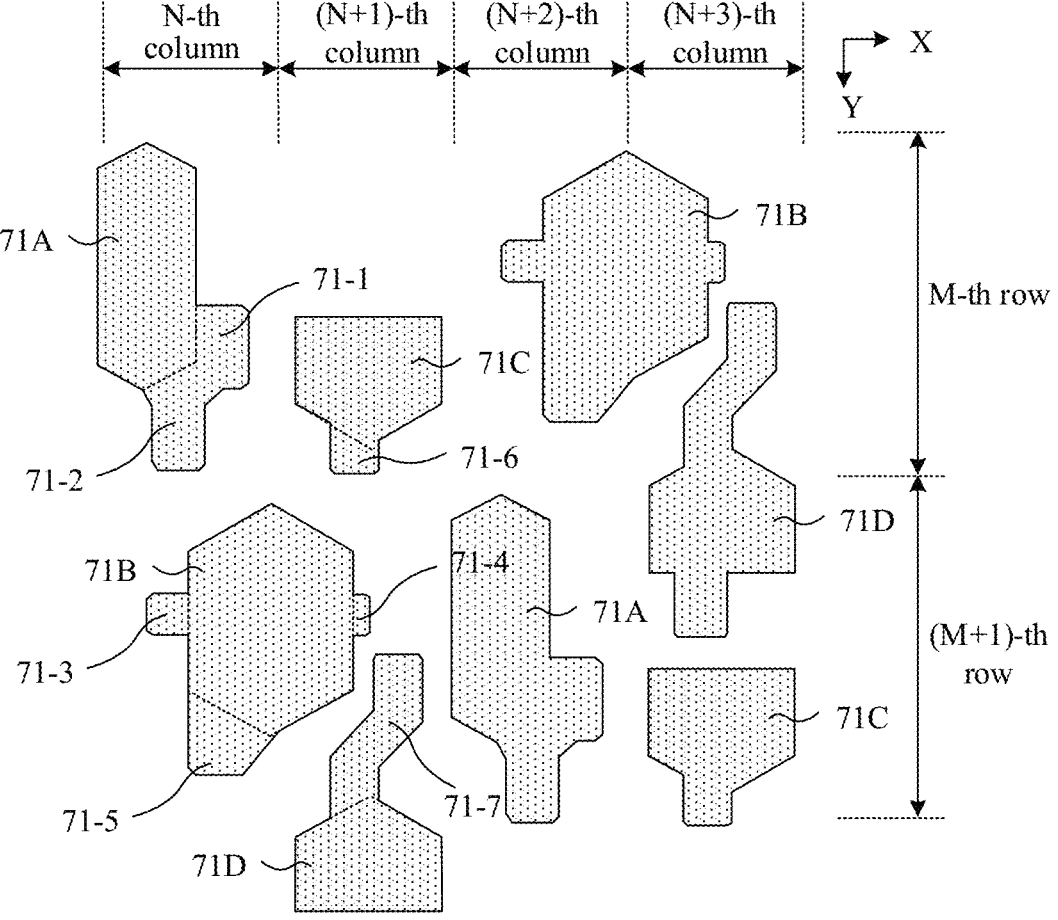

(9) A pattern of an anode is formed. In an exemplary embodiment, forming of the pattern of the anode may include: depositing a fifth conductive thin film on the substrate formed with the aforementioned patterns, and patterning the fifth conductive thin film through a patterning process to form the pattern of the anode disposed on the second planarization layer, anodes form GGRB pixel arrangement as shown in FIG. 15a and FIG. 15b, and FIG. 15b is a schematic plan view of an anode of FIG. 15a.

As shown in conjunction with FIG. 7 to FIG. 15b, the pattern of the anode may include a first anode 71A of a red light emitting device, a second anode 71B of a blue light emitting device, a third anode 71C of a first green light emitting device, and a fourth anode 71D of a second green light emitting device. A region where the first anode 71A is located may form a red sub-pixel R emitting red light, a region where the second anode 71B is located may form blue sub-pixels B emitting blue light, a region where the third anode 71C is located may form a first green sub-pixel G1 emitting green light, a region where the fourth anode 71D is located may form a second green sub-pixel G2 emitting green light. The red sub-pixel R and the blue sub-pixel B are sequentially disposed along the second direction Y, the first green sub-pixel G1 and the second green sub-pixel G2 are sequentially disposed along the second direction Y, the first green sub-pixel G1 and the second green sub-pixel G2 are respectively disposed at a side of the red sub-pixel R and the blue sub-pixel B in the first direction X, and the red sub-pixel R, the blue sub-pixel B, the first green sub-pixel G1 and the second green sub-pixel G2 form one pixel unit.

In an exemplary embodiment, in one pixel unit, the first anode 71A is connected with the anode connection electrode 53 in the circuit unit in the M-th row and the N-th column through a fourteenth via V14 in this circuit unit, the second anode 71B is connected with the anode connection electrode 53 in the circuit unit in the (M+1)-th row and the N-th column through a fourteenth via V14 in this circuit unit, the third anode 71C is connected with the anode connection electrode 53 in the circuit unit in the M-th row and the (N+1)-th column through a fourteenth via V14 in this circuit unit, and the fourth anode 71D is connected with the anode connection electrode 53 in the circuit unit in the (M+1)-th row and the (N+1)-th column through a fourteenth via V14 in this circuit unit. In another pixel unit, the first anode 71A is connected with the anode connection electrode 53 in the circuit unit in the (M+1)-th row and the (N+2)-th column through a fourteenth via V14 in this circuit unit, the second anode 71B is connected with the anode connection electrode 53 in the circuit unit in the M-th row and the (N+2)-th column through a fourteenth via V14 in this circuit unit, the third anode 71C is connected with the anode connection electrode 53 in the circuit unit in the (M+1)-th row and the (N+3)-th column through a fourteenth via V14 in this circuit unit, and the fourth anode 71D is connected with the anode connection electrode 53 in the circuit unit in the M-th row and the (N+3)-th column through a fourteenth via V14 in this circuit unit.

In an exemplary embodiment, because the anode connection electrode 53 in at least one circuit unit is connected with the third connection electrode 45 through the thirteenth via V13, while the third connection electrode 45 is connected with the second region of the sixth active layer (which is also the second region of the seventh active layer) through the fourth via V4, and the third connection electrode 45 serves as the second electrode of the sixth transistor T6 and the second electrode of the seventh transistor T7, the anode may be connected with the sixth transistor T6 and the seventh transistor T7 through the anode connection electrode 53 and the third connection electrode 45, and four anodes in at least one pixel unit are respectively connected with pixel drive circuits of four circuit units in one circuit unit group correspondingly, it is achieved that the pixel drive circuit may drive the light emitting device to emit light.

In an exemplary embodiment, the positional relationship between four sub-pixels of one pixel unit and four circuit units in one circuit unit group may be the same or may be different. In an exemplary embodiment of the present disclosure, a body portion of the first anode 71A is located at a side of a circuit unit connected correspondingly with the first anode 71A in the opposite direction of the first direction X, and an orthographic projection of the first anode 71A on the substrate may at least partially overlap with the orthographic projection of the extension portion of the second initial signal line on the substrate. A body portion of the second anode 71B is located at a side of a circuit unit connected correspondingly with the second anode 71B in the first direction X, and an orthographic projection of the second anode 71B on the substrate may at least partially overlap with the orthographic projection of the data signal line on the substrate. A body portion of the third anode 71C is located at a side of a circuit unit connected correspondingly with the third anode 71C in the second direction Y, and a body portion of the fourth anode 71D is located in a circuit unit in a next row of a circuit unit connected correspondingly with the fourth anode 71D.

In a possible exemplary embodiment, the body portion of the first anode 71A may be located at the side of the circuit unit connected correspondingly with the first anode 71A in the first direction X, and the orthographic projection of the first anode 71A on the substrate may at least partially overlap with the orthographic projection of the data signal line on the substrate. The body portion of the second anode 71B may be located at the side of the circuit unit connected correspondingly with the second anode 71B in the opposite direction of the first direction X, and the orthographic projection of the second anode 71B on the substrate may at least partially overlap with the orthographic projection of the extension portion of the second initial signal line on the substrate.

In an exemplary embodiment, the first anodes 71A in different pixel units may have the same or different shapes and positions. The second anodes 71B in different pixel units may have the same or different shapes and positions. The third anodes 71C in different pixel units may have the same or different shapes and positions. The fourth anodes 71D in different pixel units may have the same or different shapes and positions. In an exemplary embodiment of the present disclosure, two first anodes 71A respectively connected with a pixel drive circuit in the circuit unit in the M-th row and the N-th column and a pixel drive circuit in the circuit unit in the (M+1)-th row and the (N+2)-th column have the same shapes and positions, two second anodes 71B respectively connected with a pixel drive circuit in the circuit unit in the (M+1)-th row and the N-th column and a pixel drive circuit in the circuit unit in the M-th row and the (N+2)-th column have the same shapes and positions, two third anodes 71C connected with a pixel drive circuit in the circuit unit in the M-th row and the (N+1)-th column and a pixel drive circuit in the circuit unit in the (M+1)-th row and the (N+3)-th column have the same shapes and positions, and two fourth anodes 71D connected with a pixel drive circuit in the circuit unit in the (M+1)-th row and the (N+1)-th column and a pixel drive circuit in the circuit unit in the M-th row and the (N+3)-th column have the same shapes and positions.

In an exemplary embodiment, four sub-pixels in one pixel unit may have the same or different anode shapes and areas. In an exemplary embodiment of the present disclosure, the first anode 71A, the second anode 71B, the third anode 71C, and the fourth anode 71D in one pixel unit have different shapes and areas.

In an exemplary embodiment, the first anode 71A in the red sub-pixel may include a first anode body portion whose shape may be hexagon-like. In an exemplary embodiment, the first anode 71A may include a first protrusion 71-1 and a second protrusion 71-2, the first protrusion 71-1 and the second protrusion 71-2 are both connected with the first anode body portion. The first protrusion 71-1 may be a rectangle protruding toward a gate electrode of a third transistor T3 in the connected pixel drive circuit, the second protrusion 71-2 may be a rectangle protruding toward a sixth transistor T6 in the connected pixel drive circuit, and the first protrusion 71-1 and the second protrusion 71-2 are configured to adjust a parasitic capacitance of a node N3 in the connected pixel drive circuit to reduce a difference between parasitic capacitances of nodes N3 in adjacent circuit units to reduce a brightness difference and improve the display effect.

In an exemplary embodiment, the second anode 71B in the blue sub-pixel may include a second anode body portion whose shape may be hexagon-like. In an exemplary embodiment, the second anode 71B may include a third protrusion 71-3, a fourth protrusion 71-4, and a fifth protrusion 71-5. The third protrusion 71-3, the fourth protrusion 71-4, and the fifth protrusion 71-5 are all connected with the second anode body portion. The third protrusion 71-3 may be a rectangle protruding toward a first power supply line in the connected pixel drive circuit, the fourth projection 71-4 may be a rectangle protruding away from the first power supply line in the connected pixel drive circuit, the fifth protrusion 71-5 may be a polygon protruding toward the sixth transistor T6 in the connected pixel drive circuit. The third protrusion 71-3, the fourth protrusion 71-4, and the fifth protrusion 71-5 are configured to adjust the parasitic capacitance of the node N3 in the connected pixel drive circuit to reduce the difference between the parasitic capacitances of the nodes N3 in adjacent circuit units to reduce the brightness difference and improve the display effect.

In an exemplary embodiment, the third anode 71C may include a third anode body portion whose shape may be pentagon-like. In an exemplary embodiment, the third anode 71C may include a sixth protrusion 71-6. The sixth protrusion 71-6 is connected with the third anode body portion, the sixth protrusion 71-6 may be a rectangle protruding toward the sixth transistor T6 in the connected pixel drive circuit. The sixth protrusion 71-6 is configured to adjust the parasitic capacitance of the node N3 in the connected pixel drive circuit, to reduce the difference between the parasitic capacitances of the nodes N3 in the adjacent circuit units, to reduce the brightness difference, especially to reduce a brightness difference between this sub-pixel and the second green sub-pixel, and improve the display effect.

In an exemplary embodiment, the fourth anode 71D may include a fourth anode body portion whose shape may be pentagon-like. In an exemplary embodiment, the fourth anode 71D may include a seventh protrusion 71-7, the seventh protrusion 71-7 is connected with the fourth anode body partion. The seventh protrusion 71-7 may have a strip shape protruding toward a gate electrode of a third transistor T3 in the connected pixel drive circuit. The seventh protrusion 71-7 is configured to adjust the parasitic capacitance of the node N3 in the connected pixel drive circuit, to reduce the difference between the parasitic capacitances of the nodes N3 in the adjacent circuit units, to reduce the brightness difference, especially to reduce the brightness difference between this sub-pixel and the first green sub-pixel, and to improve the display effect.

Figure 16A:
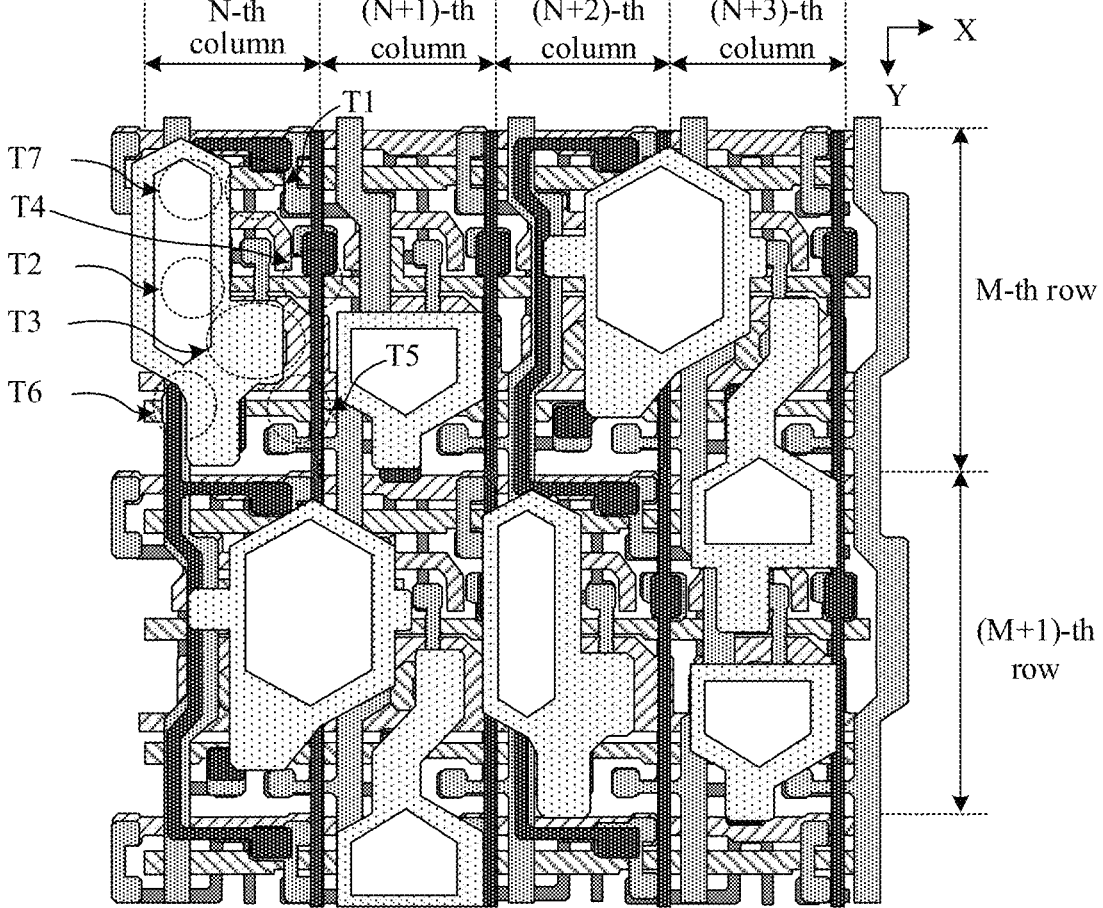
FIG. 16a is a schematic diagram after forming a pattern of a pixel definition layer of a display substrate according to the present disclosure.
Figure 16B:
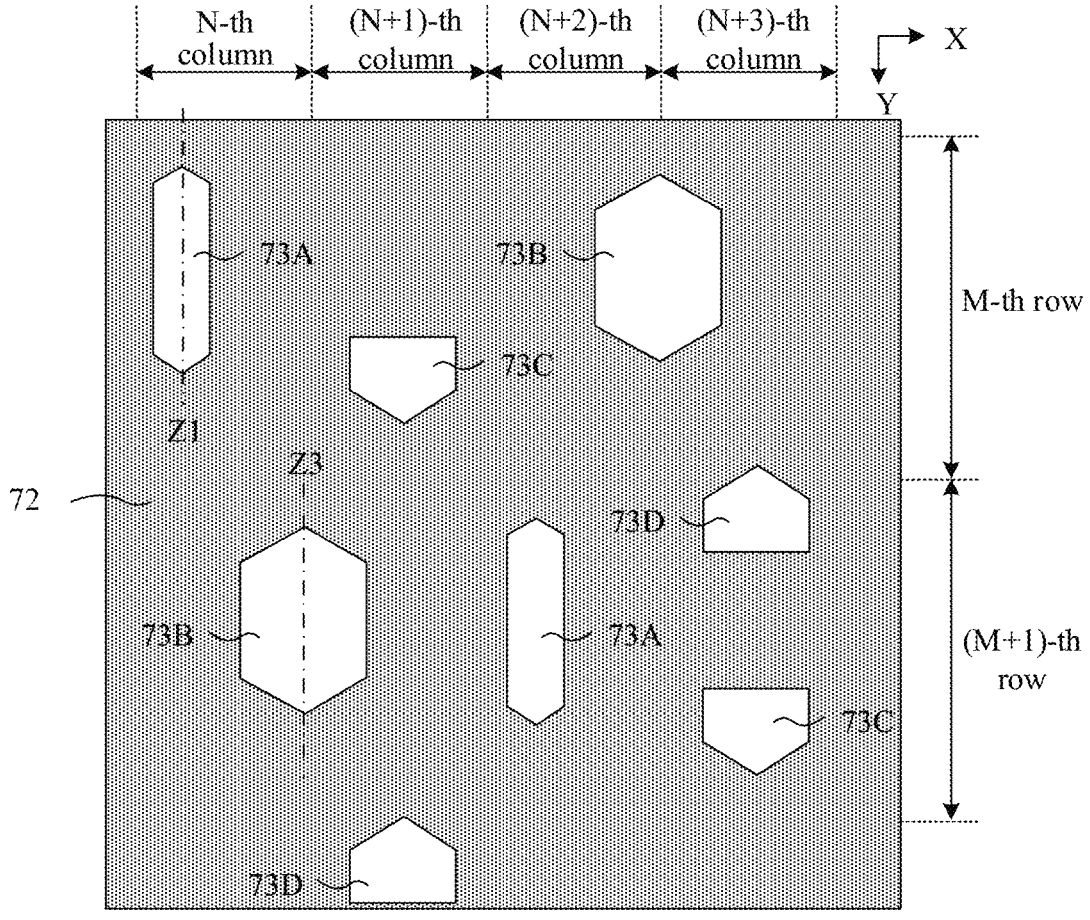

(10) A pattern of a pixel definition layer is formed. In an exemplary embodiment, forming of the pattern of the pixel definition layer may include: coating a pixel definition thin film on the substrate formed with the aforementioned patterns, patterning the pixel definition thin film by a patterning process to form a pattern of a pixel definition layer 72, as shown in FIG. 16*a* and FIG. 16*b*, FIG. 16*b* is a schematic plan view of a pixel definition layer in FIG. 16*a*.

As shown in conjunction with FIG. 7 to FIG. 16b, the pattern of the pixel definition layer 72 may include a first pixel opening 73A exposing the first anode 71A, a second pixel opening 73B exposing the second anode 71B, a third pixel opening 73C exposing the third anode 71C, and a fourth pixel opening 73D exposing the fourth anode 71D.

In an exemplary embodiment, an orthographic projection of the first pixel opening 73A on the substrate has a first centerline Z1, an orthographic projection of the extension portion of the second initial signal line 52 on the substrate has a second centerline. The first centerline Z1 is a line extending along the second direction Y and bisecting the orthographic projection of the first pixel opening 73A on the substrate in the first direction X, and the second centerline is a line extending along the second direction Y and bisecting the orthographic projection of the extension portion of the second initial signal line on the substrate in the first direction X. In an exemplary embodiment, the second centerline is a line extending along the second direction Y and bisecting an orthographic projection of the first initial portion c1 in the extension portion on the substrate in the first direction X. In an exemplary embodiment, the first centerline overlaps at least partially with the second centerline. In the present disclosure, the first centerline of the first pixel opening 73A is disposed to overlap at least partially with the second centerline of the extension portion of the second initial signal line, so that the second initial signal line in the first pixel opening 73A may be kept left-right symmetrical, therefore the planarization of the first anode may be ensured and color cast of large angle of view may be avoided.

In an exemplary embodiment, an orthographic projection of the second pixel opening 73B on the substrate has a third centerline Z3, the orthographic projection of the data signal line 51 on the substrate has a fourth centerline. The third centerline Z3 is a line extending along the second direction Y and bisecting the orthographic projection of the second pixel opening 73B on the substrate in the first direction X, and the fourth centerline is a line extending along the second direction Y and bisecting the orthographic projection of the data signal line on the substrate in the first direction X. In an exemplary embodiment, the third centerline overlaps at least partially with the fourth centerline. In the present disclosure, the third centerline of the second pixel opening 73B is disposed to overlap at least partially with the fourth centerline of the data signal line, so that the data signal line in the second pixel opening 73B can be kept symmetrical left and right, therefore the planarization of the second anode may be ensured and color cast of large angle of view may be avoided.

"Bisecting A" in the present disclosure may mean that the centerline enable both sides of the orthographic projection of A on the substrate to be substantially equal in distance from the centerline, and substantially equal in distance from the centerline may be subject to deviations within an allowable range due to process or tolerances. For example, a ratio of minimum distances between two edges of the orthographic projection of A on the substrate from the centerline may be about 0.8 to 1.2. The "A overlaps with B" in the present disclosure does not require that A overlaps with B completely, and there may be deviations within the allowable range due to process or tolerances.

In an exemplary embodiment, the planarization of the anode may be ensured in other ways. For example, a manner such as increasing of a thickness of the second planarization layer may be adopted. As another example, the signal line may be widened and basically consistent with the shape of the anode. For another example, the signal line may be divided into left and right sections, and the two sections are located at both sides of the centerline and symmetrically padded below both sides of the anode. For another example, the signal line may be divided into two lines located at both sides of the centerline and padded at left and right sides of the anode respectively, the present disclosure is not limited here.

In an exemplary embodiment, a subsequent preparation process may include: forming an organic light emitting layer using an evaporation or ink-jet printing process, the organic light emitting layer being connected with an anode through a pixel opening, and forming a cathode on the organic light emitting layer, the cathode being connected with the organic light emitting layer. An encapsulation layer is formed. The encapsulation layer may include a first encapsulation layer, a second encapsulation layer, and a third encapsulation layer that are stacked. The first encapsulation layer and the third encapsulation layer may be made of an inorganic material. The second encapsulation layer may be made of an organic material. The second encapsulation layer is disposed between the first encapsulation layer and the third encapsulation layer, it can be ensured that external water vapor cannot enter the light emitting structure layer.

In an exemplary implementation, the substrate may be a flexible substrate or a rigid substrate. The rigid substrate may be made of, but is not limited to, one or more of glass and quartz. The flexible base substrate may be made of, but is not limited to, one or more of polyethylene terephthalate, ethylene terephthalate, polyether ether ketone, polystyrene, polycarbonate, polyarylate, polyarylester, polyimide, polyvinyl chloride, polyethylene, and textile fibers. In an exemplary implementation, the flexible substrate may include a first flexible material layer, a first inorganic material layer, a semiconductor layer, a second flexible material layer and a second inorganic material layer which are stacked, materials of the first flexible material layer and the second flexible material layer may be made of polyimide (P1), polyethylene terephthalate (PET) or a polymer soft film with surface treatment; materials of the first inorganic material layer and the second inorganic material layer may be made of silicon nitride (SiNx) or silicon oxide (SiOx), etc., for improving the water-resistance and oxygen-resistance of the substrate; and a material of the semiconductor layer may be made of amorphous silicon (a-si).

In an exemplary embodiment, the first conductive layer, the second conductive layer, the third conductive layer and the fourth conductive layer may be made of metal materials, such as any one or more of silver (Ag), copper (Cu), aluminum (Al) and molybdenum (Mo), or alloy materials of the above metals, such as an aluminum neodymium alloy (AlNd) or a molybdenum niobium alloy (MoNb), and may be a single-layer structure or a multi-layer composite structure, such as Mo/Cu/Mo, etc. The first insulating layer, the second insulating layer, the third insulating layer, and the fourth insulating layer may be made of any one or more of silicon oxide (SiOx), silicon nitride (SiNx), and silicon oxynitride (SiON), and may be a single layer, multilayers, or a composite layer. The first insulating layer is referred to as a buffer layer, which is used to improve the water oxygen resistance of the substrate. The second insulating layer and the third insulating layers are referred to as gate insulating (GI) layers. The fourth insulating layer is referred to as an interlayer insulating (ILD) layer. The active layer may be made of materials such as amorphous indium gallium zinc oxide (a-IGZO), zinc oxynitride (ZnON), indium zinc tin oxide (IZTO), amorphous silicon (a-Si), polysilicon (p-Si), hexathiophene, or polythiophene, etc. That is, the present disclosure is applicable to transistors that are manufactured based on oxide technology, silicon technology or organic technology. The first planarization layer and the second planarization layer may be made of an organic material such as a resin or the like. The fifth conductive layer may be made of a single-layer structure, such as indium tin oxide ITO or indium zinc oxide IZO, or may be made of a multi-layer composite structure, such as ITO/Ag/ITO, etc. The pixel definition layer may be made of polyimide, acrylic or polyethylene terephthalate. The cathode may be made of any one or more of magnesium (Mg), silver (Ag), aluminum (Al), copper (Cu) and lithium (Li), or an alloy made of any one or more of the above metals.

As may be seen from the structure and preparation process of the display substrate described above, in the display substrate provided by the present disclosure, the first initial signal line having the body portion extended in the first direction and the second initial signal having the body portion extended in the second direction are disposed, the first initial signal line and the second initial signal line are connected through a via, so that the initial signal line forms a grid structure, which not only effectively reduces the resistance of the initial signal line and the voltage drop of the initial voltage, but also effectively improves the uniformity of the initial voltage in the display substrate, effectively improves the display uniformity, and improves the display quality. In the present disclosure, the first initial signal line and the second initial signal line are disposed at different conductive layers, and the extension portion of the second initial signal line overlaps at least partially with the first power supply line, the connection portion of the second initial signal line overlaps at least partially with the first initial signal line, which not only may make the first power supply line effectively shield the influence of the second initial signal line on the key node in the pixel drive circuit and prevent the initial signal from affecting the potential of the key node in the pixel drive circuit, but also may fully utilize a layout space to avoid influence of disposition of the second initial signal line on light transmittance. In the present disclosure, the second initial signal line is disposed in the first unit column, which may avoid the brightness difference of two green sub-pixels in the same pixel unit and improve the display quality. In the present disclosure, the first centerline of the first pixel opening overlaps at least partially with the second centerline of the extension partion of the second initial signal line, so that the second initial signal line in the first pixel opening may be kept left-right symmetrical, therefore the planarization of the first anode may be ensured and color cast of large angle of view may be avoided. The preparation process in the present disclosure may be compatible well with an existing preparation process, which is simple in process implementation, easy to implement, high in production efficiency, low in production cost, and high in yield.

Figure 17A:
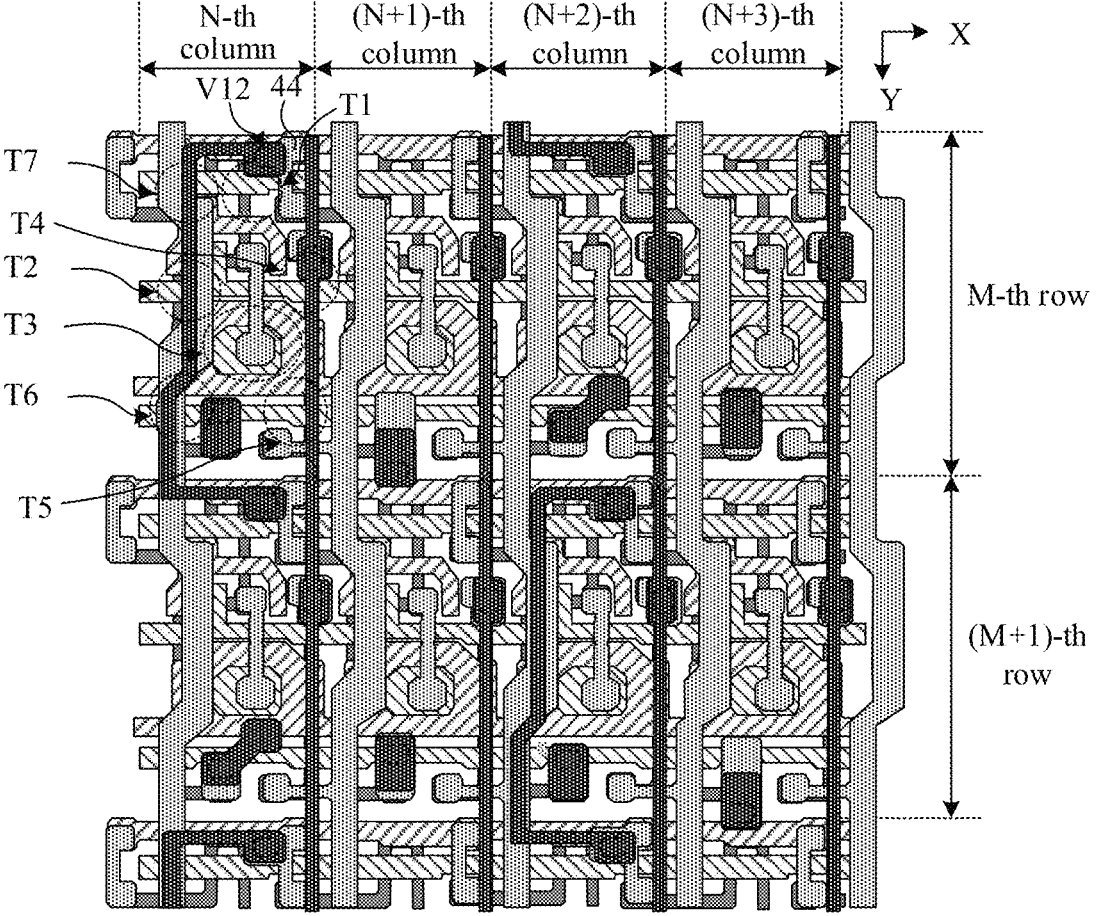
FIG. 17a is a schematic diagram of a structure of another drive circuit layer according to an exemplary embodiment of the present disclosure.
Figure 17B:
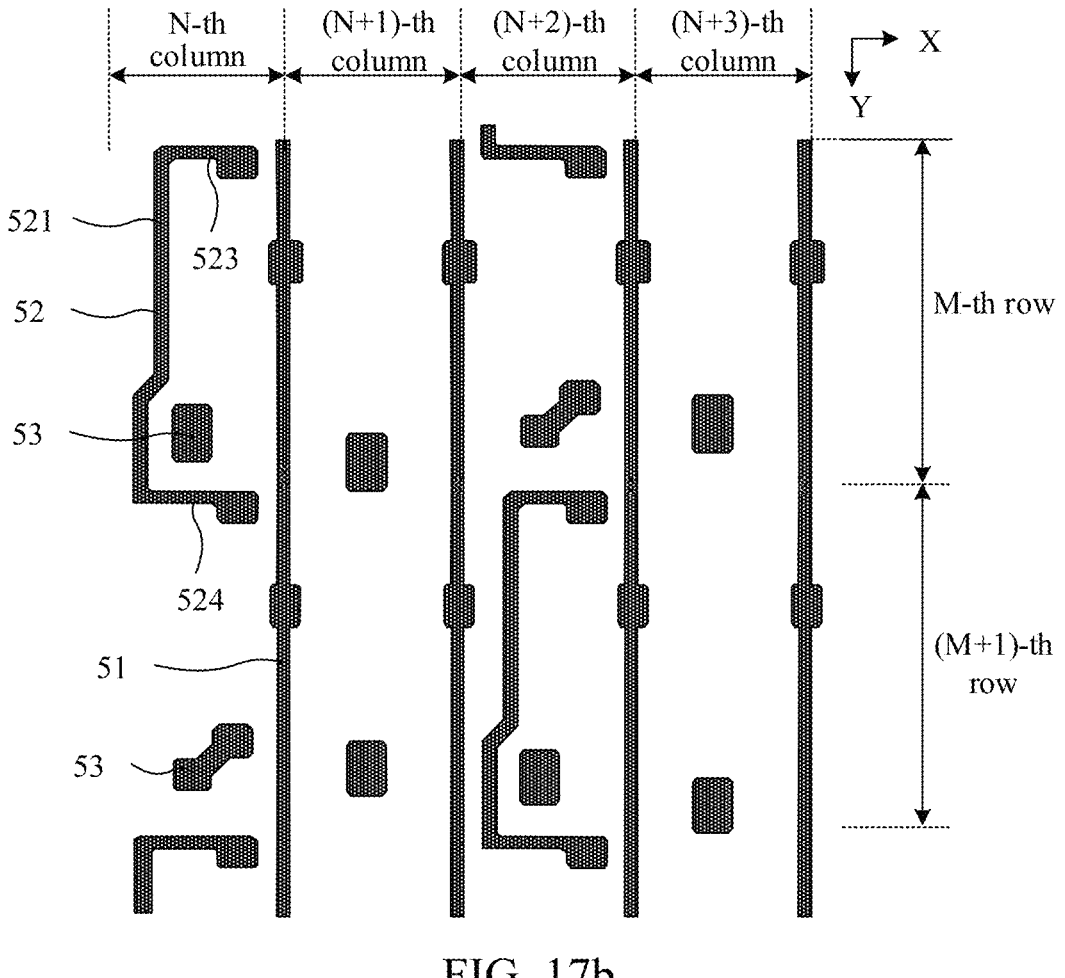

FIG. 17a is a schematic diagram of a structure of another drive circuit layer according to an exemplary embodiment of the present disclosure, FIG. 17b is a schematic plan view of a fourth conductive layer in FIG. 17a, and illustrates a planar structure of eight circuit units (2 unit rows and 4 unit columns). In an exemplary implementation, in the drive circuit layer of the present exemplary embodiment, a structure of a semiconductor layer, a first conductive layer, a second conductive layer, a third conductive layer and a data signal line 51 and an anode connection electrode 53 in a fourth conductive layer is substantially similar to that of the aforementioned embodiment, the difference is that a second initial signal line 52 in the fourth conductive layer is disposed in part of circuit units in a unit column, and two adjacent second initial signal lines 52 in a unit column may be isolated from each other.

As shown in FIG. 17a and FIG. 17b, in an exemplary embodiment, a body portion of the second initial signal line 52 is disposed in a circuit unit in a M-th row and an N-th column and a circuit unit in the (M+1)-th row and an (N+2)-th column, respectively. The second initial signal line 52 is connected not only with a second connection electrode 44 of this circuit unit through a twelfth via V12 of this circuit unit, but also with a second connection electrode 44 of a circuit unit in a next row through a twelfth via V12 of the circuit unit in the next row. For example, for a circuit unit in a M-th row and an N-th column, the second initial signal line 52 is connected with a second connection electrode 44 of the circuit unit in the M-th row and the N-th column through a twelfth via V12 in the circuit unit in the M-th row and the N-th column, and is connected with a second connection electrode 44 of a circuit unit in a (M+1)-th row and an N-th column through a twelfth via V12 of the circuit unit in the (M+1)-th row and the N-th column. For a circuit unit in a (M+1)-th row and an N-th column, the second initial signal line 52 is connected with a second connection electrode 44 of the circuit unit in the (M+1)-th row and the N-th column through a twelfth via V12 of the circuit unit in the (M+1)-th row and the N-th column, and with a second connection electrode 44 of a circuit unit of a (M+2)-th row and an N-th column through a twelfth via V12 of the circuit unit of the (M+2)-th row and the N-th column.

In an exemplary embodiment, at least one second initial signal line 52 may include an extension portion 521, a first connection portion 523 and a second connection portion 524. The extension portion 521 may be a bent line having a body portion extended in a second direction Y, the first connection portion 523 and the second connection portion 524 may be straight lines having body portions extended in a first direction X. The first connection portion 523 may be disposed in this circuit unit, and the second connection portion 524 may be disposed in a circuit unit in a next row. In an exemplary embodiment, an end of a side of the first connection portion 523 away from the extension portion 521 may be connected with the second connection electrode 44 of this circuit unit through the twelfth via V12 of this circuit unit, and an end of a side of the second connection portion 524 away from the extension portion 521 may be connected with the second connection electrode 44 of the circuit unit in the next row through the twelfth via V12 of the circuit unit in the next row. Thus, one second initial signal line 52 may be connected with first initial signal lines of two unit rows, such that the first initial signal lines and the second initial signal lines form a grid structure.

In an exemplary embodiment, an orthographic projection of the extension portion 521 on a substrate is located at least partially within a range of an orthographic projection of a first power supply line 41 on the substrate, orthographic projections of the first connection portion 523 and the second connection portion 524 on the substrate are located at least partially within a range of an orthographic projection of a first initial signal line 31 on the substrate, which may make full use of the layout space, avoid the influence of disposition of the second initial signal line on the light transmittance, and improve the display effect.

In the present exemplary embodiment, a subsequent process of forming a light emitting structure layer is substantially similar to that of the aforementioned embodiment. After a pattern of an anode is formed, an orthographic projection of a first anode on the substrate may overlap at least partially with an orthographic projection of the extension portion of the second initial signal line on the substrate, and a first centerline of a first pixel opening overlaps at least partially with a second centerline of the extension portion of the second initial signal line, therefore the planarization of the first anode may be ensured and color cast of large angle of view may be avoided.

Figure 18A:
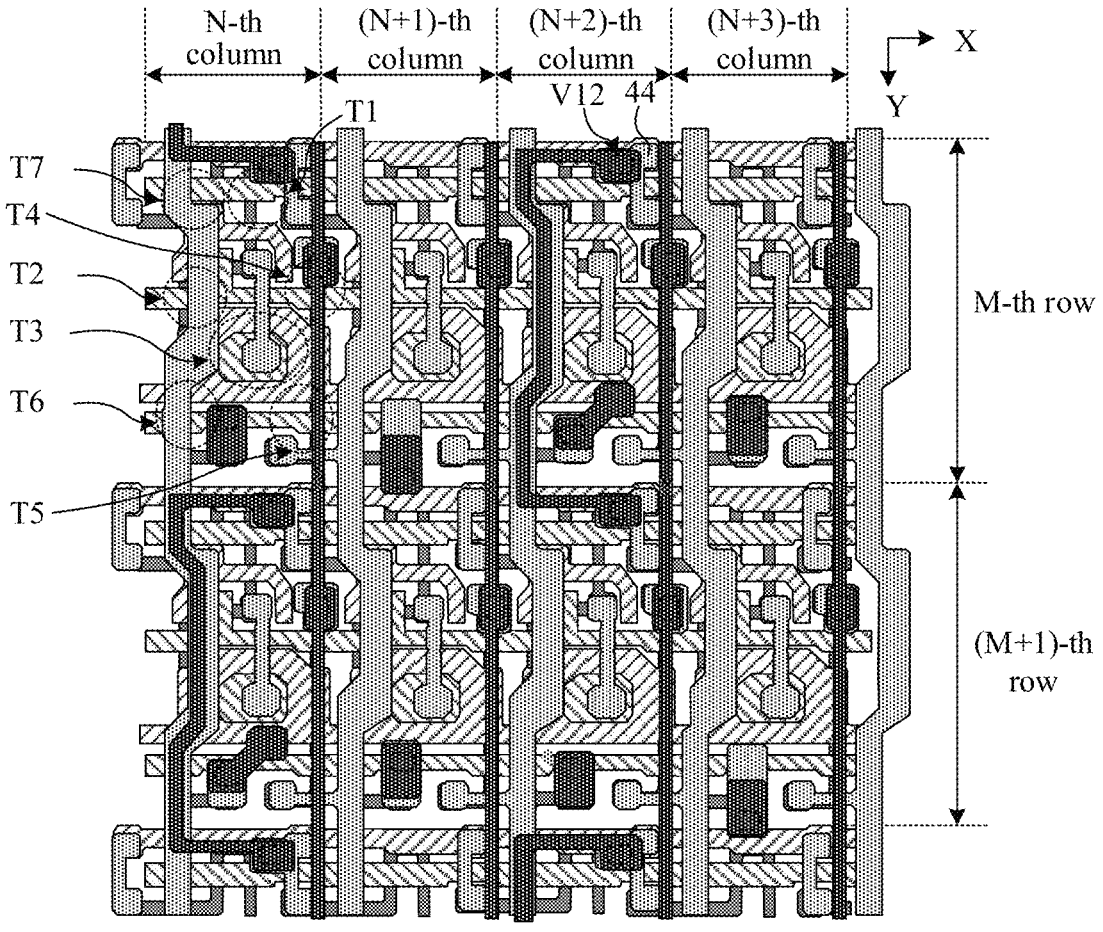
FIG. 18a is a schematic diagram of a structure of yet another drive circuit layer according to an exemplary embodiment of the present disclosure.
Figure 18B:
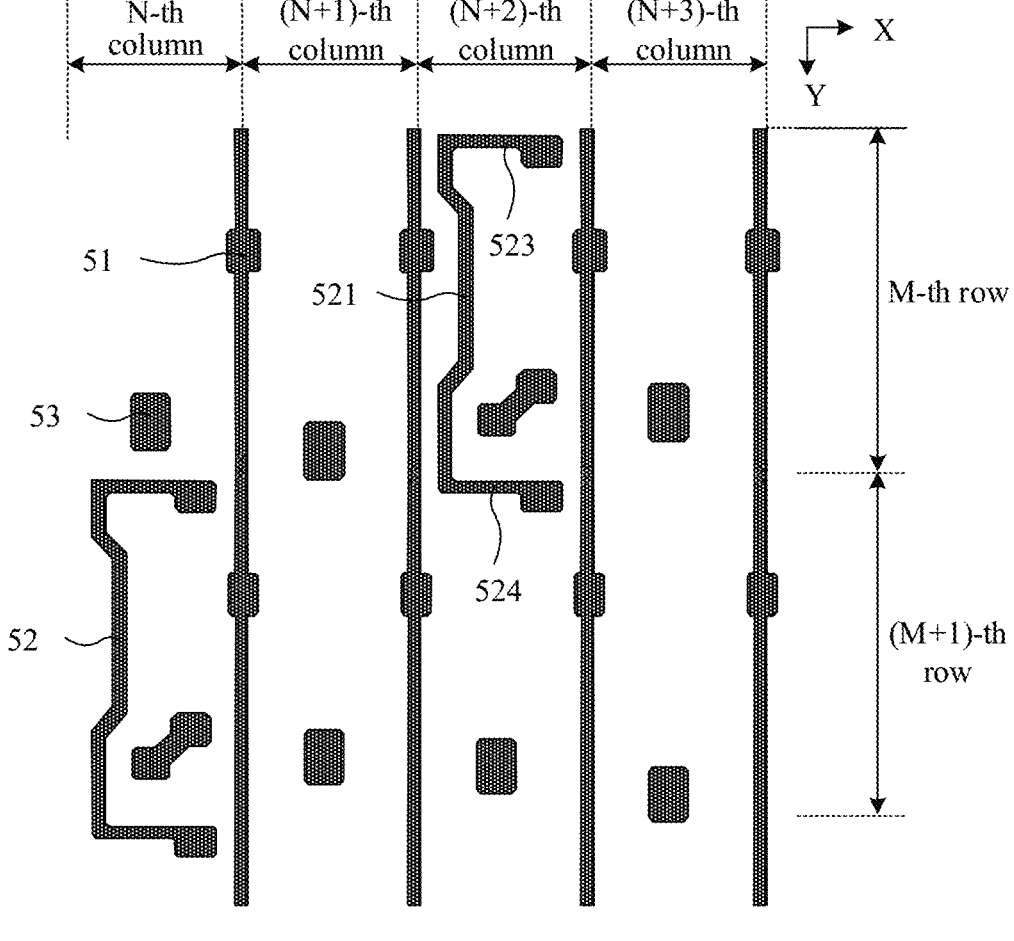

FIG. 18a is a schematic diagram of a structure of yet another drive circuit layer according to an exemplary embodiment of the present disclosure, FIG. 18b is a schematic plan view of a fourth conductive layer in FIG. 18a, and illustrates a planar structure of eight circuit units (2 unit rows and 4 unit columns). In an exemplary implementation, in the drive circuit layer of the present exemplary embodiment, a structure of a semiconductor layer, a first conductive layer, a second conductive layer, a third conductive layer and a data signal line 51 and an anode connection electrode 53 in a fourth conductive layer is substantially similar to that of the aforementioned embodiment, the difference is that a second initial signal line 52 in the fourth conductive layer is disposed in part of circuit units in a unit column, and two adjacent second initial signal lines 52 in a unit column may be isolated from each other.

As shown in FIG. 18a and FIG. 18b, in an exemplary embodiment, a body portion of the second initial signal line 52 is disposed in a circuit unit in a (M+1)-th row and an N-th column and a circuit unit in a M-th row and an (N+2)-th column, respectively, the second initial signal line 52 is connected not only with a second connection electrode 44 of this circuit unit through a twelfth via V12 of this circuit unit, but also with a second connection electrode 44 of a circuit unit in a next row through a twelfth via V12 of the circuit unit in the next row.

In an exemplary embodiment, a body structure of at least one second initial signal line 52 may include an extension portion 521, a first connection portion 523 and a second connection portion 524. The extension portion 521, the first connection portion 523, and the second connection portion 524 may be similar to the structure described in FIG. 17b, and one second initial signal line 52 may be connected with the first initial signal lines of two unit rows, such that the first initial signal lines and the second initial signal lines form a grid structure. An orthographic projection of the extension portion 521 on the substrate is located at least partially within a range of an orthographic projection of the first power supply line 41 on the substrate, an orthographic projection of the first connection portion 523 and the second connection portion 524 on the substrate is located at least partially within a range of an orthographic projection of a first initial signal line 31 on the substrate, which may make full use of the layout space, avoid the influence of disposition of the second initial signal line on the light transmittance, and improve the display effect.

In the present exemplary embodiment, a subsequent process of forming the light emitting structure layer is substantially similar to that of the aforementioned embodiments. After the pattern of the anode is formed, orthographic projections of the first anode and the second anode on the substrate may both have no overlapping region with the orthographic projection of the second initial signal line on the substrate, and the extension portion of the second initial signal line does not pass through any pixel opening, which may further ensure the planarization of the first anode and the second anode, and may avoid color cast of large angle of view.

Figure 19A:
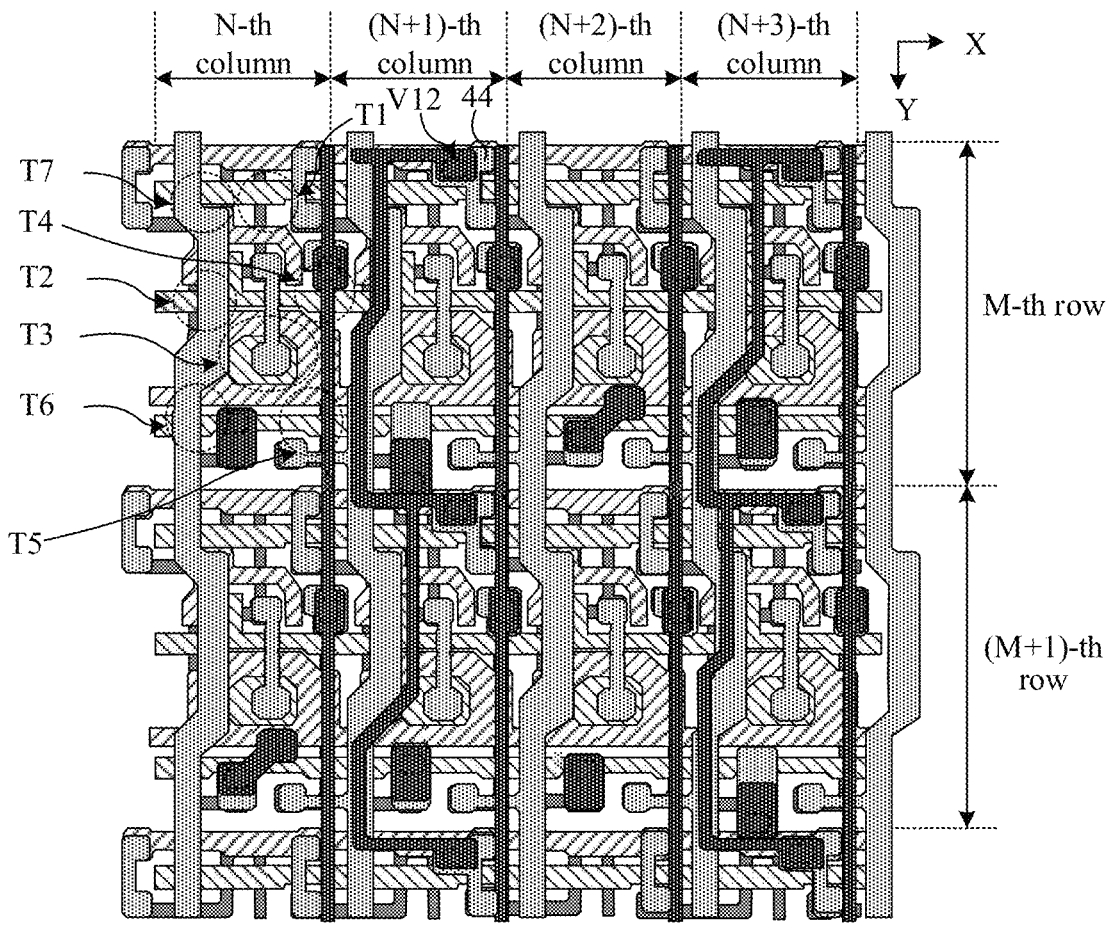
FIG. 19a is a schematic diagram of a structure of yet another drive circuit layer according to an exemplary embodiment of the present disclosure.
Figure 19B:
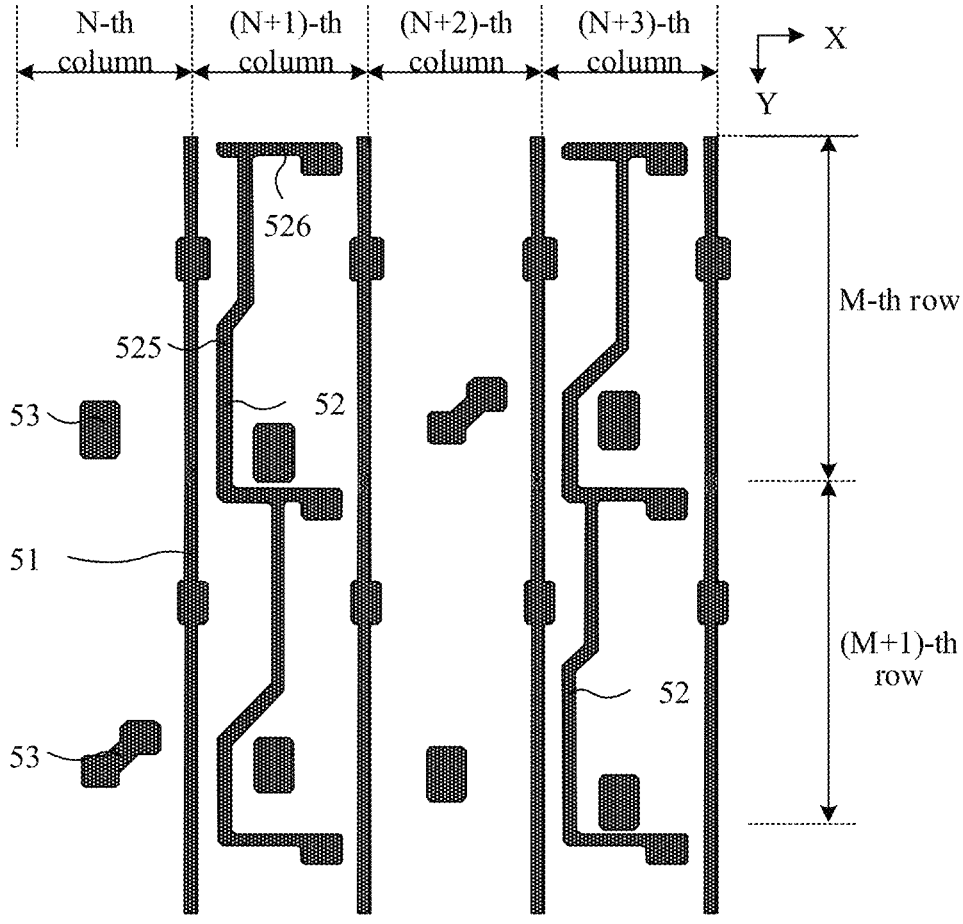

FIG. 19a is a schematic diagram of a structure of yet another drive circuit layer according to an exemplary embodiment of the present disclosure, and FIG. 19b is a planar schematic diagram of a fourth conductive layer in FIG. 19a, and illustrates a planar structure of eight circuit units (2 unit rows and 4 unit columns). In an exemplary implementation, in the drive circuit layer of the present exemplary embodiment, a structure of a semiconductor layer, a first conductive layer, a second conductive layer, a third conductive layer and a data signal line 51 and an anode connection electrode 53 in a fourth conductive layer is substantially similar to that of the aforementioned embodiment, the difference is that a second initial signal line 52 in the fourth conductive layer is disposed in an (N+1) unit column and an (N+3) unit column, and second initial signal lines 52 of circuit units in a uint column are connected with each other.

As shown in FIG. 19a and FIG. 19b, in an exemplary embodiment, second connection electrodes 44 in circuit units in an (N+1)-th column and an (N+3)-th column include a first portion and a second portion connected with each other. The second initial signal line 52 has a body portion extended in a second direction Y, and the second initial signal line 52 is connected with the second portion of the second connection electrode 44 through a twelfth via V12 in each circuit unit, so that first initial signal lines and second initial signal lines form a grid structure.

In an exemplary embodiment, a second initial signal line 52 in a circuit unit in a M-th row and an (N+1)-th column may have the same shape as a second initial signal line 52 in a circuit unit in a (M+1)-th row and an (N+3)-th column, and a second initial signal line 52 in a circuit unit in the (M+1)-th row and the (N+1)-th column may have the same shape as a second initial signal line 52 in a circuit unit in the M-th row and the (N+3)-th column.

In an exemplary embodiment, a second initial signal line 52 in one circuit unit may include an extension portion 525 and a connection portion 526. The extension portion 525 may be a polyline having a body portion extended along a second direction Y, and the connection portion 526 may be a straight line having a body portion extended along a first direction X. In an exemplary embodiment, an end of a side of the connection portion 526 away from the extension portion 525 may be connected with the second connection electrode 44 through the twelfth via V12.

In an exemplary embodiment, an orthographic projection of the extension portion 525 on the substrate is located at least partially within a range of an orthographic projection of a first power supply line 41 on the substrate, which not only may make the first power supply line 14 effectively shield an influence of the second initial signal line 52 on a key node in the pixel drive circuit and prevent an initial signal from affecting a potential of the key node in the pixel drive circuit, but also may fully utilize a layout space to avoid an influence of disposition of the second initial signal line on light transmittance, and improve display effect.

In an exemplary embodiment, orthographic projections of the connection portion 526 on the substrate is located at least partially within a range of an orthographic projection of the first initial signal line 31 on the substrate, which may fully utilize the layout space, to avoid the influence of disposition of the second initial signal line on light transmittance, and improve the display effect.

In an exemplary implementation, a quantity of unit columns spaced between adjacent second initial signal lines 52 is not particularly required and may be set as required, and the present disclosure is not limited herein.

In the present exemplary embodiment, a subsequent process of forming a light emitting structure layer is substantially similar to that of the aforementioned embodiment. After the pattern of the anode is formed, orthographic projections of a third anode and a fourth anode on the substrate may overlap at least partially with the orthographic projection of the connection portion of the second initial signal line on the substrate, and orthographic projections of a first anode and a second anode on the substrate do not overlap with the orthographic projection of the second initial signal line on the substrate. Orthographic projections of a first pixel opening and a second pixel opening on the substrate do not overlap with the orthographic projection of the second initial signal line on the substrate, i.e., the second initial signal line does not pass through the first pixel opening and the second pixel opening, therefore the planarization of the first anode and the second anode may be ensured and color cast of large angle of view may be avoided.

In an exemplary embodiment, because the second initial signal line passes through a first green pixel opening and/or a second green pixel opening, the planarization of the third anode and/or the fourth anode may be improved by means of thickening a thickness of a planarization layer or the like in a region where the first green pixel opening and/or the second green pixel opening is located.

In an exemplary embodiment, the second initial signal line 52 may be disposed in part of circuit units in the (N+1)-th unit column and the (N+3)-th unit column, and two adjacent second initial signal lines 52 in a unit column may be isolated from each other. For example, a body portion of the second initial signal line 52 may be disposed in the circuit unit in the M-th row and the (N+1)-th column and the circuit unit in the (M+1)-th row and the (N+3)-th column, respectively, so that an orthographic projection of the third anode formed subsequently on the substrate overlaps at least partially with the orthographic projection of the extension portion of the second initial signal line on the substrate, while an orthographic projection of the fourth anode on the substrate and the orthographic projection of the extension portion of the second initial signal line on the substrate have no overlapping region. As another example, the body portion of the second initial signal line 52 may be disposed in the circuit unit in the (M+1)-th row and the (N+1)-th column and the circuit unit in the M-th row and the (N+3)-th column, respectively, so that the orthographic projection of the fourth anode formed subsequently on the substrate overlaps at least partially with the orthographic projection of the extension portion of the second initial signal line on the substrate, while the orthographic projection of the third anode on the substrate and the orthographic projection of the extension portion of the second initial signal line on the substrate have no overlapping region, the present disclosure is not limited herein.

Figure 20A:
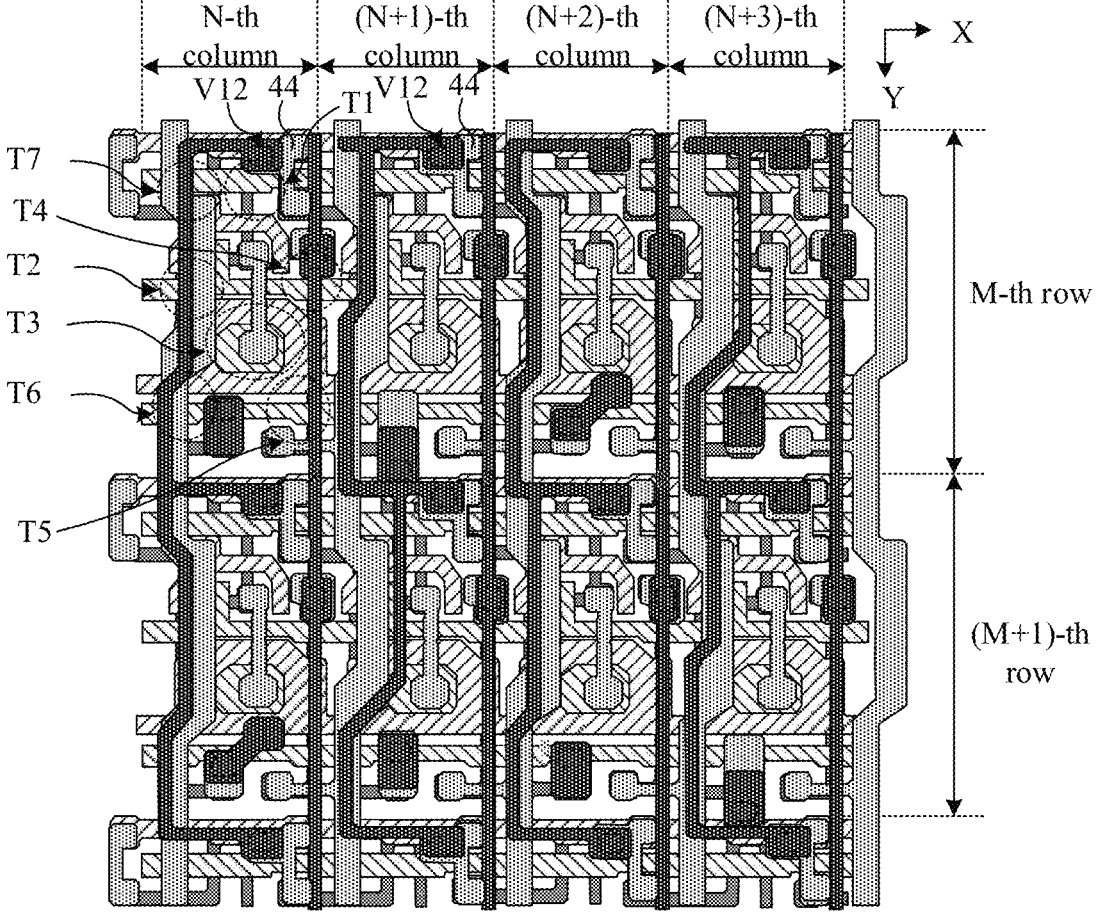
FIG. 20a is a schematic diagram of a structure of yet another drive circuit layer according to an exemplary embodiment of the present disclosure.
Figure 20B:
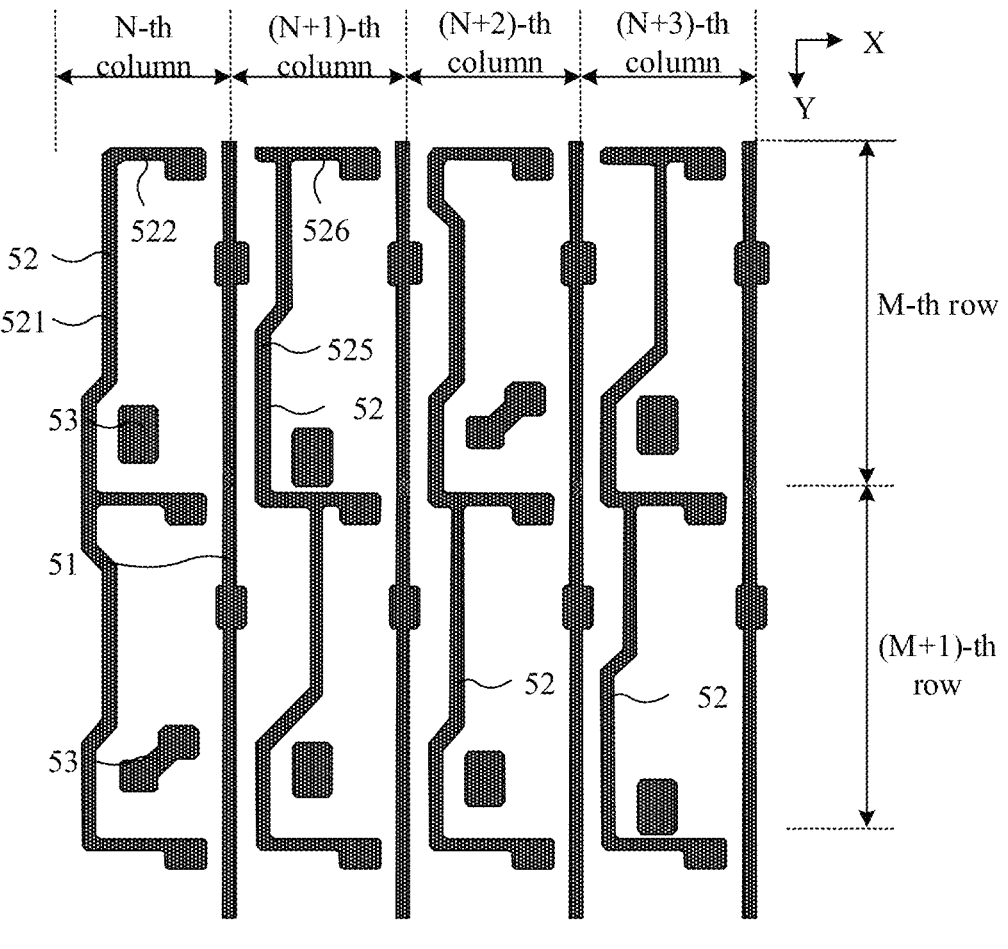

FIG. 20a is a schematic diagram of a structure of yet another drive circuit layer according to an exemplary embodiment of the present disclosure, and FIG. 20b is a schematic plan view of a fourth conductive layer in FIG. 20a, and illustrates a planar structure of eight circuit units (2 unit rows and 4 unit columns). In an exemplary implementation, in the drive circuit layer of the present exemplary embodiment, a structure of a semiconductor layer, a first conductive layer, a second conductive layer, a third conductive layer, and a data signal line 51 and an anode connection electrode 53 in a fourth conductive layer is substantially similar to that of the aforementioned embodiment, the difference is that second initial signal lines 52 in the fourth conductive layer are disposed in an N-th unit column, an (N+1)-th unit column, an (N+2)-th unit column and an (N+3)-th unit column, respectively, and second initial signal lines 52 of circuit units in at least one unit column are connected with each other.

As shown in FIG. 20a and FIG. 20b, in an exemplary embodiment, second connection electrodes 44 in circuit units in at least one column includes a first portion and a second portion connected with each other. The second initial signal line 52 has a body portion extended in a second direction Y, the second initial signal line 52 is connected with a second portion of the second connection electrode 44 through a twelfth via V12 in each circuit unit, so that the first initial signal line and the second initial signal line form a grid structure, which not only reduces the resistance of initial signal lines to the maximum extent and a voltage drop of an initial voltage, but also effectively improves the uniformity of the initial voltage in the display substrate, effectively improves the display uniformity, and improves the display quality.

In an exemplary embodiment, a second initial signal line 52 of one circuit unit in the N-th unit column and the (N+2)-th unit column may include an extension portion 521 and a connection portion 522. The extension portion 521 may be a polyline having a body portion extended along the second direction Y and the connection portion 522 may be a straight line having a body portion extended along a first direction X. In an exemplary embodiment, an end of a side of the connection portion 522 away from the extension portion 521 may be connected with the second connection electrode 44 through the twelfth via V12.

In an exemplary embodiment, the second initial signal line 52 of one circuit unit in the (N+1)-th unit column and the (N+3)-th unit column may include an extension portion 525 and a connection portion 526. The extension portion 525 may be a polyline having a body portion extended along the second direction Y and the connection portion 526 may be a straight line having a body portion extended along the first direction X. In an exemplary embodiment, an end of a side of the connection portion 526 away from the extension portion 525 may be connected with the second connection electrode 44 through the twelfth via V12.

In an exemplary embodiment, orthographic projections of the extension portion 521 and the extension portion 525 on the substrate is located at least partially within a range of the orthographic projection of the first power supply line 41 on the substrate, which not only may make the first power supply line 14 effectively shield an influence of the second initial signal line 52 on a key node in the pixel drive circuit and prevent an initial signal from affecting a potential of the key node in the pixel drive circuit, but also may fully utilize a layout space to avoid an influence of disposition of the second initial signal line on light transmittance, and improve display effect.

In an exemplary embodiment, orthographic projections of the connection portion 522 and the connection portion 526 on the substrate is located at least partially within a range of the orthographic projection of the first initial signal line 31 on the substrate, which may fully utilize the layout space to avoid the influence of disposition of the second initial signal line on light transmittance, and improve the display effect.

In the present exemplary embodiment, a subsequent process of forming a light emitting structure layer is substantially similar to that of the aforementioned embodiment. After the pattern of the anode is formed, orthographic projections of a first anode, a second anode, a third anode and a fourth anode on the substrate may overlap at least partially with the orthographic projection of the second initial signal line on the substrate, a first centerline of a first pixel opening overlaps at least partially with a second centerline of the extension portion of the second initial signal line, and a third centerline of a second pixel opening overlaps at least partially with a fourth centerline of the data signal line, which is helpful to eliminate the difference between planarization of various anodes, and may avoid color cast of large angle of view. Because the second initial signal line will pass through the first green pixel opening and/or the second green pixel opening, the planarization of the third anode and/or the fourth anode may be improved by means of thickening a thickness of the planarization layer and the like in a region where the first green pixel opening and/or the second green pixel opening is located.

In an exemplary embodiment, the second initial signal lines 52 may be disposed in part of circuit units in an N-th unit column, an (N+1)-th unit column, an (N+2)-th unit column, and an (N+3)-th unit column, and two adjacent second initial signal lines 52 in a unit column may be isolated from each other. For example, in the N-th unit column and the (N+2)-th unit column, the second initial signal lines 52 of adjacent circuit units may be connected with each other, and in the (N+1)-th column and the (N+3)-th unit column, the second initial signal lines 52 may be disposed only in the circuit unit the M-th row and the (N+1)-th column and the circuit unit in the (M+1)-th row and the (N+3)-th column, or the second initial signal lines 52 may be disposed only in the M-th row and the (N+3)-th column and the circuit unit in the (M+1)-th row and the (N+1)-th column. For another example, in the (N+1)-th unit column and the (N+3)-th unit column, the second initial signal lines 52 of adjacent circuit units may be connected with each other, and in the N-th unit column and the (N+2)-th unit column, the second initial signal lines 52 may be disposed only in the circuit unit in the M-th row and the N-th column and the circuit unit in the (M+1)-th row and the (N+2)-th column, or the second initial signal lines 52 may be disposed only in the circuit unit in the M-th row and the (N+2) column and the circuit unit in the (M+1)-th row and the N-th column. As another example, the second initial signal line 52 may be disposed only in the circuit unit in the M-th row and the N-th column and the circuit unit in the (M+1)-th row and the (N+2)-th column, or the second initial signal lines 52 may be disposed only in the circuit unit in the M-th row and the (N+2)-th column and the circuit unit in the (M+1)-th row and the N-th column. The second initial signal lines 52 may be disposed only in the circuit unit in the M-th row and the (N+1)-th column and the circuit unit in the (M+1)-th row and the (N+3)-th column, or the second initial signal lines 52 may be disposed only in circuit unit in the M-th row and the (N+3)-th column and the circuit unit in the (M+1)-th row and the (N+1)-th column, and the present disclosure is not limited herein.

Figure 21A:
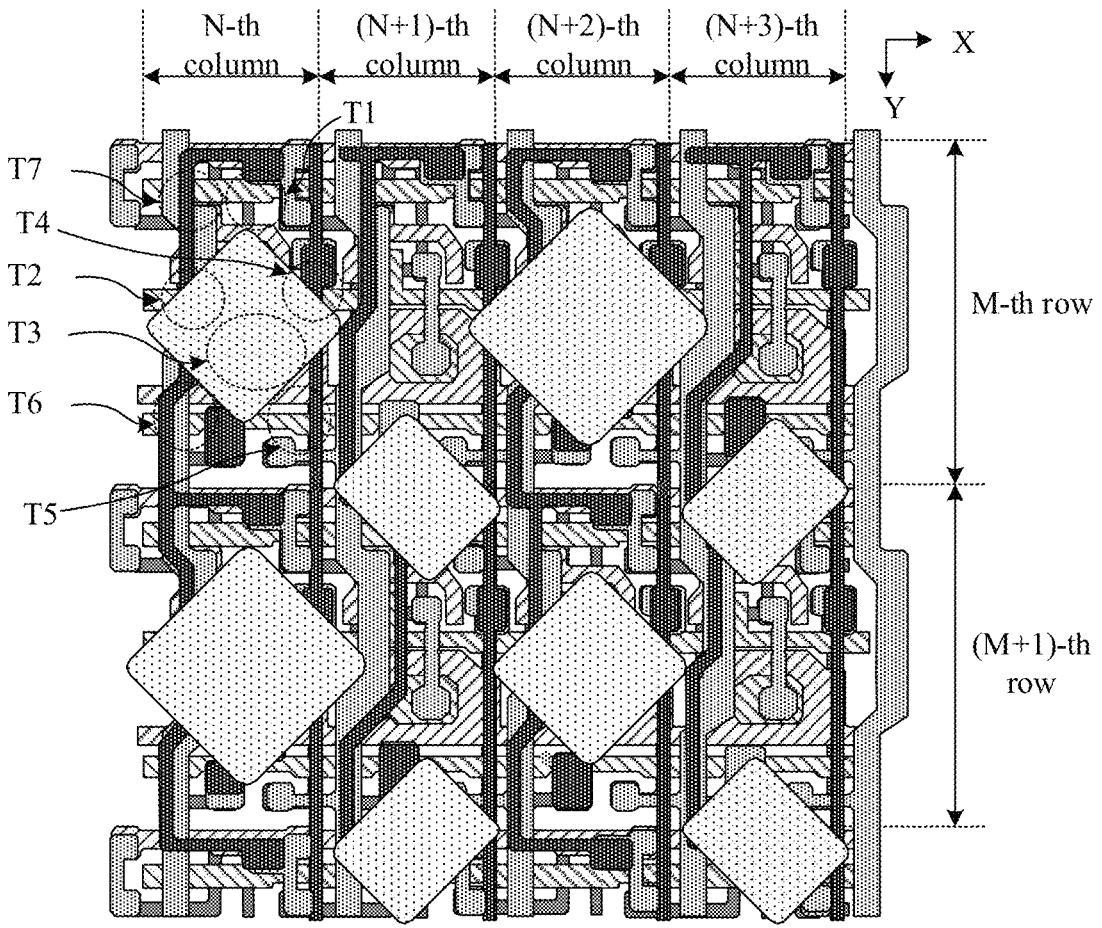
FIG. 21a is another schematic diagram after forming a pattern of an anode according to an exemplary embodiment of the present disclosure.
Figure 21B:
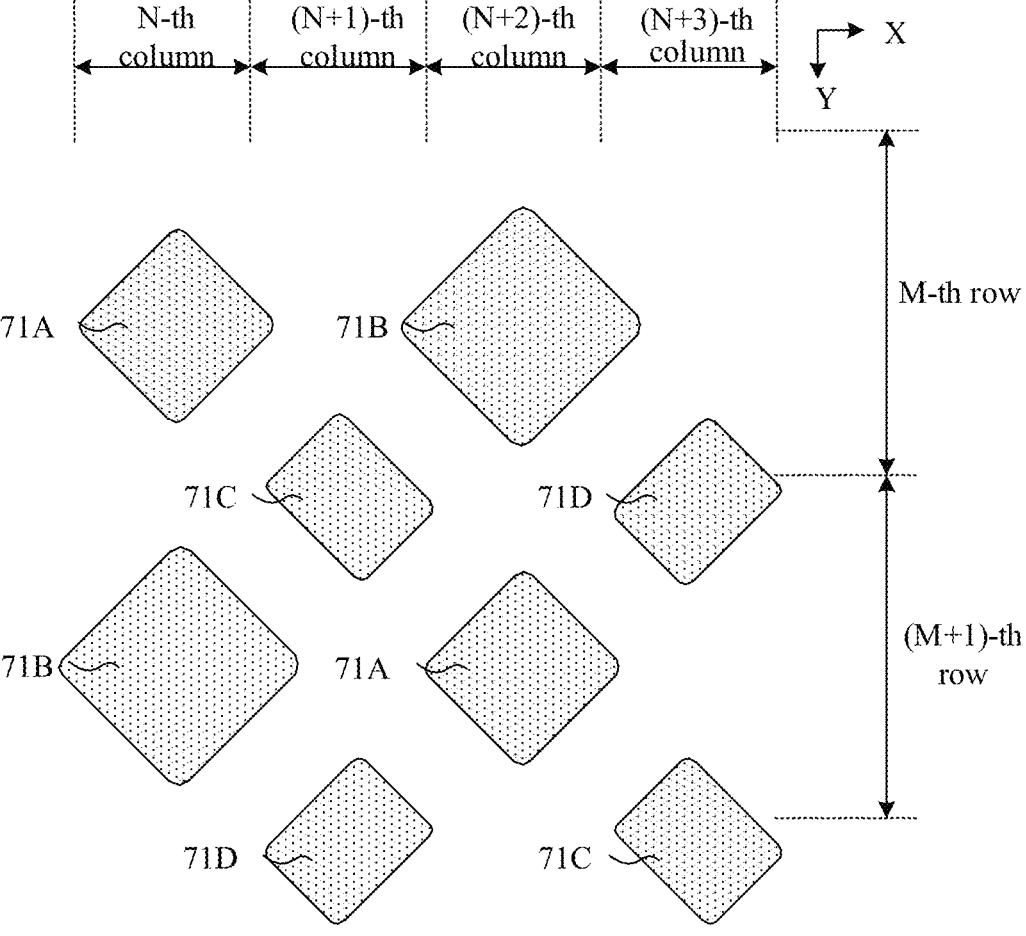

FIG. 21a is another schematic diagram after forming a pattern of an anode according to an exemplary embodiment of the present disclosure, and FIG. 21b is a schematic plan view of an anode of FIG. 21a, and illustrates a planar structure of eight circuit units (2 unit rows and 4 unit columns). In an exemplary implementation, a structure of the drive circuit layer of the present exemplary embodiment is substantially similar to that of the aforementioned embodiment, the second initial signal lines 52 in the fourth conductive layer are disposed in the N-th unit column, the (N+1)-th unit column, the (N+2)-th unit column, and the (N+3)-th unit column. The second initial signal lines 52 of circuit units in the unit column are connected with each other, except that anodes of the light emitting structure layer are arranged in a diamond-shaped manner to form an RGBG pixel arrangement.

As shown in FIG. 21a and FIG. 21b, the pattern of the anode may include a first anode 71A of a red light emitting device, a second anode 71B of a blue light emitting device, a third anode 71C of a first green light emitting device, and a fourth anode 71D of a second green light emitting device. A region where the first anode 71A is located may form a red sub-pixel R emitting red light, a region where the second anode 71B is located may form a blue sub-pixel B emitting blue light, a region where the third anode 71C is located may form a first green sub-pixel G1 emitting green light, and a region where the fourth anode 71D is located may form a second green sub-pixel G2 emitting green light. The red sub-pixel R and the blue sub-pixel B are sequentially disposed along a second direction Y, the first green sub-pixel G1 and the second green sub-pixel G2 are sequentially disposed along a first direction X. The first green sub-pixel G1 is disposed at a side of the red sub-pixel R and the blue sub-pixel B in an opposite direction of the first direction X, and the second green sub-pixel G2 is disposed at a side of the red sub-pixel R and the blue sub-pixel B in the first direction X. The red sub-pixel R, the blue sub-pixel B, the first green sub-pixel G1 and the second green sub-pixel G2 form one pixel unit.

In an exemplary embodiment, in one pixel unit, the first anode 71A is connected with the anode connection electrode 53 in the circuit unit in the M-th row and the N-th column through a fourteenth via V14 in this circuit unit, the second anode 71B is connected with the anode connection electrode 53 in the circuit unit in the (M+1)-th row and the N-th column through a fourteenth via V14 in this circuit unit, the third anode 71C is connected with the anode connection electrode 53 in the circuit unit in the M-th row and the (N+1)-th column through a fourteenth via V14 in this circuit unit, and the fourth anode 71D is connected with the anode connection electrode 53 in the circuit unit in the M-th row and the (N−1)-th column through a fourteenth via V14 in this circuit unit. In another pixel unit, the first anode 71A is connected with the anode connection electrode 53 in the circuit unit in the (M+1)-th row and the (N+2)-th column through a fourteenth via V14 in this circuit unit, the second anode 71B is connected with the anode connection electrode 53 in the circuit unit in the M-th row and the (N+2)-th column through a fourteenth via V14 in this circuit unit, the third anode 71C is connected with the anode connection electrode 53 in the circuit unit in the M-th row and the (N+1)-th column through a fourteenth via V14 in this circuit unit, and the fourth anode 71D is connected with the anode connection electrode 53 in the circuit unit in the M-th row and the (N+3)-th column through a fourteenth via V14 in this circuit unit.

In an exemplary embodiment, orthographic projections of the first anode 71A and the second anode 71B on the substrate may overlap at least partially with the orthographic projection of the extension portion of the second initial signal line on the substrate, and orthographic projections of the third anode 71C and the fourth anode 71D on the substrate may overlap at least partially with the orthographic projection of the connection portion of the second initial signal line on the substrate.

In an exemplary embodiment, anodes in different pixel units may have the same or different shapes and positions, and anodes in four sub-pixels in one pixel unit may have the same or different shapes and areas, and the present disclosure is not limited herein.

Figure 22A:
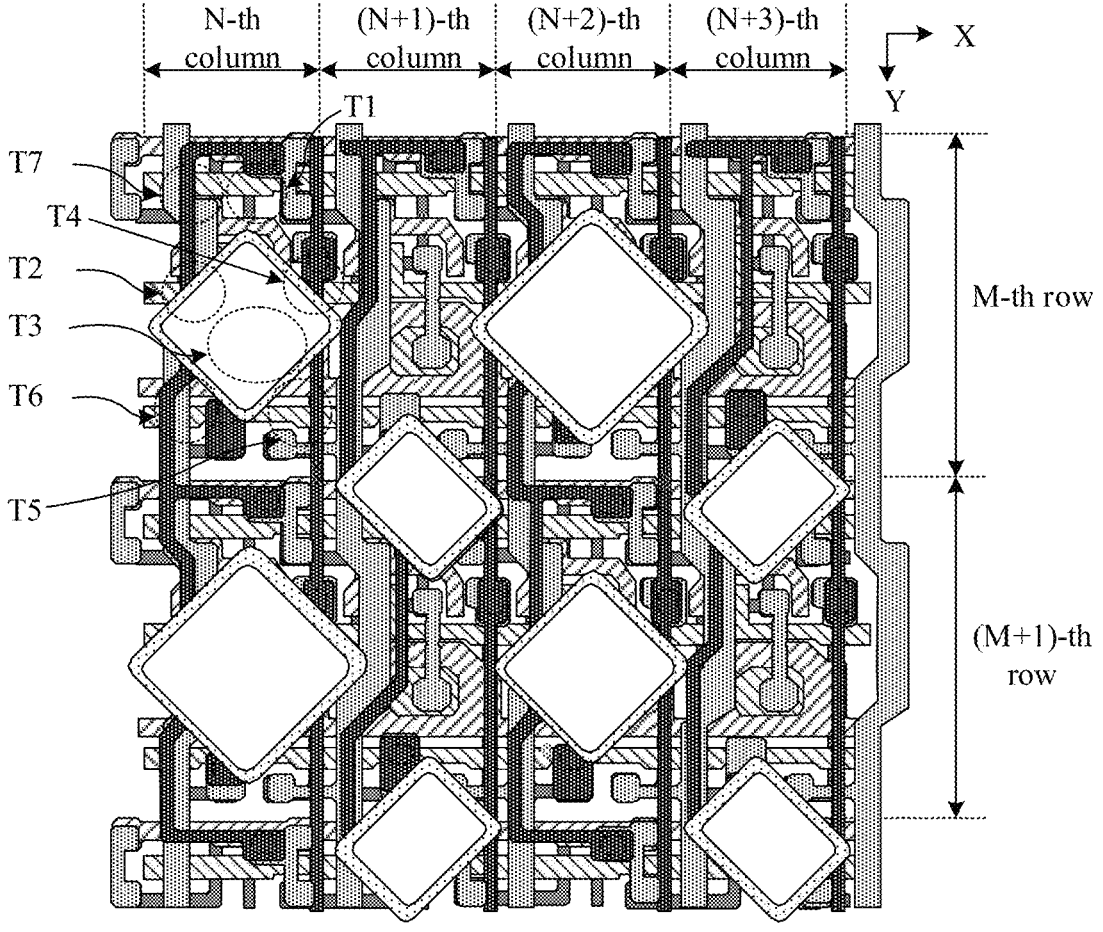
FIG. 22a is another schematic diagram after forming a pattern of a pixel definition layer according to an exemplary embodiment of the present disclosure.
Figure 22B:
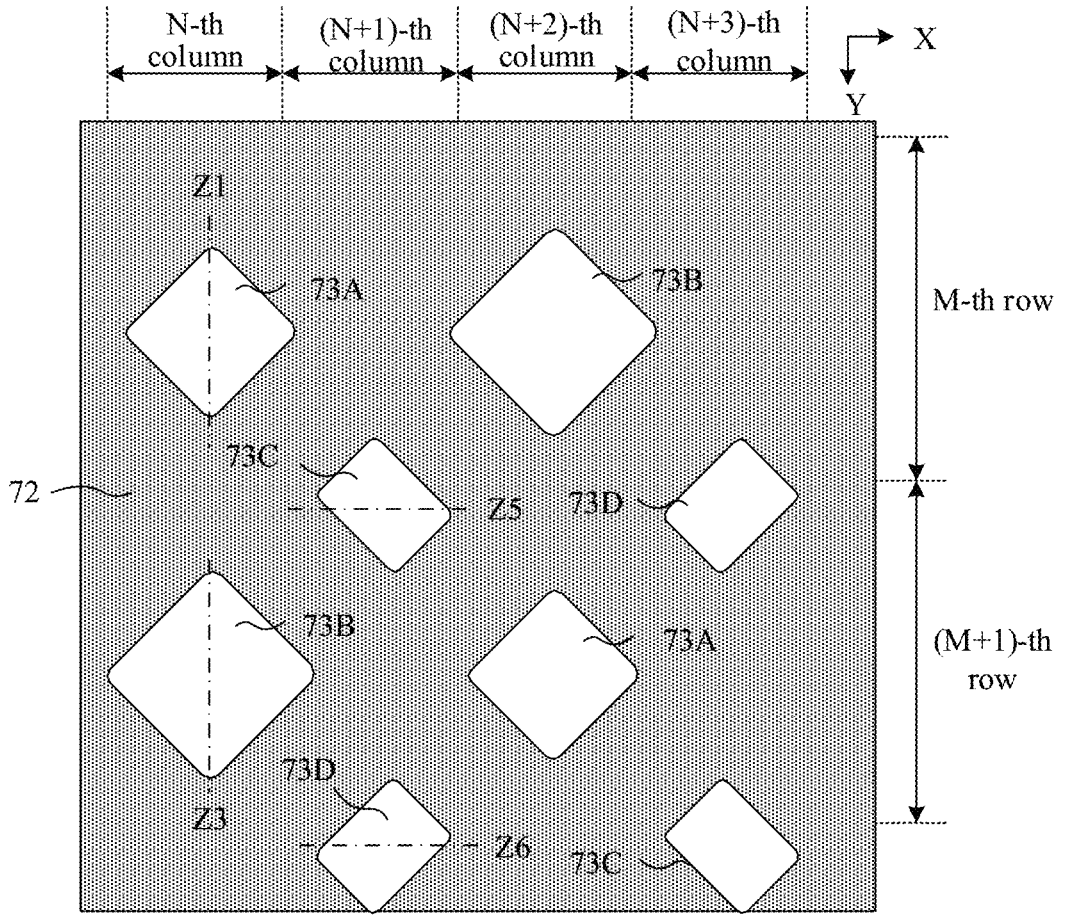

FIG. 22*a* is another schematic diagram after forming a pattern of a pixel definition layer according to an exemplary embodiment of the present disclosure, and FIG. 22*b* is a schematic plan view of a pixel definition layer in FIG. 22*a*, and illustrates a planar structure of eight circuit units (2 unit rows and 4 unit columns). In an exemplary implementation, a structure of a drive circuit layer and an anode of the present exemplary implementation is substantially similar to that of the aforementioned embodiment, except that openings of a pixel definition layer 72 in a light emitting structure layer are arranged in a diamond-shaped manner.

As shown in FIG. 22*a* and FIG. 22*b*, a pattern of the pixel definition layer 72 may include a first pixel opening 73A exposing a first anode 71A, a second pixel opening 73B exposing a second anode 71B, a third pixel opening 73C exposing a third anode 71C, and a fourth pixel opening 73D exposing a fourth anode 71D.

In an exemplary embodiment, an orthographic projection of the first pixel opening 73A on the substrate has a first centerline Z1, an orthographic projection of an extension portion of a second initial signal line 52 on the substrate has a second centerline, an orthographic projection of the second pixel opening 73B on the substrate has a third centerline Z3, an orthographic projection of a data signal line 51 on the substrate has a fourth centerline. The first centerline Z1 is a line extending along a second direction Y and bisecting the orthographic projection of the first pixel opening 73A on the substrate in a first direction X. The second centerline is a line extending along the second direction Y and bisecting the orthographic projection of the extension portion of the second initial signal line on the substrate in the first direction X. The third centerline Z3 is a line extending along the second direction Y and bisecting the orthographic projection of the second pixel opening 73B on the substrate in the first direction X. The fourth centerline is a line extending along the second direction Y and bisecting the orthographic projection of the data signal line on the substrate in the first direction X.

"Bisecting A" in the present disclosure may mean that the centerline enable areas on both sides of an orthographic projection of A on the substrate substantially equal, and substantially equal areas on both sides may be subject to deviations within an allowable range due to process or tolerances. For example, a ratio of areas on both sides may be about 0.8 to 1.2. The "A overlaps with B" in the present disclosure does not require that A overlaps with B completely, and there may be deviations within the allowable range due to process or tolerances.

In an exemplary implementation, the first centerline Z1 may overlap at least partially with the third centerline Z3, the second centerline and the fourth centerline may be located at both sides of the first centerline Z1, and the second centerline and the fourth centerline may be located at both sides of the third centerline.

In an exemplary embodiment, the second centerline of the second initial signal line and the fourth centerline of the data signal line may be symmetrically disposed with respect to the first centerline Z1 of the first pixel opening, and the second centerline of the second initial signal line and the fourth centerline of the data signal line may be symmetrically disposed with respect to the third centerline Z3 of the second pixel opening. In the present disclosure, the extension portion of the second initial signal line and the data signal line are disposed at both sides of the first centerline of the first pixel opening 73A or the third centerline of the second pixel opening 73B respectively, which may ensure the planarization of the first anode and the second anode, and may avoid color cast of large angle of view.

"Centerline A and centerline B are symmetrically disposed with respect to centerline C" in the present disclosure means that a ratio of a distance between centerline A and centerline C to a distance between centerline B and centerline C is about 0.8 to 1.2.

In an exemplary embodiment, a position of the anode in the circuit unit may be adjusted, which enables the second centerline of the second initial signal line to be overlapped with both the first centerline of the first pixel opening and the third centerline of the second pixel opening, or enables the fourth centerline of the data signal line to be overlapped with both the first centerline of the first pixel opening and the third centerline of the second pixel opening, and the present disclosure is not limited herein.

In an exemplary embodiment, the orthographic projection of the third pixel opening 73C on the substrate has a fifth centerline Z5, the orthographic projection of the fourth pixel opening 73D on the substrate has a sixth centerline Z6. The orthographic projection of the connection portion of the second initial signal line 52 on the substrate has a seventh centerline. The fifth centerline Z5 is a line extending along the first direction X and bisecting the orthographic projection of the third pixel opening 73C on the substrate in the second direction Y. The sixth centerline Z6 is a line extending along the first direction X and bisecting the orthographic projection of the fourth pixel opening 73D on the substrate in the second direction Y. The seventh centerline is a line extending along the first direction X and bisecting the orthographic projection of the connection portion of the second initial signal line 52 on the substrate in the second direction Y.

In an exemplary embodiment, the fifth centerline Z5 may overlap at least partially with the seventh centerline, and the sixth centerline Z6 may overlap at least partially with the seventh centerline. In the present disclosure, the fifth centerline of the third pixel opening 73C overlaps at least partially with the seventh centerline of the connection portion of the second initial signal line, the sixth centerline of the fourth pixel opening 73D overlaps at least partially with the seventh centerline of the connecting part of the second initial signal line, which may ensure the planarization of the third anode and the fourth anode and may avoid color cast of large angle of view.

The structure and the preparation process thereof described in the present disclosure are merely an exemplary description. In an exemplary implementation, corresponding structures may be altered and patterning processes may be added or reduced according to actual needs. For example, the first initial signal line may be disposed in the first conductive layer (GATE 1). As another example, the second initial signal line may be disposed in the third conductive layer (SD1), and the first power supply line may be disposed in the fourth conductive layer (SD2), the present disclosure is not limited herein. The display substrate of the present disclosure may be applied to other display apparatus having the pixel drive circuit, and the present disclosure is not limited herein.

The present disclosure further provides a preparation method for a display substrate, for preparing the display substrate according to the aforementioned embodiment. In an exemplary embodiment, the display substrate includes a drive circuit layer disposed on a substrate and a light emitting structure layer disposed at a side of the drive circuit layer away from the substrate, the drive circuit layer including a plurality of circuit units, and the light emitting structure layer including a plurality of light emitting devices; at least one circuit unit includes a first power supply line, an initial signal line including a first initial signal line extending in a first direction and a second initial signal line extending in a second direction, and a pixel drive circuit, the first direction interacting the second direction; the preparation method includes: forming the first initial signal line extending in the first direction on the substrate; forming the second initial signal line extending in the second direction, the orthographic projection of the second initial signal line on the substrate overlapping at least partially with the orthographic projection of the first power supply line on the substrate.

The display substrate prepared by the preparation method for the display substrate according to the present disclosure has similar implementation principle and implementation effect as the display substrate according to the aforementioned embodiments, which will not be further repeated herein.

The present disclosure further provides a display apparatus which includes the aforementioned display substrate. The display apparatus may be any product or component with a display function, such as a mobile phone, a tablet computer, a television, a display, a notebook computer, a digital photo frame, or a navigator, and the embodiments of the present invention are not limited thereto.

Although the implementations disclosed in the present disclosure are described as above, the described contents are only implementations which are used in order to facilitate understanding of the present disclosure, and are not intended to limit the present disclosure. Any skill person in the art to which the present disclosure pertains may make any modifications and alterations in forms and details of implementation without departing from the spirit and scope of the present disclosure. However, the patent protection scope of the present disclosure should be subject to the scope defined by the appended claims.

The invention claimed is:

1. A display substrate, comprising a drive circuit layer disposed on a substrate and a light emitting structure layer disposed at a side of the drive circuit layer away from the substrate, wherein the drive circuit layer comprises a plurality of circuit units, the light emitting structure layer comprises a plurality of light emitting devices; at least one circuit unit comprises a first power supply line, an initial signal line comprising a first initial signal line extending in a first direction and a second initial signal line extending in a second direction, and a pixel drive circuit; the first direction is intersected with the second direction, and an orthographic projection of the second initial signal line on the substrate is overlapped at least partially with an orthographic projection of the first power supply line on the substrate, wherein the second initial signal line in at least one circuit unit comprises an extension portion and a connection portion connected with each other, the extension portion is extended in the second direction, the connection portion is extended in the first direction, wherein an orthographic projection of the extension portion on the substrate is overlapped at least partially with the orthographic projection of the first power supply line on the substrate, and wherein the extension portion comprises a first initial portion and a second initial portion connected along the second direction, the first initial portion is parallel to the second direction, the second initial portion is deflected toward an opposite direction of the first direction, the second initial portion has a first included angle with the second direction, and the first included angle is greater than 0° and less than 90°.

2. The display substrate according to claim 1, wherein the connection portion is connected with the first initial signal line through a via, and an orthographic projection of the connection portion on the substrate is overlapped at least partially with an orthographic projection of the first initial signal line on the substrate.

3. The display substrate according to claim 1, wherein the extension portion further comprises a third initial portion, the first initial portion, the second initial portion and the third initial portion connected sequentially, ends of the first initial portion and the third initial portion are connected with the connection portion.

4. The display substrate according to claim 1, wherein the extension portion comprises a fifth initial portion and a sixth initial portion connected along the second direction, the sixth initial portion is parallel to the second direction, the fifth initial portion has a first included angle with the second direction, and the first included angle is greater than 0° and less than 90°.

5. The display substrate according to claim 4, wherein the extension portion further comprises a fourth initial portion, a seventh initial portion, and an eighth initial portion; the fourth initial portion, the fifth initial portion, the sixth initial portion, the seventh initial portion, and the eighth initial portion connected sequentially along the second direction; the fourth initial portion and the eighth initial portion are parallel to the second direction, the seventh initial portion has a second included angle with the second direction, and the second included angle is greater than 0° and less than 90°.

6. The display substrate according to claim 5, wherein an extension direction of the fifth initial portion and an extension direction of the seventh initial portion are mirrored symmetrical with respect to the first direction.

7. The display substrate according to claim 1, wherein the drive circuit layer comprises a plurality of unit rows and a plurality of unit columns, the unit rows comprise a plurality of circuit units arranged along the first direction, and the unit columns comprise a plurality of circuit units arranged along the second direction; the second initial signal lines in the adjacent circuit units are disposed at intervals.

8. The display substrate according to claim 7, wherein the plurality of circuit units comprise a first circuit unit connected with a red light emitting device emitting red light, a second circuit unit connected with a blue light emitting device emitting blue light, a third circuit unit connected with a first green light emitting device emitting green light, and a fourth circuit unit connected with a second green light emitting device emitting green light; the plurality of unit columns comprise a first unit column and a second unit column, the first circuit unit and the second circuit unit in the first unit column are alternately disposed along the second direction, and the third circuit unit and the fourth circuit unit in the second unit column are alternately disposed along the second direction; at least part of the second initial signal line is disposed in the first unit column.

9. The display substrate according to claim 8, wherein the light emitting device comprises an anode and a pixel definition layer; the anode comprises a first anode of the red light emitting device, a second anode of the blue light emitting device; the pixel definition layer is disposed with a first pixel opening exposing the first anode, a second pixel opening exposing the second anode; a first centerline of an orthographic projection of the first pixel opening on the substrate is overlapped at least partially with a second centerline of the orthographic projection of the second initial signal line on the substrate.

10. The display substrate according to claim 9, wherein the drive circuit layer further comprises a data signal line, a third centerline of an orthographic projection of the second pixel opening on the substrate is overlapped at least partially with a fourth centerline of an orthographic projection of the data signal line on the substrate.

11. The display substrate according to claim 8, wherein the light emitting device comprises an anode and a pixel definition layer; the anode comprises a first anode of the red light emitting device, a second anode of the blue light emitting device; the pixel definition layer is disposed with a first pixel opening exposing the first anode, a second pixel opening exposing the second anode; the drive circuit layer further comprises a data signal line; a second centerline of an orthographic projection of an extension portion of the second initial signal line on the substrate and a fourth centerline of an orthographic projection of the data signal line on the substrate are located at both sides of a first centerline of an orthographic projection of the first pixel opening on the substrate.

12. The display substrate according to claim 11, wherein the second centerline of the orthographic projection of the extension portion of the second initial signal line on the substrate and the fourth centerline of the orthographic projection of the data signal line on the substrate are located at both sides of a third centerline of an orthographic projection of the second pixel opening on the substrate.

13. The display substrate according to claim 7, wherein the plurality of circuit units comprise a first circuit unit connected with a red light emitting device emitting red light, a second circuit unit connected with a blue light emitting device emitting blue light, a third circuit unit connected with a first green light emitting device emitting green light, and a fourth circuit unit connected with a second green light emitting device emitting green light; the plurality of unit columns comprise a first unit column and a second unit column, the first circuit unit and the second circuit unit in the first unit column are alternately disposed along the second direction, and the third circuit unit and the fourth circuit unit in the second unit column are alternately disposed along the second direction; at least part of the second initial signal line is disposed in the second unit column.

14. The display substrate according to claim 13, wherein the light emitting device comprises an anode and a pixel definition layer; the anode comprises, a third anode of the first green light emitting device and a fourth anode of the second green light emitting device; the pixel definition layer is disposed with a third pixel opening exposing the third anode and a fourth pixel opening exposing the fourth anode; a fifth centerline of an orthographic projection of the third pixel opening on the substrate is overlapped at least partially with a seventh centerline of an orthographic projection of a connection portion of the second initial signal line on the substrate.

15. The display substrate according to claim 14, wherein a sixth centerline of an orthographic projection of the fourth pixel opening on the substrate is overlapped at least partially with the seventh centerline of the orthographic projection of the connection portion of the second initial signal line on the substrate.

16. The display substrate according to claim 7, wherein the plurality of circuit units comprise a first circuit unit connected with a red light emitting device emitting red light, a second circuit unit connected with a blue light emitting device emitting blue light, a third circuit unit connected with a first green light emitting device emitting green light, and a fourth circuit unit connected with a second green light emitting device emitting green light; the plurality of unit columns comprise a first unit column and a second unit column, the first circuit unit and the second circuit unit in the first unit column are alternately disposed along the second direction, and the third circuit unit and the fourth circuit unit in the second unit column are alternately disposed along the second direction; and the second initial signal line is disposed in the first unit column and the second unit column.

17. The display substrate according to claim 1, wherein in a plane perpendicular to the display substrate, the drive circuit layer comprises a semiconductor layer and a second conductive layer, and the second conductive layer comprises a shield electrode connected with the first power supply line through a via.

18. The display substrate according to claim 17, wherein an orthographic projection of at least a partial region of the shield electrode on the substrate is located between an orthographic projection of the data signal line on the substrate and an orthographic projection of a second electrode of a first transistor in the pixel drive circuit on the substrate.

19. A display apparatus, comprising the display substrate according to claim 1.

* * * * *